(12) United States Patent
Dupre et al.

(10) Patent No.: US 11,561,268 B2
(45) Date of Patent: Jan. 24, 2023

(54) DEVICES AND METHODS FOR MEASURING A MAGNETIC FIELD GRADIENT

(71) Applicant: Melexis Technologies SA, Bevaix (CH)

(72) Inventors: Nicolas Dupre, Bevaix (CH); Yves Bidaux, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 120 days.

(21) Appl. No.: 17/207,290

(22) Filed: Mar. 19, 2021

(65) Prior Publication Data

US 2021/0293901 A1    Sep. 23, 2021

(30) Foreign Application Priority Data

Mar. 23, 2020 (EP) ..................................... 20165059

(51) Int. Cl.
 *G01R 33/07* (2006.01)
 *G01R 33/022* (2006.01)
 *G01R 33/00* (2006.01)

(52) U.S. Cl.
 CPC ....... *G01R 33/022* (2013.01); *G01R 33/0082* (2013.01); *G01R 33/07* (2013.01)

(58) Field of Classification Search
 CPC .... G01R 33/0082; G01R 33/07; G01R 33/00; G01R 33/0035; G01R 33/0023; G01R 33/0017; G01R 31/3191; G01R 33/022; G01B 7/004; G01C 17/38; G06F 3/017; G06F 3/0346; G06F 3/012
 See application file for complete search history.

(56) References Cited

U.S. PATENT DOCUMENTS

| | | | |
|---|---|---|---|
| 2010/0237859 A1* | 9/2010 | Kotter | G01R 33/093 324/252 |
| 2017/0030980 A1 | 2/2017 | Kosier et al. | |
| 2018/0372475 A1* | 12/2018 | Yoshiya | G01B 7/30 |
| 2019/0079142 A1* | 3/2019 | Close | G01R 33/0082 |

FOREIGN PATENT DOCUMENTS

| | | | |
|---|---|---|---|
| EP | 3109658 A1 | 12/2016 | |
| WO | 9854547 A1 | 12/1998 | |
| WO | 2014029885 A1 | 2/2014 | |

OTHER PUBLICATIONS

"Atan2," retrieved from https://en.wikipedia.org/wiki/Atan2 on Mar. 18, 2021, 9 pages.
Extended Search Report and Written Opinion from corresponding European Application No. 20165059.5, dated Sep. 14, 2020.

* cited by examiner

*Primary Examiner* — Jermele M Hollington
*Assistant Examiner* — Taqi R Nasir
(74) *Attorney, Agent, or Firm* — Workman Nydegger

(57) ABSTRACT

A method of determining a gradient of a magnetic field, includes the steps of: biasing a first/second magnetic sensor with a first/second biasing signal; measuring and amplifying a first/second magnetic sensor signal; measuring a temperature and/or a stress difference; adjusting at least one of: the second biasing signal, the second amplifier gain, the amplified and digitized second sensor value using a predefined function f(T) or f(T, ΔΣ) or f(ΔΣ) of the measured temperature and/or the measured differential stress before determining a difference between the first/second signal/value derived from the first/second sensor signal. A magnetic sensor device is configured for performing this method, as well as a current sensor device, and a position sensor device.

15 Claims, 35 Drawing Sheets

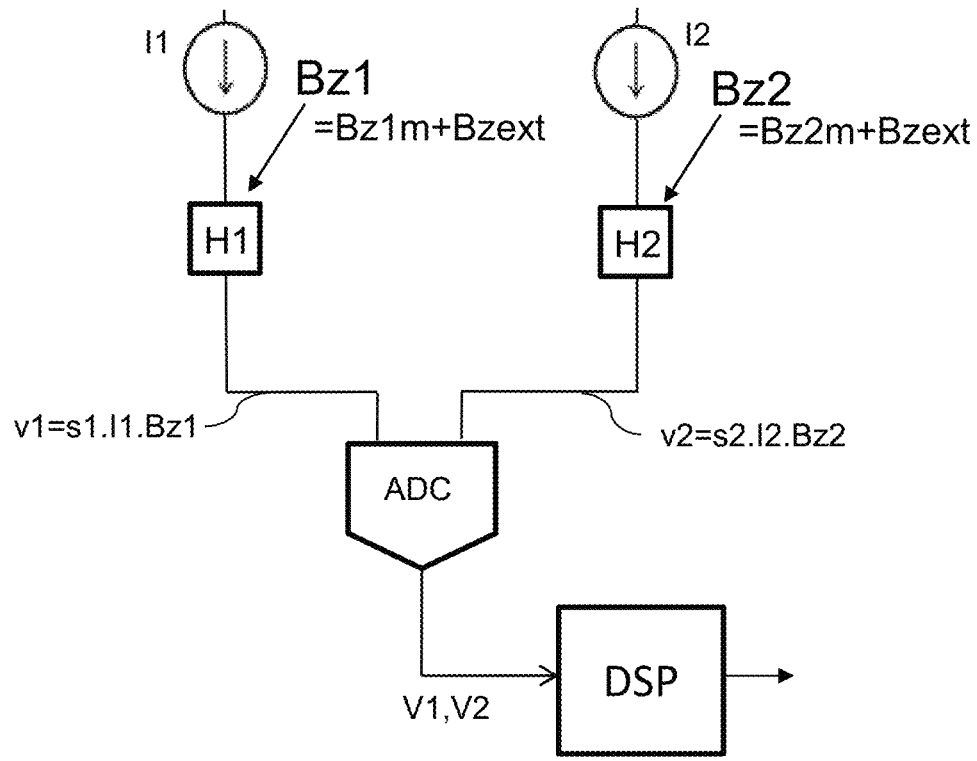
gradient = (V2−V1)
= s2.I2.[Bz1m + Bzext] − s1.I1.[Bz2m + Bzext]
= (s2.I2−s1.I1).Bzext + (s2.I2.Bz1m − s1.I1.Bz2m)
(assume I1≈I2) and (assume s1.I1≈s2.I2)
≈ (s2−s1).I1.Bzext + (s1.I1).(ΔBzm)
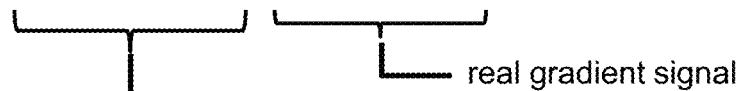
real gradient signal
error term caused by sensitivity mismatch if Bzext ≠ 0
FIG. 2

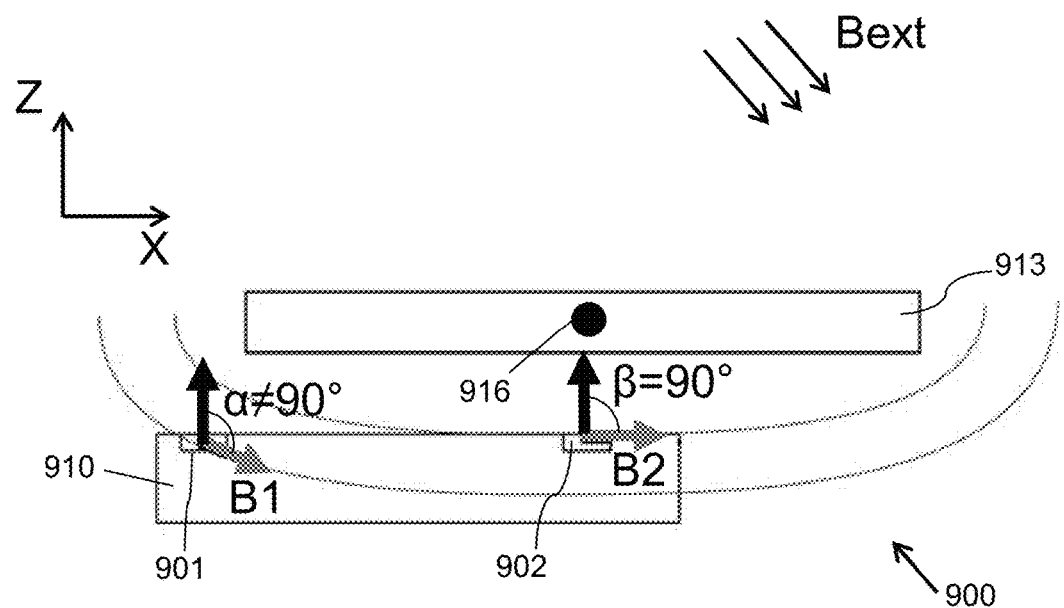
FIG. 9(a)
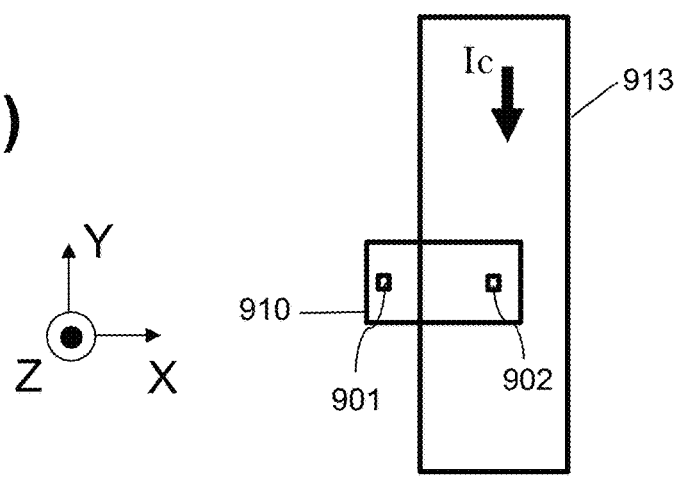
FIG. 9(b)
FIG. 9

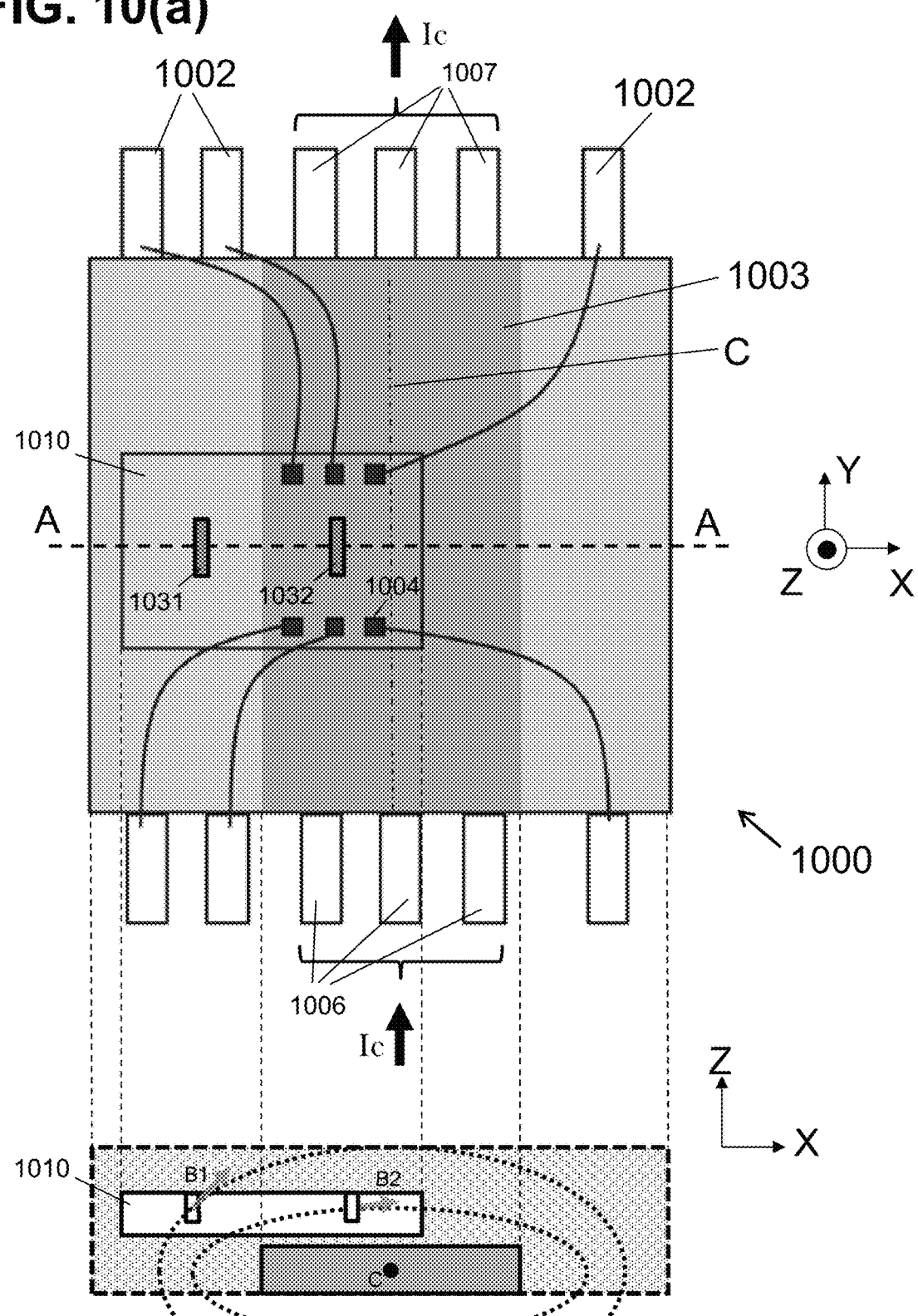

a) providing a semiconductor substrate comprising:
- a first and second magnetic sensor;
- a first and second biasing source;
- a first and second amplifier;
- a temperature sensor and/or a differential stress sensing circuit;
- an ADC, a processing unit, and non-volatile memory

b) biasing the first magnetic sensor;
c) measuring a first magnetic sensor signal;
d) amplifying the first magnetic sensor signal;

e) biasing the second magnetic sensor,
f) measuring a second magnetic sensor signal;
g) amplifying the second magnetic sensor signal;

h) measuring a temperature (T) and/or measuring a differential stress signal (Δσ)

i) adjusting:
   - the second biasing signal *or*
   - the second amplifier gain *or*
   - a digitized value derived solely from the second sensor signal
using a predefined function of a single measured temperature (T)
   and/or of the stress difference (ΔΣ)
*before* determining a difference between:
 - a signal or value derived from the first sensor signal, and
- a signal or value derived from the second sensor signal
to obtain the magnetic field difference or magnetic field gradient

j) converting the magnetic field difference or gradient value into another value, e.g. into a current value or into a distance value

DEVICES AND METHODS FOR MEASURING A MAGNETIC FIELD GRADIENT

FIELD OF THE INVENTION

The present invention relates in general to the field of magnetic sensor devices and methods of measuring a magnetic field. The present invention relates in particular to devices and methods of measuring a magnetic field gradient.

BACKGROUND OF THE INVENTION

Devices for measuring a magnetic field strength are known in the art. They often contain one or more Hall elements or magneto resistive elements. Magnetic sensors are typically used in current sensors, distance sensors, proximity sensors, proximity switches, linear or angular position sensors, etc. while magnetic sensing offers several advantages, such as non-contact measurement, less mechanical wear, accuracy of these devices is limited in the presence of an external disturbance field.

In recent years, it was found that the influence of an external disturbance field can be largely reduced by measuring a magnetic field gradient, and by calculating the current or distance or position from the magnetic field gradient signal, rather than from the magnetic field component value itself.

There is always room for improvements or alternatives.

SUMMARY OF THE INVENTION

It is an object of embodiments of the present invention to provide a magnetic sensor device and/or a method for measuring a gradient of a magnetic field.

It is a particular object of embodiments of the present invention to provide a magnetic sensor device and/or a method capable of measuring a gradient of a magnetic field more accurately.

It is an object of embodiments of the present invention to provide a magnetic sensor device and/or a method for measuring a gradient with an improved signal-to-noise ratio (SNR).

It is an object of embodiments of the present invention to provide a magnetic sensor device and/or a method for measuring a gradient of a magnetic field more accurately, despite temperature variations and/or stress variations over the sensor device.

It is an object of embodiments of the present invention to provide a magnetic sensor device and/or a method for measuring a gradient of a magnetic field more accurately, despite temperature variations and/or stress variations over the sensor device, in a simple manner (e.g. without having to solve a set of equations).

It is also an object of embodiments of the present invention to provide a current sensor device and/or a method of measuring a current based on a magnetic field gradient.

It is also an object of embodiments of the present invention to provide a distance sensor based on a magnetic field gradient.

According to a first aspect, the present invention provides a magnetic sensor device for measuring a gradient of a magnetic field, comprising: a semiconductor substrate; a first magnetic sensor located at a first location on said semiconductor substrate, and arranged for providing a first sensor signal indicative of a first magnetic field component oriented in a first direction; a first biasing source arranged for biasing the first magnetic sensor using a first biasing signal; a first amplifier arranged for amplifying the first sensor signal and for providing a first amplified sensor signal; a second magnetic sensor located at a second location on said semiconductor substrate different from the first location, and arranged for providing a second sensor signal indicative of a second magnetic field component oriented in said first direction; a second biasing source arranged for biasing the second magnetic sensor using a second biasing signal; a second amplifier arranged for amplifying the second sensor signal and for providing a second amplified sensor signal; one or both of: a temperature sensor and a differential stress measurements circuit, wherein the temperature sensor, if present, is located at a third position on said semiconductor substrate and is configured for measuring a temperature of the substrate and for providing a temperature signal, and wherein the differential stress measurements circuit, if present, is configured for determining a differential mechanical stress between the first sensor location and the second sensor location and for providing a differential stress signal; at least one analog-to-digital converter for converting the first signal and the second signal or a signal derived therefrom, and for digitising said temperature signal to obtain a temperature value and/or for digitising said differential stress signal to obtain a differential stress value; a digital processing circuit connected downstream of the analog-to-digital convertor; wherein the digital processing circuit is configured for obtaining one or both of said temperature value signal and said differential stress value; and wherein the magnetic sensor device is configured for adjusting at least one of: the second biasing signal, the second amplifier gain, and a digital value of the amplified second sensor signal, based on a predefined function of a single temperature value T and/or the differential stress value $\Delta\Sigma$, before determining a difference between: a first signal or a first value derived from (e.g. derived solely from) the first sensor signal, and a second signal or a second value derived from (e.g. derived solely from) the second sensor signal.

It is an advantage of measuring a gradient of a magnetic signal rather than the magnetic signal itself, because a gradient is less sensitive to an external disturbance field. Hence, also the value derived from said gradient, e.g. a current value or a distance value or another value, is substantially insensitive to an external disturbance field.

It is an major advantage of the proposed technique, wherein a temperature of the substrate is measured or wherein a differential stress is measured between the first and second sensor location, or both a temperature and a differential stress, which temperature and/or stress difference is then used for adjusting a portion of the second signal path, in particular, the second biasing current (e.g. relative to the first biasing current) and/or the second gain factor (e.g. relative to the first gain factor) and/or a digital value of the amplified second sensor signal, before combining the signals originating from the first and second magnetic sensor (e.g. by subtraction or division or the like), because, by doing so, the gradient can be determined more accurately. Or more in particular, because by doing so, an error term related to a sensitivity mismatch of the two magnetic sensors and related to a strayfield can be reduced or substantially eliminated.

The present invention is partly based on the insight that, in case of a sensitivity mismatch between the two magnetic sensors (e.g. two Hall elements), the influence of a strayfield may be larger than the gradient signal itself, resulting in a relatively large measurement error, which cannot be removed from the "combined signal" by post-processing in an easy manner. With "combined signal" is meant for example a ratio of the first and second signal, or a difference of the first and second (uncorrected) signal.

Furthermore, for embodiments where the temperature (e.g. substrate temperature) is measured, (in combination with stress measurement or not) the proposed solution is partly based on the further insight that it is not required to measure the temperature at the first sensor location and at the second sensor location, but it suffices to measure the temperature at any arbitrary location on the substrate, and that the temperature difference between the first and the second magnetic sensor (e.g. Hall element) can be expressed (with very good approximation) as a function of the single measured temperature. It was found that this temperature difference may be dependent on the specific chip layout and on the chip packaging, and is typically not constant, but slightly varies with the absolute temperature (see FIG. 3(g)).

For embodiments where no temperature is measured, but only stress difference is measured, the proposed solution is partly based on the further insight that, even though the sensitivities of the first and second magnetic sensor may be different, this can largely be corrected by a function of only differential stress, inter alia because a temperature difference between the first and second sensor location automatically invokes a mechanical stress difference (e.g. because of thermal expansion of materials). In these embodiments, said temperature sensor can be omitted.

It is important to note that all embodiments of this claim are based on the same principles, namely that: (1) a gradient is calculated by determining a difference (e.g. in the analog domain or in the digital domain); (2) that the second signal (or a signal derived therefrom) is corrected/adjusted prior to being subtracted from the first signal (or a signal derived therefrom); and (3) the second value is corrected or adjusted using a correction function $f(T)$ or $f(T, \Delta\Sigma)$ or $f(\Delta\Sigma)$ which does not depend on two temperature values (but at most a single temperature value). This can be represented schematically in the following table, where the different steps in the signal path are indicated in different rows.

Or expressed mathematically, the predefined function may be chosen such that $S1*OG1=S2*OG2$, where $S1$ is the magnetic sensitivity in [Volt/Tesla] of the first magnetic sensor (when biased by the first biasing source), $S2$ is the magnetic sensitivity of the second magnetic sensor (when biased by the second biasing source), $OG1$ is the overall gain of said first signal path starting at the output of the first magnetic sensor and passing through the first amplifier, and $OG2$ is the overall gain of said second signal path starting at the output of the second magnetic sensor and passing through the second amplifier.

As will be explained further, the product $S1*OG1=S2*OG2$ can be made equal in different ways, for example by adjusting a biasing signal (see e.g. FIG. 3(b) and FIG. 3(c)), by adjusting an amplifier gain (see e.g. FIG. 3(d) and FIG. 3(e)), or by correcting a value in the digital domain (see e.g. FIG. 3(f)). This can also be expressed as: $S1.A1.D1=S2.A2.D2$ wherein $A1, A2$ is the amplification of the first, second signal path in the analog domain, and $D1$, $D2$ is the amplification of the first, second signal path in the digital domain.

In an embodiment, the differential stress measurements circuit comprises: a first stress sensor located near the first magnetic sensor and configured for providing a first stress signal indicative of mechanical stress exerted on the first magnetic sensor, and a second stress sensor located near the second magnetic sensor and configured for providing a second stress signal indicative of mechanical stress exerted on the second magnetic sensor, and a subtraction circuit configured for determining a difference between the first stress signal and the second stress signal to obtain said differential stress signal, also referred to as "differential stress signal".

With "stress sensor" is meant a sensor configured for measuring "mechanical stress".

In an embodiment, the third position of the temperature sensor, if present, is different from the first magnetic sensor location, and is different from the second magnetic sensor location.

|  | FIG. 3(b) | FIG. 3(c) | FIG. 3(d) | FIG. 3(e) | FIG. 3(f) |
|---|---|---|---|---|---|
| biasing1, 2 | I1, I2corr | I1, I2corr | I1, I1 | I1, I1 | I1, I1 |
| magnetic sensor1, 2 | sens1, sens2 | sens1, sens2 | sens1, sens2 | sens1, sens2 | sens1, sens2 |
| amplifier1, 2 | A, A | A, A analog subtr | A1, A2corr | A1, A2corr analog subtr | A, A |
| digital factor of signal1, 2 | 1, 1 digital subtr | 1, 1 | 1, 1 digital subtr | 1, 1 | 1, Fcorr digital subtr |

As can be seen, in each of the embodiments the "correction" or "adjustment" (indicated in bold) is done before the subtraction (also indicated in bold), since the correction is higher in the matrix than the subtraction. These embodiments are clearly different solutions for a single problem and are clearly based on the same principles.

In an embodiment, the predefined function $f(T)$ or $f(T, \Delta\Sigma)$ or $f(\Delta\Sigma)$ is chosen such that, during operation, in a predefined temperature range (e.g. from −40° C. to +160° C., or from −20° C. to +120° C.), a product of a magnetic sensitivity $S1$ of the first magnetic sensor and a first overall gain of a first signal path from an output of the first magnetic sensor to said determining of a difference is substantially equal to a second product of the magnetic sensitivity $S2$ of the second magnetic sensor and a second overall gain of a second signal path from an output of the second magnetic sensor to said determining of said difference.

In an embodiment, the third position of the temperature sensor, if present, is located substantially in the middle between the first and second magnetic sensor.

In an embodiment, the predefined function $f(T)$ is dependent on a single measured temperature T, but not on differential stress. In this embodiment the differential stress sensor circuit can be omitted.

In an embodiment, the predefined function $f(\Delta\Sigma)$ is dependent on differential stress, but not on the measured temperature. In this embodiment the temperature sensor may be omitted.

In an embodiment, the predefined function $f(T, \Delta\Sigma)$ is dependent both on temperature and on differential stress, in particular on differential stress and a single temperature.

In an embodiment, the predefined function is determined during a calibration test, or is determined during the qualification or calibration procedure of a relatively large number (e.g. at least 200 or at least 500) of magnetic devices.

In an embodiment, the digital processing circuit is configured for determining the magnetic field gradient by adjusting the second biasing signal or adjusting the second amplifier gain using a predefined function f(T) of a single measured temperature; and by digitizing the first amplified signal to obtain a first digital value, and by digitizing the second amplified signal to obtain a second digital value; and by calculating a difference (in the digital domain) between the second digital value and the first digital value. An example is illustrated e.g. in FIG. 3(b) and FIG. 3(d).

In an embodiment, the digital processing circuit is configured for determining the magnetic field gradient by adjusting the second biasing signal or by adjusting the second amplifier gain using a predefined function f(T) of a single measured temperature; and by generating a difference signal (in the analog domain) between the first amplified sensor signal and the second amplified sensor signal; and by digitizing the difference signal. An example is illustrated e.g. in FIG. 3(b) and FIG. 3(d).

In an embodiment, the digital processing circuit is configured for determining the magnetic field gradient by amplifying and digitizing the first sensor signal to obtain a first digital value, and by amplifying and digitizing the second sensor signal to obtain a second digital value, and by multiplying the second digital value using a predefined function f(T) of a single measured temperature thereby obtaining a corrected second digital value, and by calculating a difference (in the digital domain) between the first digital value and the corrected second digital value. An example is illustrated e.g. in FIG. 3(f).

In an embodiment, the first biasing source is a first current source configured for providing a first predefined current signal, and the second biasing source is an adjustable current source configured for providing an adjustable second current signal; and wherein the first amplifier is configured for amplifying with a first predefined gain, and the second amplifier is configured for amplifying with a second predefined gain; and wherein the first digital value is obtained by biasing the first magnetic sensor with the first current signal, and by amplifying the first sensor signal with the first predefined gain, and by digitizing this amplified signal; and wherein the second digital value is obtained by biasing the second magnetic sensor with the second current signal, and by amplifying the second sensor signal with the second predefined gain, and by digitizing this amplified signal; and wherein the magnetic field gradient is calculated by subtracting the first digital value and the second digital value; and wherein the second current signal is adjusted using said predefined function f(T) of a single measured temperature (but not differential stress), or using said predefined function f(T, Δ Σ) of a single measured temperature and differential stress, or using said predefined function f(ΔΣ) of differential stress (but not temperature).

FIG. 3(b), FIG. 4(b), FIG. 5(b) show examples of such a magnetic sensor device.

The second amplifier gain may be substantially equal to the first amplifier gain or may be different from the first amplifier gain. It is an advantage that the adjusted current can also compensate for any gain mismatch of the amplifiers.

The gradient may optionally be multiplied by a predefined factor.

In a particular embodiment, the second current signal is adjusted by applying a voltage defined by said predefined function f( ) to the gate of a transistor of the second current source. This offers the advantage that the predefined function can be easily determined by performing a calibration measurement during production, and that the device can use the same function f( ) during actual use.

In an embodiment, the first biasing source is a first current source configured for providing a first predefined current signal, and the second biasing source is an adjustable current source configured for providing an adjustable second current signal; and wherein the first amplifier is configured for amplifying the first magnetic sensor signal with a first predefined gain to obtain a first amplified sensor signal, and the second amplifier is configured for amplifying the second magnetic sensor signal with a second predefined gain to obtain a second amplified sensor signal; and wherein the magnetic sensor device further comprises an analog subtraction circuit configured for subtracting the first amplified signal and the second amplified sensor signal to obtain an analog difference signal; and wherein the at least one analog-to-digital converter is configured for digitizing said analog difference signal, which is equal to or proportional to the gradient; and wherein the second current signal is adjusted using said predefined function f(T) of a single measured temperature (but not differential stress), or using said predefined function f(T, Δ Σ) of a single measured temperature and differential stress, or using said predefined function f(ΔΣ) of differential stress (but not temperature).

FIG. 3(c), FIG. 4(c), FIG. 5(c) show examples of such a magnetic sensor device.

The second amplifier gain may be substantially equal to the first amplifier gain or may be different from the first amplifier gain. It is an advantage that the adjusted current can also compensate for any gain mismatch of the amplifiers.

The digitized difference value may be optionally multiplied by a predefined factor.

It is an advantage of this embodiment that the difference is calculated in the analog domain (typically half the quantization noise).

It is a major advantage of this embodiment that the range of the ADC can be completely used for digitizing the gradient signal, in contrast to e.g. the sensor device of FIG. 3(b), where the gradient is only a fraction of the total digital signal. In this way the signal-to-noise ratio (SNR) of the gradient (or a value derived therefrom) can be significantly improved.

In an embodiment, the first biasing source is a first current source configured for providing a first predefined current signal, and the second biasing source is a second current source configured for providing a second predefined current signal; and wherein the first amplifier is configured for amplifying with a first predefined gain, and the second amplifier is configured for amplifying with an adjustable gain; and wherein the magnetic sensor device further comprises an analog subtraction circuit configured for subtracting the first amplified sensor signal and the second amplified sensor signal to obtain an analog difference signal; and wherein the at least one analog-to-digital converter is configured for digitizing said analog difference signal, the result of which is equal to or proportional to the gradient; and wherein the second amplifier gain is adjusted using said predefined function f(T) of a single measured temperature (but not differential stress), or using said predefined function f(T, Δ Σ) of a single measured temperature and differential stress, or using said predefined function f(ΔΣ) of differential stress (but not temperature).

FIG. 3(e), FIG. 4(e), FIG. 5(e) show examples of such a magnetic sensor device.

The second current may be substantially equal to the first current or may be different from the first current. It is an advantage that the adjusted gain of the second amplifier can also compensate for any current mismatch of the current sources.

The digitized difference value may be optionally multiplied by a predefined factor.

It is an advantage of this embodiment that the difference is calculated in the analog domain (typically half the quantization noise).

It is a major advantage of this embodiment that the range of the ADC can be completely used for digitizing the gradient signal, in contrast to e.g. the sensor device of FIG. 3(b), where the gradient is only a fraction of the total digital signal. In this way the signal-to-noise ratio (SNR) of the gradient, or a value derived therefrom, can be significantly improved.

In an embodiment, the magnetic sensor device further comprises a third amplifier with a predefined gain (B), arranged between the analog subtraction circuit and the at least one analog-to-digital converter (ADC).

In an embodiment, the first biasing source is a first current source configured for providing a first predefined current signal, and the second biasing source is a second current source configured for providing a second predefined current signal; and wherein the first amplifier is configured for amplifying with a first predefined gain, and the second amplifier is configured for amplifying with an adjustable gain; and wherein the first digital value is obtained by biasing the first magnetic sensor with the first current signal, and by amplifying the first sensor signal with the first predefined gain, and by digitizing this first amplified signal; and wherein the second digital value is obtained by biasing the second magnetic sensor with the second current signal, and by amplifying the second sensor signal with the second gain, and by digitizing this second amplified signal; wherein the second gain is adjusted using said predefined function f(T) of a single measured temperature (but not differential stress), or using said predefined function f(T, $\Delta\Sigma$) of a single measured temperature and differential stress, or using said predefined function f($\Delta\Sigma$) of differential stress (but not temperature). FIG. 3(d), FIG. 4(d), FIG. 5(d) show examples of such a magnetic sensor device.

The second current may be substantially equal to the first current or may be different from the first current. It is an advantage that the adjusted gain of the second amplifier can also compensate for any current mismatch of the current sources.

In an embodiment, the first biasing source is a first current source configured for providing a first predefined current signal, and the second biasing source is a second current source configured for providing a second predefined current signal; and wherein the first amplifier is configured for amplifying with a first predefined gain, and the second amplifier is configured for amplifying with a second predefined gain; and wherein the at least one analog-to-digital converter is configured for digitizing the first amplified sensor signal to provide a first digital value, and for digitizing the second amplified sensor signal to provide a second digital value; and wherein the digital processing circuit is configured for multiplying the second digital value with a digital correction factor (e.g. Fcorr) using said predefined function f(T) of a single measured temperature (but not differential stress), or using said predefined function f(T, $\Delta\Sigma$) of a single measured temperature and differential stress, or using said predefined function f($\Delta\Sigma$) of differential stress (but not temperature) to provide a corrected second digital value; and wherein the digital processing circuit is further configured for determining a difference between the corrected second digital value and the first digital value to obtain the gradient.

FIG. 3(f), FIG. 4(f), FIG. 5(f) show examples of such a magnetic sensor device.

The second predefined current may be substantially equal to the first predefined current, but that is not absolutely required. Likewise, the second amplifier gain may be substantially equal to the first amplifier gain, but that is not absolutely required.

In an embodiment, the magnetic sensor device further comprises a non-volatile memory connected to the digital processing circuit, said non-volatile memory storing one or more coefficients or values or parameters of the predefined function f(T) or f(T, $\Delta\Sigma$) or f($\Delta\Sigma$).

The predefined function f( ) can for example be stored in the form of a look-up table, or represented by a piece-wise-linear function, or by a first order polynomial in one or two variables (Temperature T and/or differential stress $\Delta\Sigma$), or by a second order polynomial in one or two variables (Temperature T and/or differential stress $\Delta\Sigma$), or by a third order polynomial in one or two variables (Temperature T and/or differential stress $\Delta\Sigma$), or by a polynomial having an order of at least four.

The values or coefficients or parameters can for example be determined during a calibration procedure of each individual device, or by simulation, or by qualifying a number of test-samples (e.g. at least 100 or at least 500), in known manners.

In an embodiment, the first magnetic sensor is or comprises a first horizontal Hall element and the second magnetic sensor is or comprises a second horizontal Hall element.

In an embodiment, the first magnetic sensor is or comprises a first vertical Hall element and the second magnetic sensor is or comprises a second vertical Hall element.

In an embodiment, the first magnetic sensor comprises a first integrated magnetic concentrator and a first and a second horizontal Hall element arranged on opposite sites of the first magnetic concentrator, the output signals of the first and second Hall element being combined (e.g. added or subtracted) to form the first sensor signal; wherein the second magnetic sensor comprises a second integrated magnetic concentrator and a third and a fourth horizontal Hall element arranged on opposite sites of the second magnetic concentrator, the output signals of the third and fourth Hall element being combined (e.g. added or subtracted) to form the second sensor signal; wherein the first integrated magnetic concentrator is spaced from the second magnetic concentrator and wherein the first, second, third and fourth horizontal Hall elements are arranged on a single axis.

Examples of such a magnetic sensor device are shown in FIGS. 6(a) to 6(c), FIGS. 7(a) to 7(c), FIGS. 8(a) to 8(c), and FIG. 11(c).

In case the first and second stress sensor are present, the first stress sensor is preferably arranged in close vicinity of the first integrated magnetic concentrator (IMC1), and the second stress sensor is preferably arranged in close vicinity of the second integrated magnetic concentrator (IMC2).

According to a second aspect, the present invention also provides a method of determining a gradient of a magnetic field, the method comprising the steps of: a) biasing the first magnetic sensor with a first biasing signal; b) measuring a first sensor signal by a first magnetic sensor; c) amplifying the first sensor signal by a first amplifier to provide a first amplified sensor signal; d) biasing the second magnetic sensor with a second biasing signal; e) measuring a second sensor signal by a second magnetic sensor, spaced from the first magnetic sensor; f) amplifying the second sensor signal by a second amplifier to provide a second amplified sensor signal; g) measuring at least one of: a temperature using a temperature sensor and a stress difference experienced by the first magnetic sensor and the second magnetic sensor using a differential stress circuit; h) adjusting at least one of: the second biasing signal, the second amplifier gain, and a digital value of the amplified second sensor signal, based on a predefined function f( ) of a single measured temperature and/or the measured differential stress, before determining a difference between: a first signal or a first value derived from (e.g. derived solely from) the first sensor signal, and a second signal or second value derived from (e.g. derived solely from) the second sensor signal.

The predefined function f( ) may be a function f(T) of a single measured temperature (but not differential stress), or a function f(T, $\Delta\Sigma$) of a single measured temperature and differential stress, or a function f($\Delta\Sigma$) of differential stress (but not temperature).

In an embodiment, step h) comprises: adjusting the second biasing signal and/or adjusting the second amplifier gain using said predefined function; and digitizing the first amplified signal to obtain a first digital value and digitizing the second amplified signal to obtain a second digital value; and calculating a difference (in the digital domain) between the second digital value and the first digital value.

In an embodiment, step h) comprises: adjusting the second biasing signal and/or adjusting the second amplifier gain using said predefined function; and generating a difference signal (in the analog domain) between the first amplified sensor signal and the second amplified sensor signal; and digitizing the difference signal to obtain a digital difference value.

In an embodiment, step h) comprises: applying a second biasing signal, and applying a second amplifier gain, and amplifying and digitizing the first sensor signal to obtain a first digital value, and amplifying and digitizing the second sensor signal to obtain a second digital value, and multiplying the second digital value with a correction factor (e.g. Fcorr) based on said predefined function to obtain a corrected second digital value, and calculating a difference (in the digital domain) between the first digital value and the corrected second digital value.

According to a third aspect, the present invention also provides a sensor arrangement comprising: a magnetic sensor device for measuring a gradient of said magnetic field according to the first aspect; and a magnetic source for creating a non-uniform magnetic field.

In an embodiment, the magnetic source is a magnet having at least two poles, or at least four poles, or at least six poles.

In an embodiment, the magnetic source is a disk magnet or ring magnet having at least two poles, or at least four poles. The disk or ring magnet may be axially or diametrically or radially magnetized.

According to a fourth aspect, the present invention also provides a current sensor device, comprising a magnetic sensor device according to the first aspect, wherein the digital processing circuit is further configured for calculating a current value by multiplying the gradient with a predefined constant K, or by multiplying the gradient with a predefined function of temperature K(T).

The value of K can for example be obtained using a look-up table in a non-volatile memory, optionally with linear interpolation.

Values or coefficients or parameters of the predefined function K(T) can be stored for example in a non-volatile memory. The function K(T) can for example be calculated using a mathematical formula, e.g. using a piece-wise linear function, or a polynomial function of T, preferably a first order or second order polynomial of the temperature T.

In an embodiment (see e.g. FIG. 10), the current sensor device further comprises an integrated conductor portion for conducting the current to be measured, (also known as "an integrated current sensor device"), wherein the semiconductor substrate containing the first and second magnetic sensor is arranged in a predefined position and orientation relative to the integrated conductor portion, and adapted for measuring a magnetic field generated by the current to be measured when flowing through the integrated conductor portion.

The integrated current conductor may be implemented as part of a copper lead frame, and the substrate of the magnetic sensor device may be arranged in a predefined manner relative to the lead frame.

The first and second magnetic sensor may be located symmetrically or asymmetrically with respect to a center line or heart-line of the integrated electrical conductor portion.

In an embodiment the integrated current sensor comprises two horizontal Hall elements without integrated magnetic concentrators (IMC), e.g. as illustrated in FIG. 9.

In an embodiment the integrated current sensor comprises two vertical Hall elements without integrated magnetic concentrators, e.g. as illustrated in FIG. 10.

In an embodiment the integrated current sensor comprises two horizontal Hall elements with integrated magnetic concentrators (IMC), not shown.

According to a fifth aspect, the present invention also provides a distance sensor device comprising a magnetic sensor device according to the first aspect, wherein the digital processing circuit is further configured for calculating a distance by multiplying the gradient with a predefined constant K or by multiplying the gradient with a predefined function K(T) of temperature.

Values or coefficients or parameters of this predefined function can be stored for example in a non-volatile memory. The function K(T) can for example be calculated using a mathematical formula, e.g. using a piece-wise linear function, or a polynomial function of T, preferably a first order or second order polynomial of the temperature T.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 2 illustrates a technical problem underlying the present invention.

FIG. 9, including FIGS. 9(a) and 9(b), illustrate a magnetic current sensor according to an embodiment of the present invention, based on a measurement of a magnetic field gradient according to the principles of the present invention, using a substrate with two horizontal Hall elements.

FIG. 10, including FIGS. 10(a) and 10(b), illustrate an integrated magnetic current sensor according to an embodiment of the present invention, based on a measurement of a magnetic field gradient according to the principles of the present invention, using a substrate with two vertical Hall elements.

FIG. 12(a) shows a generic flow-chart illustrating methods of measuring a magnetic field gradient, according to embodiments of the present invention.

Figure 1A:
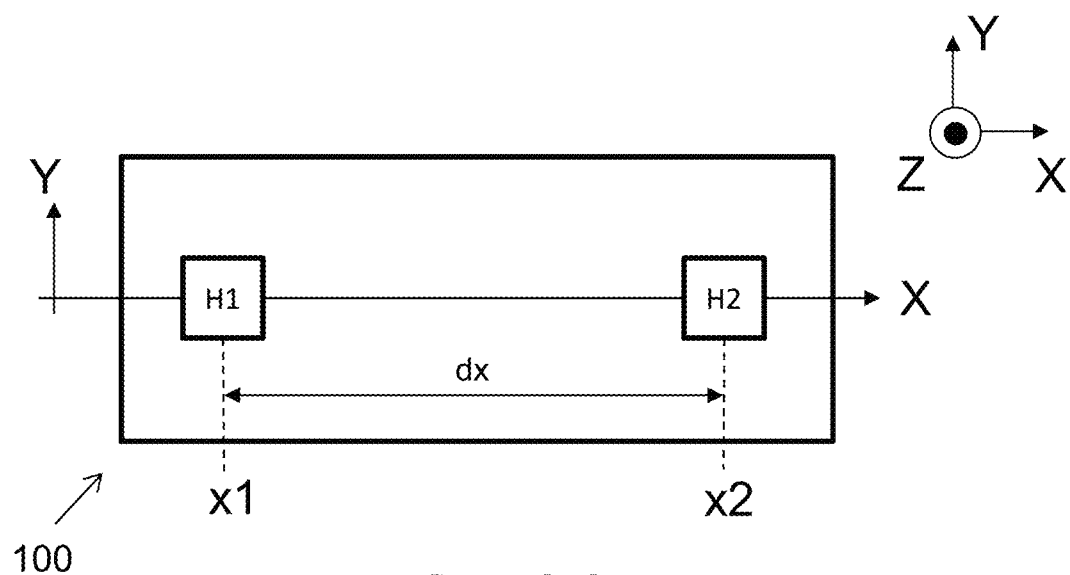
FIG. 1(a) shows an illustrative sensor arrangement for measuring a magnetic field gradient, known in the art.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document the reference "T" is used to indicate both a temperature sensor, as well as a temperature signal obtained therefrom. Sometimes a lowercase letter "t" is used to indicate an analog temperature signal, and an uppercase letter "T" is used to indicate a digital temperature signal, but this distinction is not always made. It shall be clear from the context which meaning is intended.

In this document the reference "σ1" is typically used to indicate the first stress signal, indicative of mechanical stress exerted upon by the first magnetic sensor. Likewise, the reference "σ2" is typically used to indicate the second stress signal, indicative of mechanical stress exerted upon the second magnetic sensor. The reference "Δσ" is typically used to indicate the analog difference between σ1 and σ2, and the reference "ΔΣ" is typically used to indicate the digital value corresponding with this analog difference signal.

In this document the reference "I1" is used to indicate both a first current source, as well as a first current signal. It shall be clear from the context which meaning is intended.

In this document the reference "A1" is used to indicate both a first amplifier, as well as a first amplifier gain. It shall be clear from the context which meaning is intended.

In this document the reference "S1" is used to indicate either the first magnetic sensitivity, or the first stress sensor. It shall be clear from the context which meaning is intended.

In this document, the notation "f(.)" or "f( )" is used to indicate a function without explicitly specifying the arguments of that function. It can for example be a function f(T) of a single measured temperature value, or a function f(T, ΔΣ) of a single temperature and of differential stress, or a function f(ΔΣ) of differential stress, where T is a measured temperature, ΔΣ is differential stress.

Where in the present invention reference is made to a "current source", what is meant is a component or circuit capable of providing a current to a node, substantially independent on the voltage of that node. Typically, a current source has a relatively large output impedance, e.g. at least 1 K Ohm, or at least 10 K Ohm.

In this document, the expressions "stress difference signal" and "differential stress signal" are used as synonyms.

In this document, the term arctan function or atan 2 function refer to an arctangent function. The reader not familiar with the atan 2 function (or "2-argument arctangent" function) may for example refer to https://en.wikipedia.org/wiki/Atan 2 for more information. In the context of the present invention, the formulas arctan(x/y), atan 2(x,y), arccot(y/x) are considered to be equivalent.

In this document, the term "magnetic sensor device" or "sensor device" refers to a device comprising a substrate, preferably a semiconductor substrate, comprising at least two "magnetic sensor elements". The sensor device may be comprised in a package, also called "chip", although that is not absolutely required.

The term "magnetic sensor" or "magnetic sensor structure" or "magnetic sensor arrangement" as used herein may refer to one or more sensor elements capable of measuring one or more magnetic effects, such as the Hall effect, or magneto-resistive (MR) effects. Non-limiting examples for magneto-resistive effects include GMR (giant magnetoresistance), CMR (colossal magnetoresistance), AMR (anisotropic magnetoresistance) or TMR (tunneling magnetoresistance). Depending on the context, the term "magnetic sensor" may refer to a single magnetic sensitive element (e.g. a Horizontal Hall element or a Vertical Hall element), or to a group of magnetic elements (e.g. arranged in a Wheatstone bridge, or arranged adjacent an integrated magnetic concentrator (IMC)), a sub-circuit further comprising one or more of: a biasing circuit, a readout circuit, an amplifier, an Analog-to-Digital converter, etc.

In the present invention, the expression "magnetic sensitivity" refers to the value "S" as used for example in the formula: v=S*B, where v=voltage signal, S=magnetic sensitivity, B=magnetic field strength. The magnetic sensitivity can be expressed in [Volts/Tesla].

In the present invention, the expression "current related magnetic sensitivity" refers to the value "s" as used for example in the formula: v=s*I*B, where v=voltage signal, s=current related magnetic sensitivity, I=current, B=magnetic field strength. The current related magnetic sensitivity can be expressed in [Volts/(Ampère*Tesla)].

The present invention relates to devices and methods of measuring a magnetic field gradient or a magnetic field difference.

FIG. 1(a) shows a sensor arrangement 100 for measuring a magnetic field gradient, known in the art. This sensor arrangement comprises two horizontal Hall elements H1, H2, which are spaced apart over a distance dx along a predefined axis X. The first Hall element H1 is located at position X1 and measures a magnetic field component Bz1 oriented in a direction Z perpendicular to the substrate. The second Hall element H2 is located at position X2 and measures a magnetic field component Bz2 also oriented in the direction Z perpendicular to the substrate.

Figure 1B:
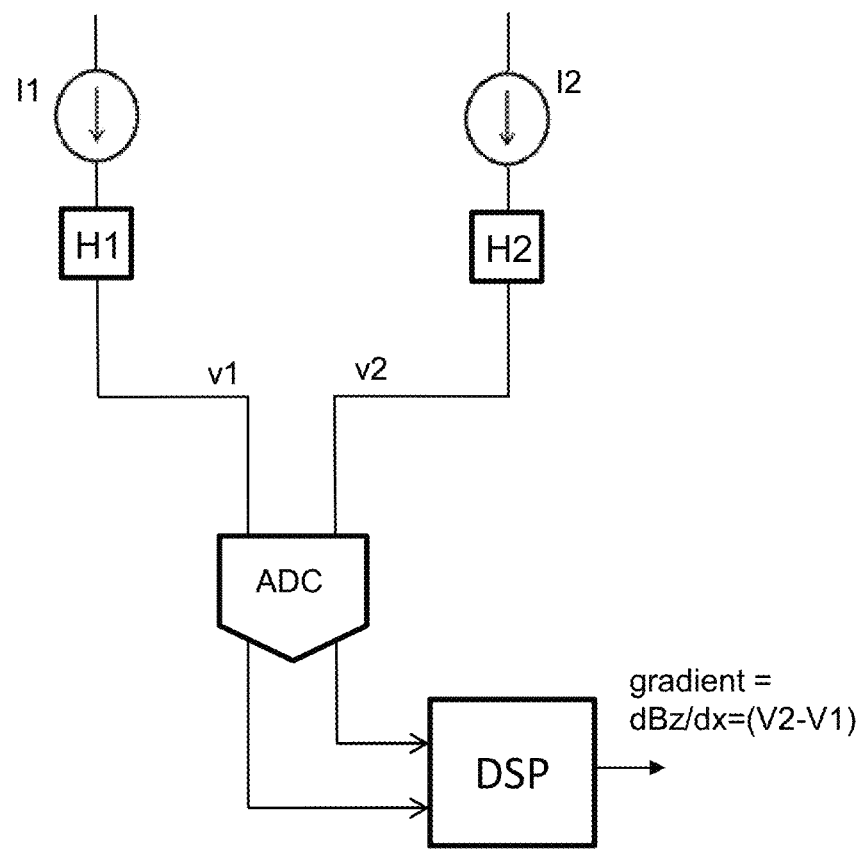
FIG. 1(b) shows a schematic block diagram of a circuit for biasing and read-out of the sensor arrangement of FIG. 1(a), known in the art.

FIG. 1(b) shows a schematic representation of a classical biasing circuit with two current sources, and a readout circuit comprising a digitiser, and a processing circuit.

A magnetic field gradient dBz/dx of the magnetic field component Bz oriented in the Z direction (perpendicular to the semiconductor substrate), along the X direction (parallel to the semiconductor substrate) can be determined as:

$$dBz/dx \sim \Delta Bz = (Bz2-Bz1) \qquad [1]$$

where the symbol ~ means "is proportional to".

One of the main reasons of using a gradient signal instead of individual magnetic field component values is that the gradient signal is highly insensitive to a homogeneous external disturbance field. This advantage is described in other patent documents (e.g. WO98/54547 or WO2014/029885A1), and is being used more and more in the field of magnetic position sensors for industrial or automotive applications, often in combination with a multi-pole (e.g. four-pole or six-pole) ring or disk magnet.

In fact, using a gradient often also helps to reduce the influence of positioning errors, because typically, if one signal increases, the other signal decreases, hence the gradient remains substantially the same. And the same applies to sensitivity mismatch of the sensors: it suffices that the sensitivities of the sensors are more or less the same, because sensitivity mismatch is largely compensated for by calculating a gradient signal. Moreover, in many of these applications, even the absolute value of the gradient is not important, but the value of a ratio of two gradients. This is for example the case in angular or linear position sensors, where the angular position is calculated as an arctangent function of a ratio of two gradients. These sensors are also highly robust against demagnetisation of the magnet, and/or temperature effects.

Over the years, these developments have led those skilled in the niche of gradiometric magnetic sensors to believe that, by measuring a quantity based on a gradient measurement, the result is more accurate because the gradient is insensitive to an external magnetic field, and the developers do not have to worry so much about imperfections of the magnetic source, positioning errors, sensitivity mismatch, temperature variations, etc., because these are intrinsically taken care of by the gradient, and/or by a ratio of two gradients.

The inventors of the present invention have discovered, however, that this reasoning is incorrect if the gradient signal itself is relatively small compared to the stray field. In embodiments of the present invention, strayfield is a field portion common to both the first and the second sensor.

FIG. 2 illustrates how two Bz field components, Bz1 measured at location X1, and Bz2 measured at location X2 spaced from X1 by a distance Δx, are processed conventionally, in the schematic block diagram of FIG. 1(b). Assume that the signal Bz1 is the sum of a signal Bz1m (e.g. induced by a magnet) plus a strayfield component Bzext, thus Bz1=Bz1m+Bzext, and likewise, Bz2=Bz2m+Bzext. Assume further that the first Hall element H1 is biased with a first biasing current I1, and that the first Hall element H1 provides a voltage signal v1 proportional to the product of the biasing current I1 and the applied magnetic field component Bz1 according to the following formula:

$$v1 = s1.I1.Bz1 \qquad [4]$$

where s1 represents the "current related magnetic sensitivity" of the first Hall element (expressed in [Volt/(Tesla*Ampère)]), and that the second Hall element H2 is biased with a second biasing current I2, and that the second Hall element H2 provides a voltage signal v2 proportional to the biasing current I2, and that the second Hall element H2 provides a voltage signal v2 proportional to the product of the biasing current I2 and the applied magnetic field component Bz2 according to the following formula:

$$v2 = s2.I2.Bz2 \qquad [5]$$

where s2 represents the "current related magnetic sensitivity" of the second Hall element (expressed in [Volt/(Tesla*Ampère)]).

Assuming that the analogue to digital converter (ADC) converts these signals respectively in a first digital value V1, and a second digital value V2, then the processing circuit (e.g. DSP) will calculate the gradient as the difference between V2 and V1, which can be expressed as follows:

$$\text{gradient} = V2 - V1 \qquad [6]$$

$$\text{gradient} = s2.I2.(Bz1m+Bzext) - s1.I1.(Bz2m+Bzext) \qquad [7]$$

Assuming now that the first biasing current I1 is approximately equal to the second biasing current I2, and that s1.I1 is approximately equal to s2.I2, then expression [7] can be approximated by:

$$\text{gradient} \approx (s2-s1).I1.Bzext + (s1.I1).(\Delta Bzm) \qquad [8]$$

where ≈ means "is approximately equal to".

It can be seen from this expression [8] that the second term is the real gradient term, which is indeed proportional to the applied biasing current I1 and the magnetic field difference ΔBz, but surprisingly the calculated gradient value also has an unexpected error term which is proportional to the strayfield Bzext at the sensor locations, multiplied by the sensitivity mismatch (s2−s1).

As suggested above, in case the strayfield value is substantially equal to zero, the error term is negligible, but in systems where the strayfield value of Bzext is larger than the value of ΔBzm, which is indeed the case in some applications, the error term becomes significant.

In order to reduce or minimize the error term for a system using a single gradient, the present invention proposes to dynamically adjust the second biasing source and/or the second amplifier and/or the second digital value relative to the first biasing source and/or the first amplifier and/or the first digital value, using a predefined function, before subtracting it from the first analog signal or the first digital value.

More in particular, the present invention proposes a magnetic sensor device having the features of the independent device claim and proposes a method of measuring a magnetic field gradient having the features of the independent method claim. In order to fully understand and appreciate the proposed solutions, the following additional insights are disclosed.

The inventors of the present invention came to a further insight that, in order to reduce the error term of equation [8], it is not required to adjust both sensitivities to a predefined absolute value, but it suffices to adjust only one sensitivity to become substantially equal to the other sensitivity. This further insight allowed them to find a simpler solution than for example the one proposed in EP3109658, where each magnetic sensor is provided with a temperature sensor and a mechanical stress sensor, and where the absolute value of the magnetic field is calculated by solving a set of mathematical equations.

Figure 4A:
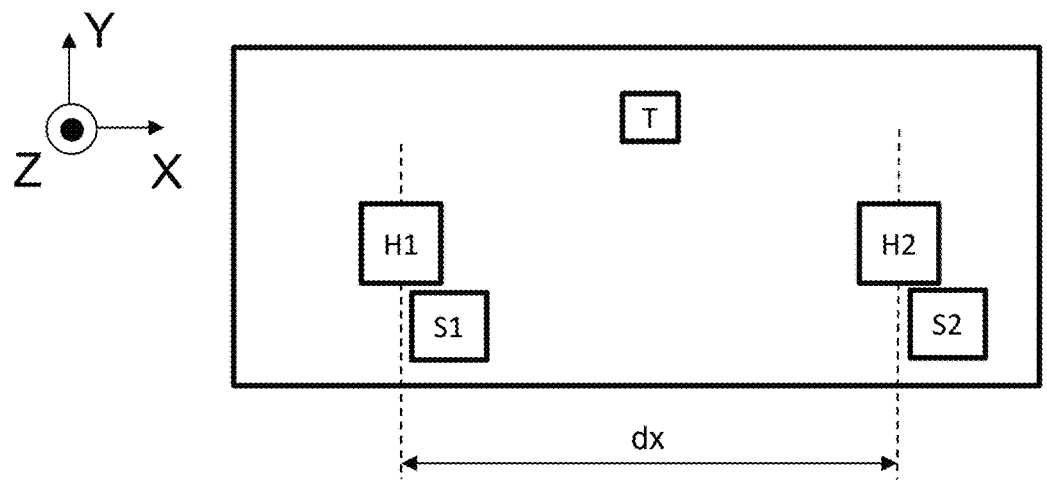
FIG. 4(a) shows a variant of the sensor arrangement of FIG. 1(a) with a temperature sensor and a differential stress sensor, which can also be seen as a variant of the sensor arrangement of FIG. 3(a) with a differential stress sensor, according to another embodiment of the present invention.
Figure 4B:
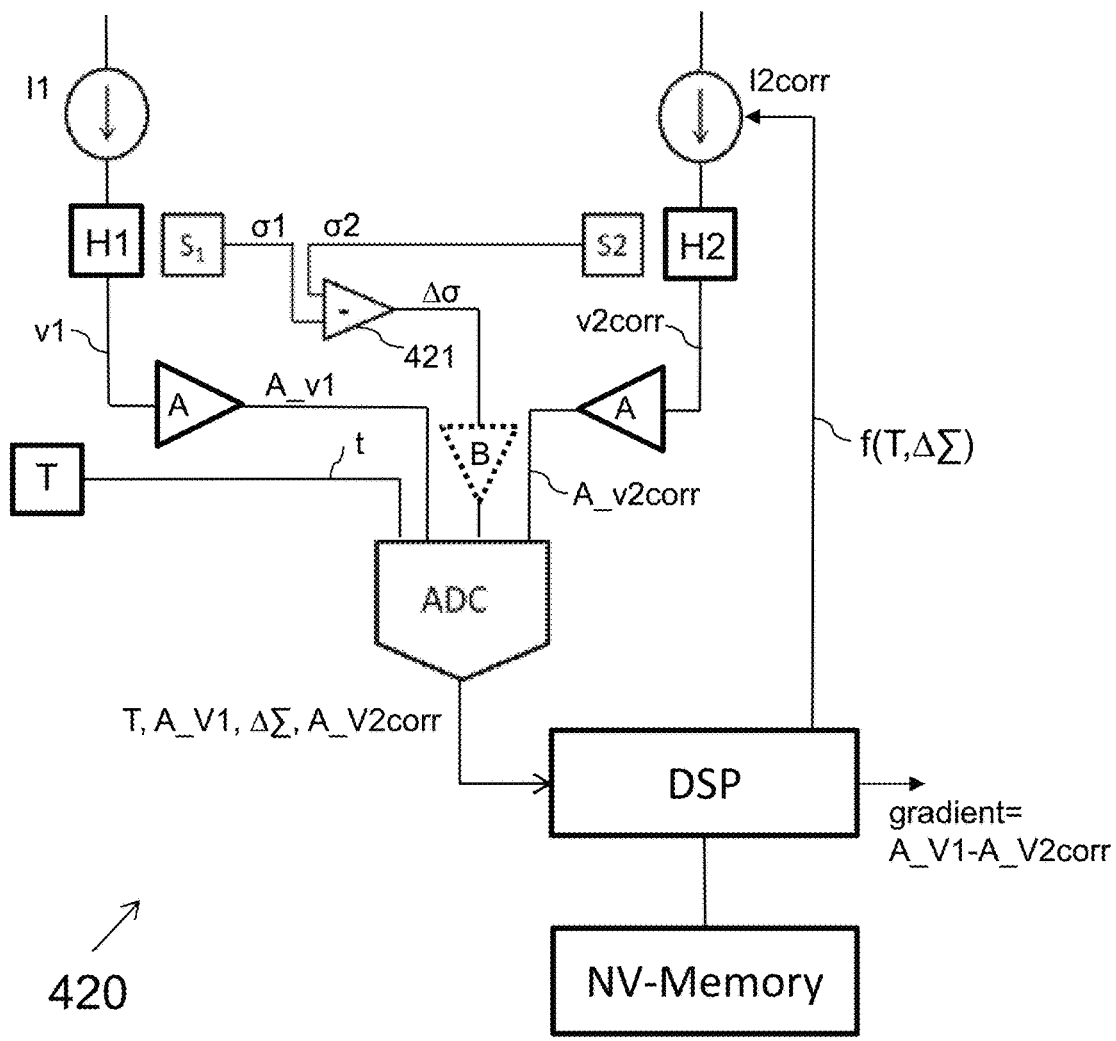
FIG. 4(b) to FIG. 4(f) show variants of the circuits of FIG. 3(b) to FIG. 3(f), furthermore using the differential stress signal, according to other embodiments of the present invention.
Figure 4C:
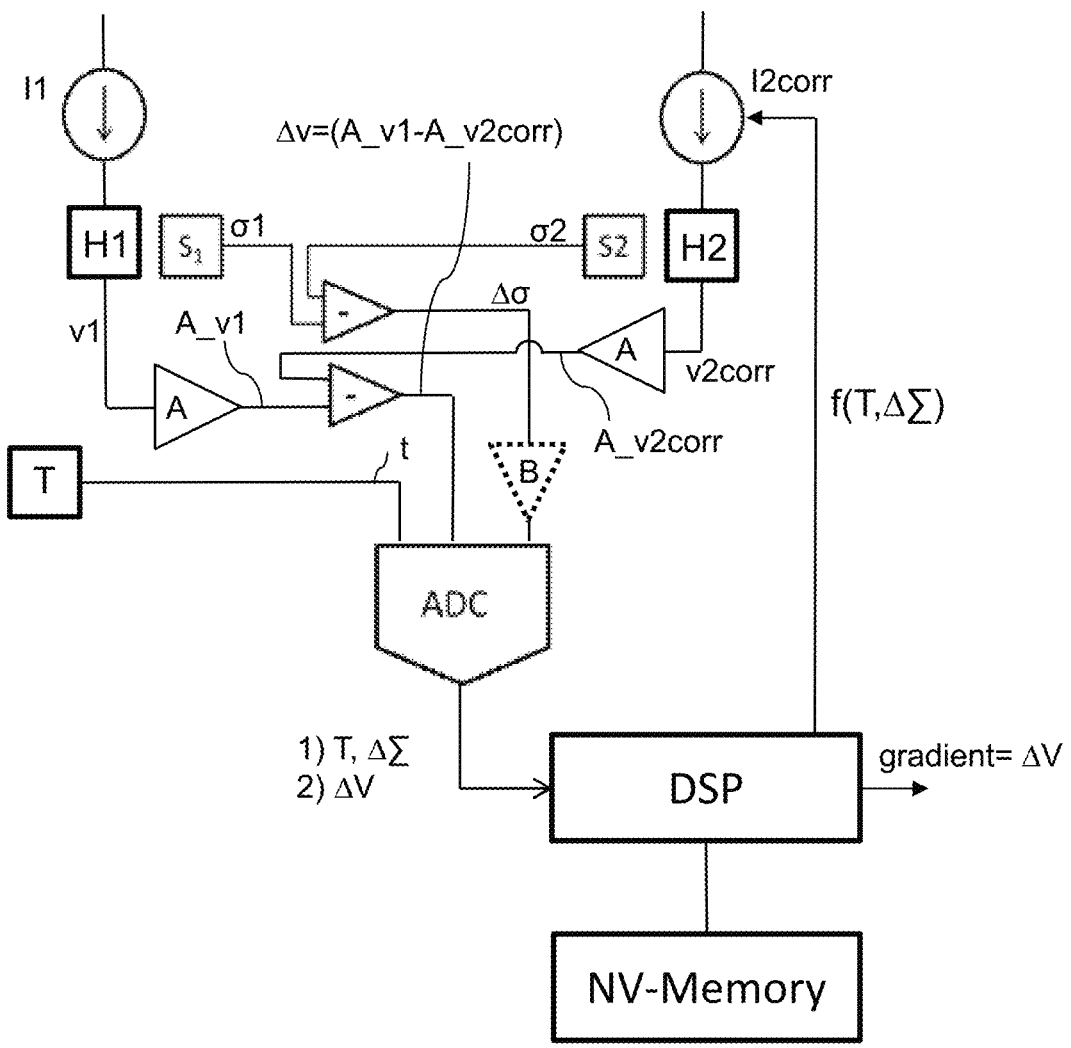
Figure 4D:
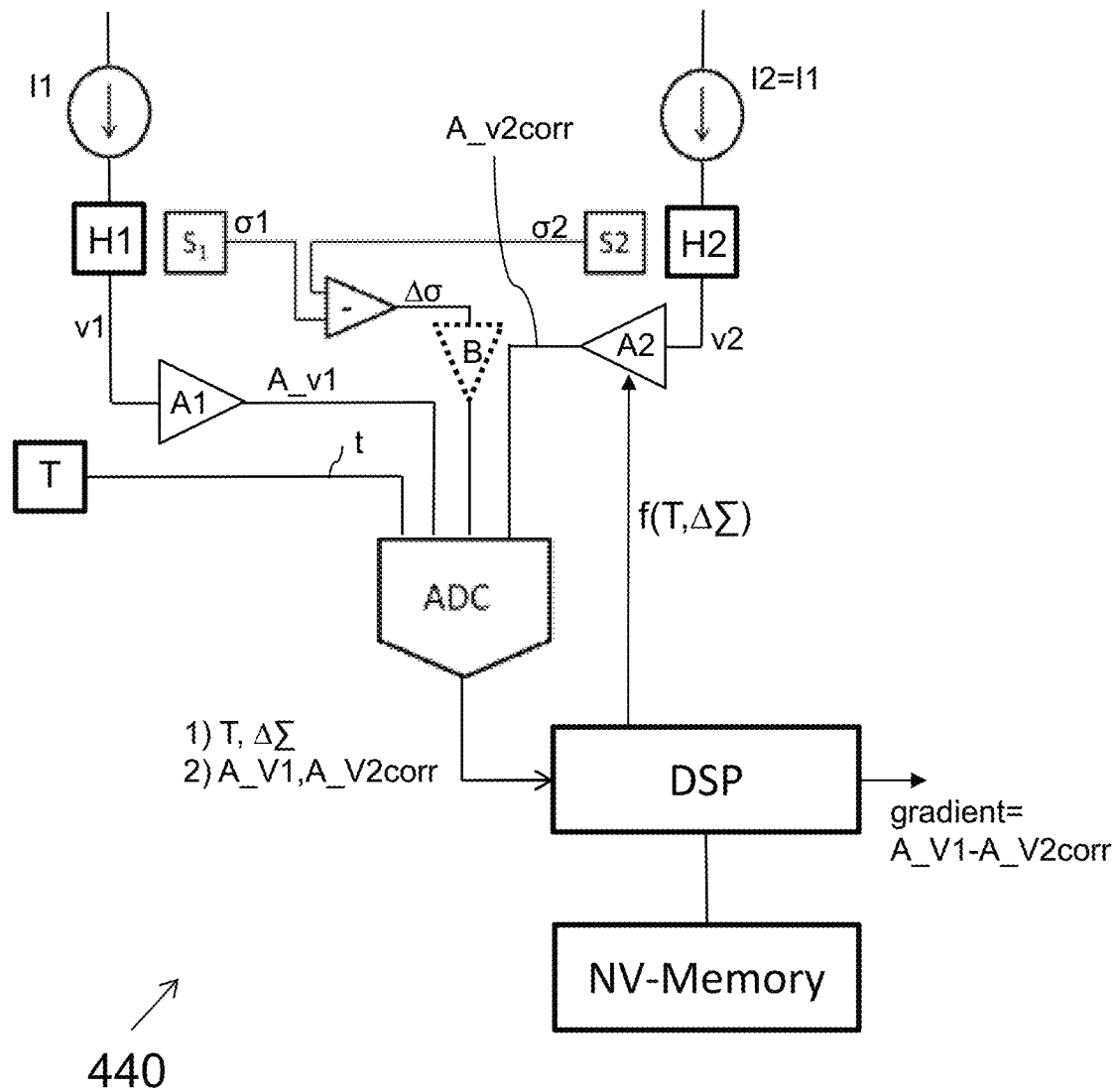
Figure 4E:
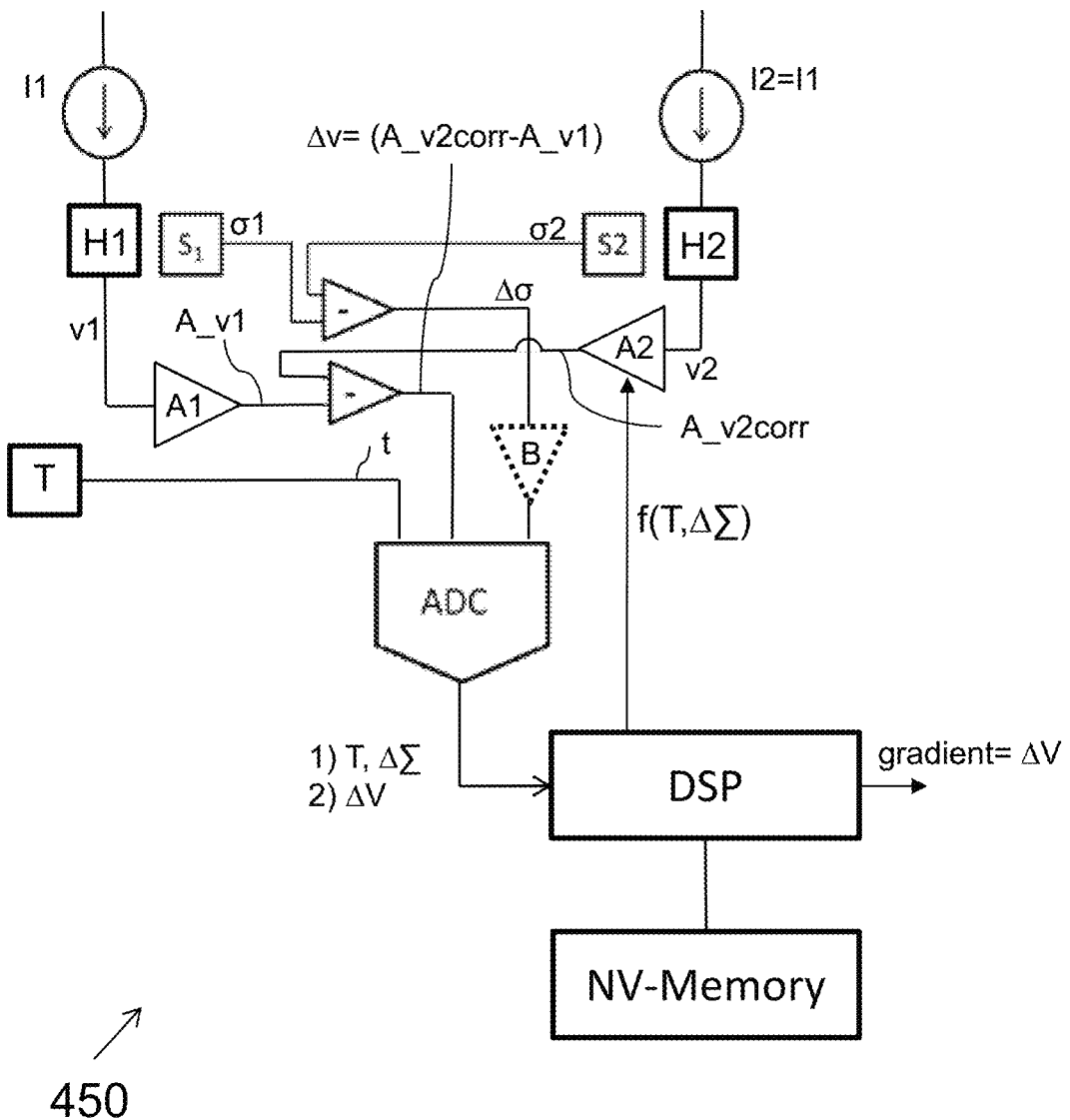
Figure 4F:
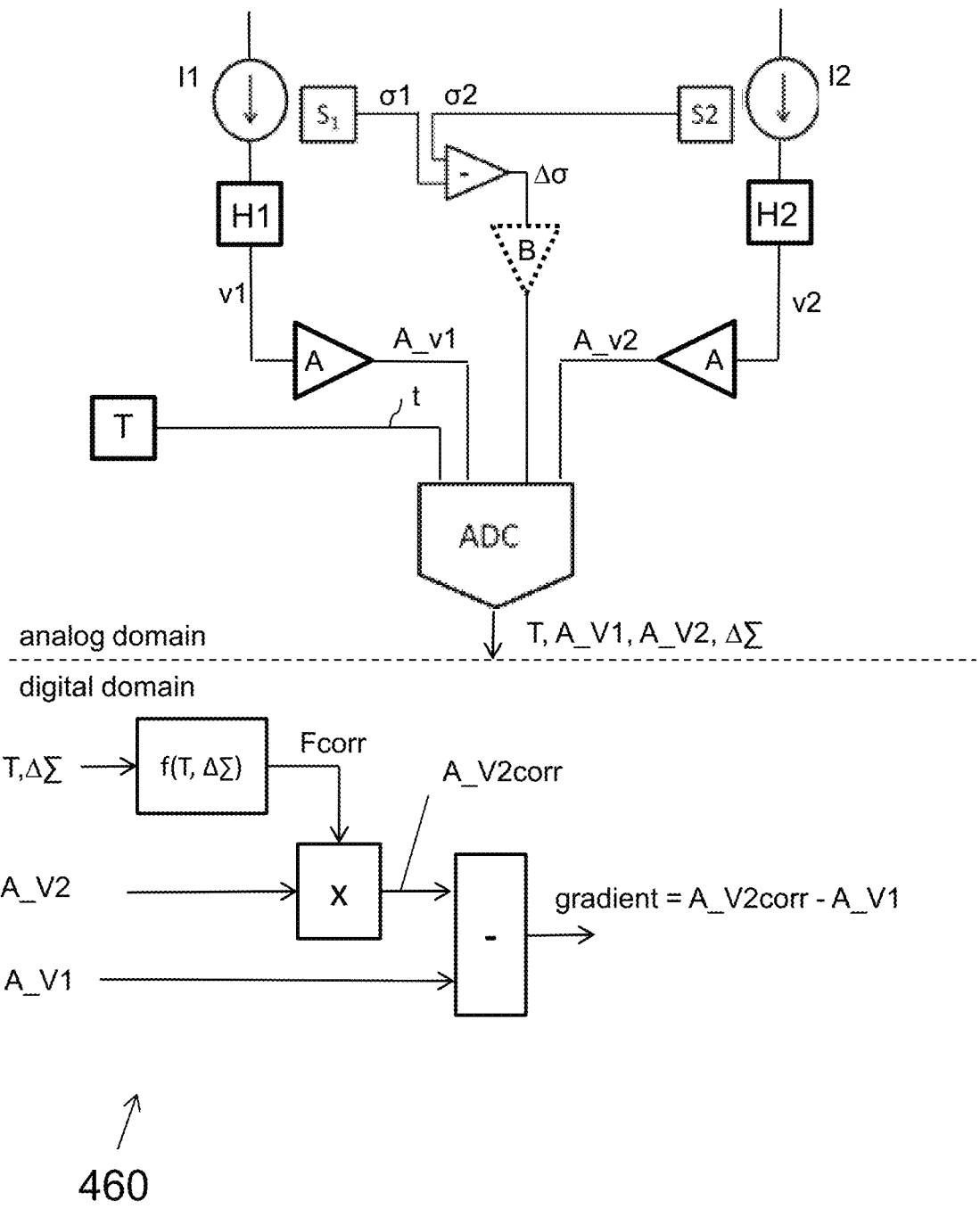
Figure 5A:
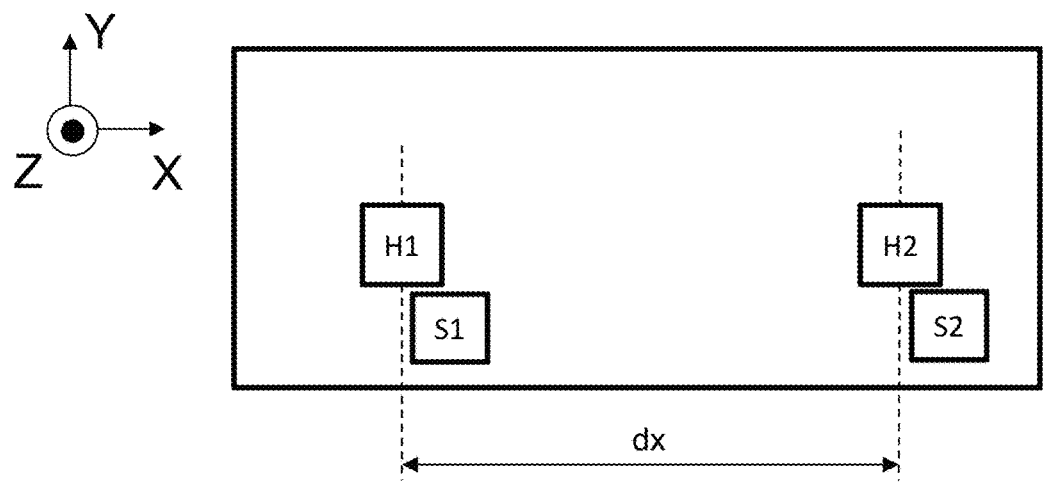
FIG. 5(a) shows a variant of the sensor arrangement of FIG. 4(a) without a temperature sensor, according to another embodiment of the present invention.
Figure 5B:
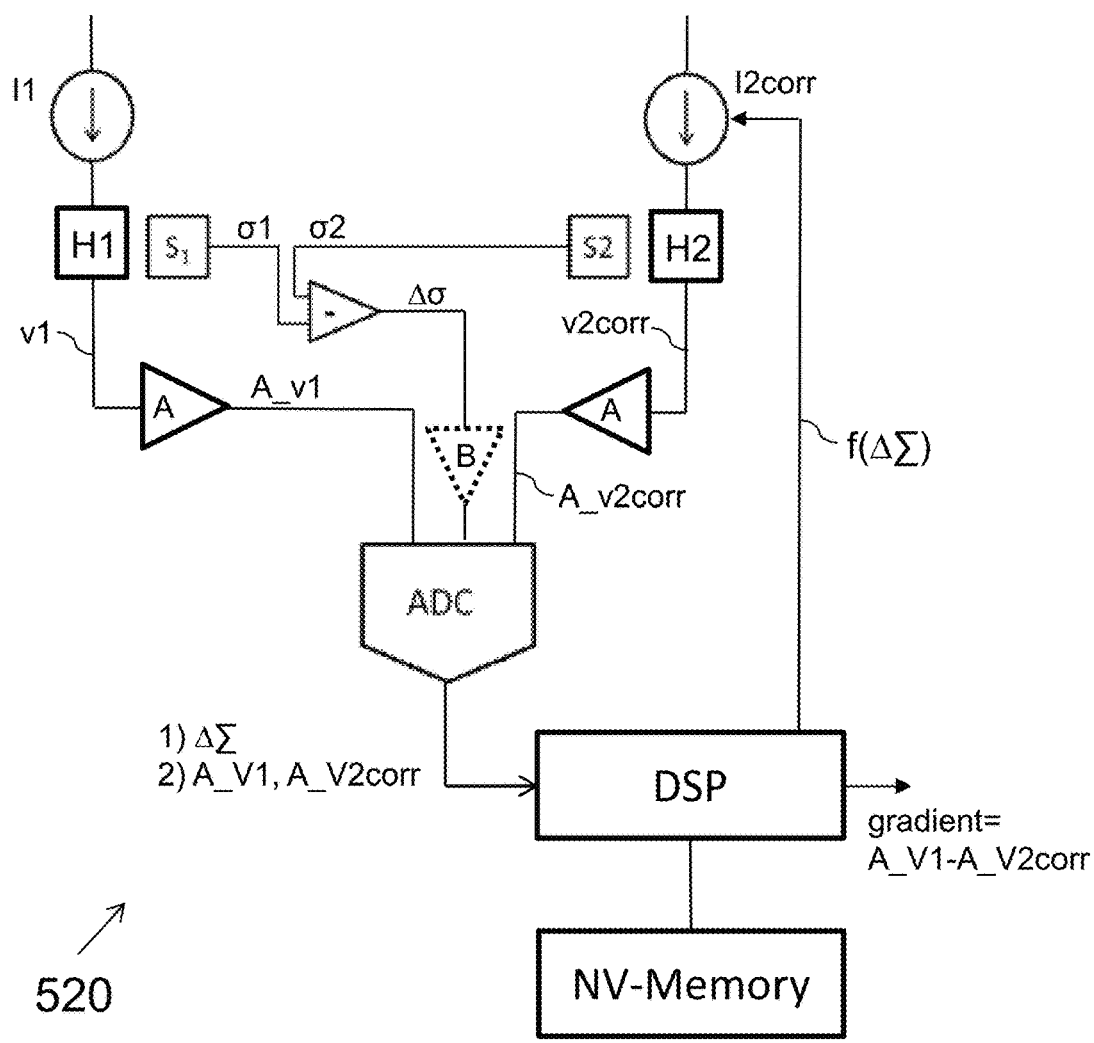
FIG. 5(b) to FIG. 5(f) show variants of the circuit of FIG. 4(b) to FIG. 4(f) without a temperature sensor. These circuits can also be considered as variants of FIG. 3(b) to FIG. 3(f) with a differential stress sensor, according to other embodiments of the present invention.
Figure 5C:
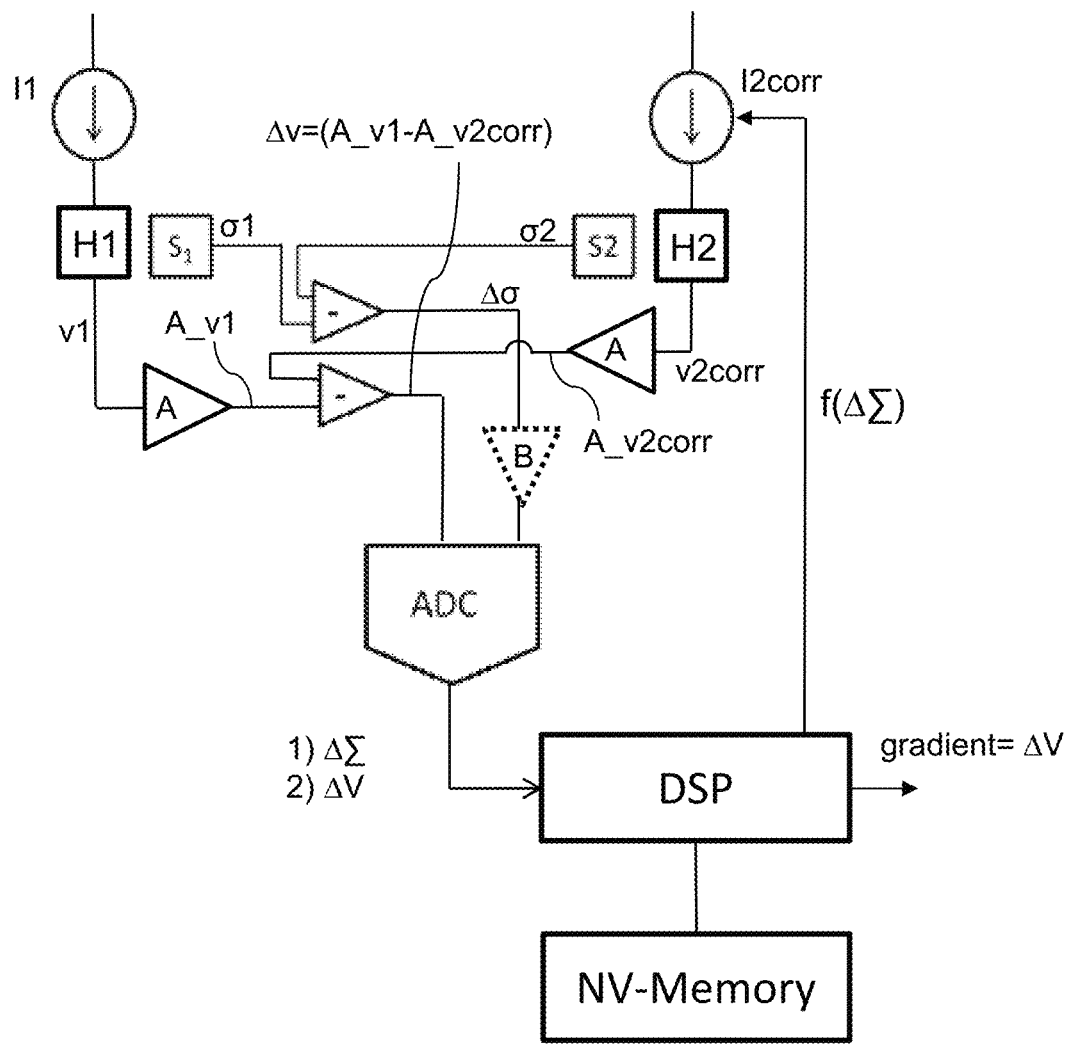
Figure 5D:
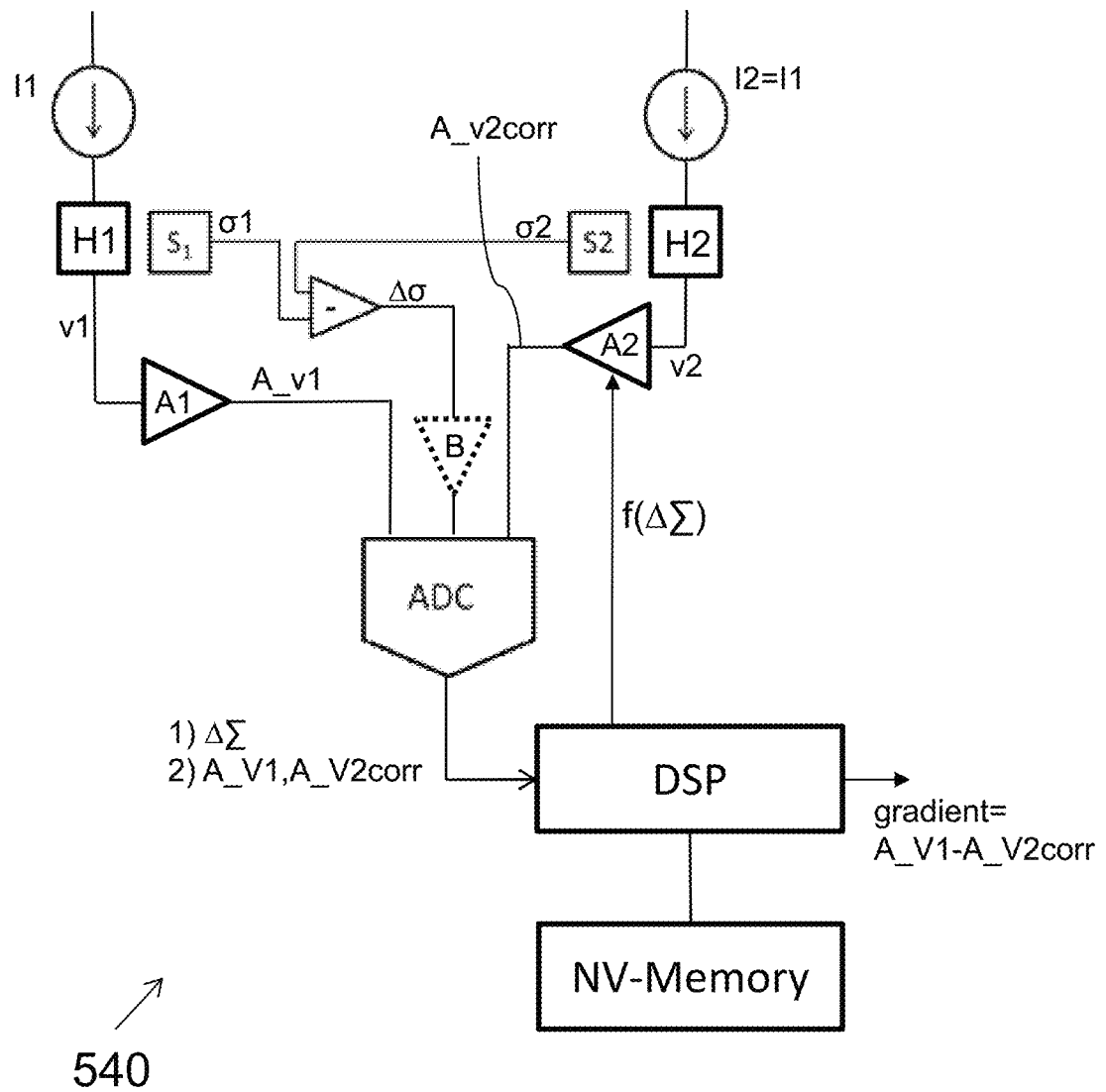
Figure 5E:
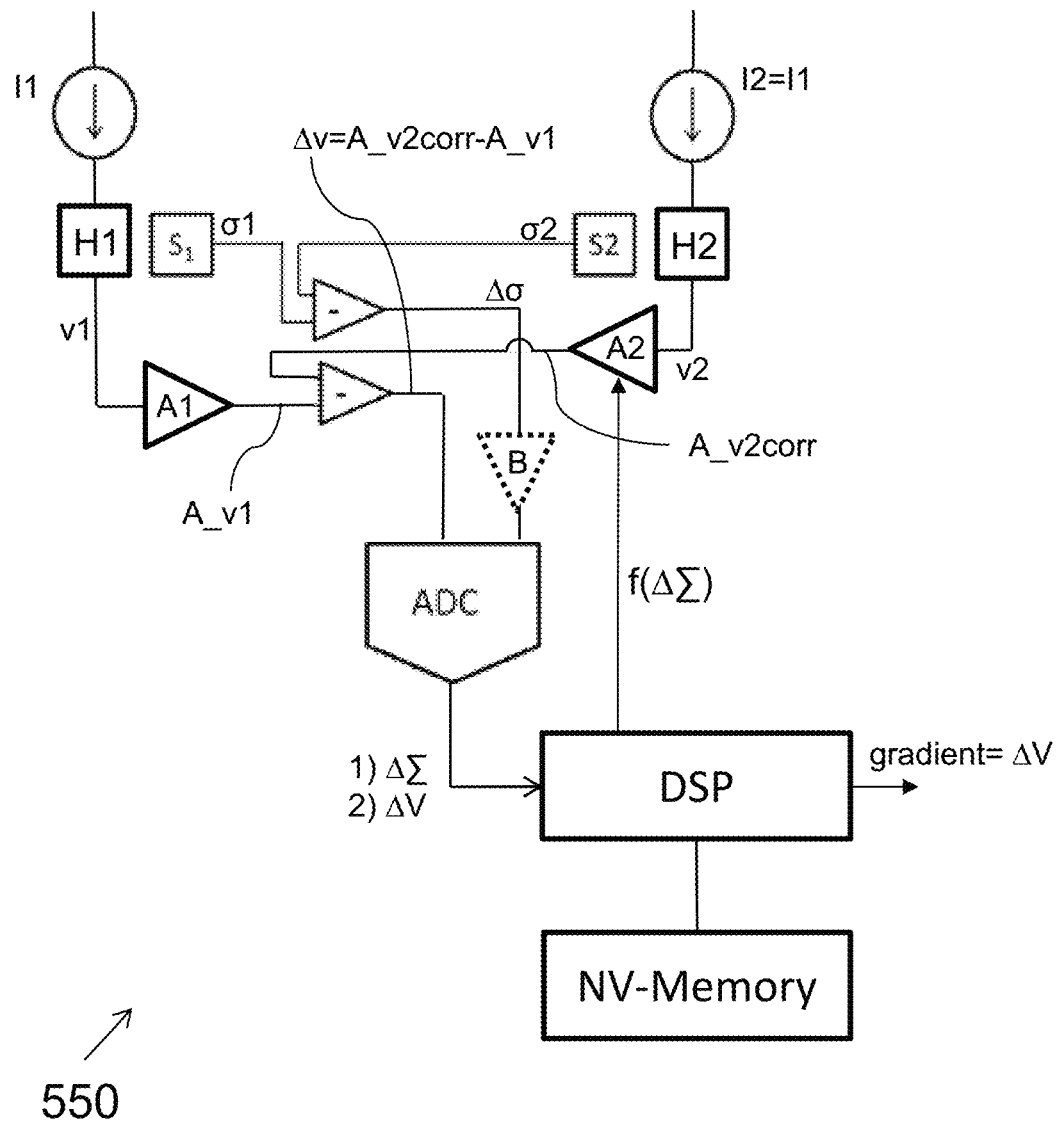
Figure 5F:
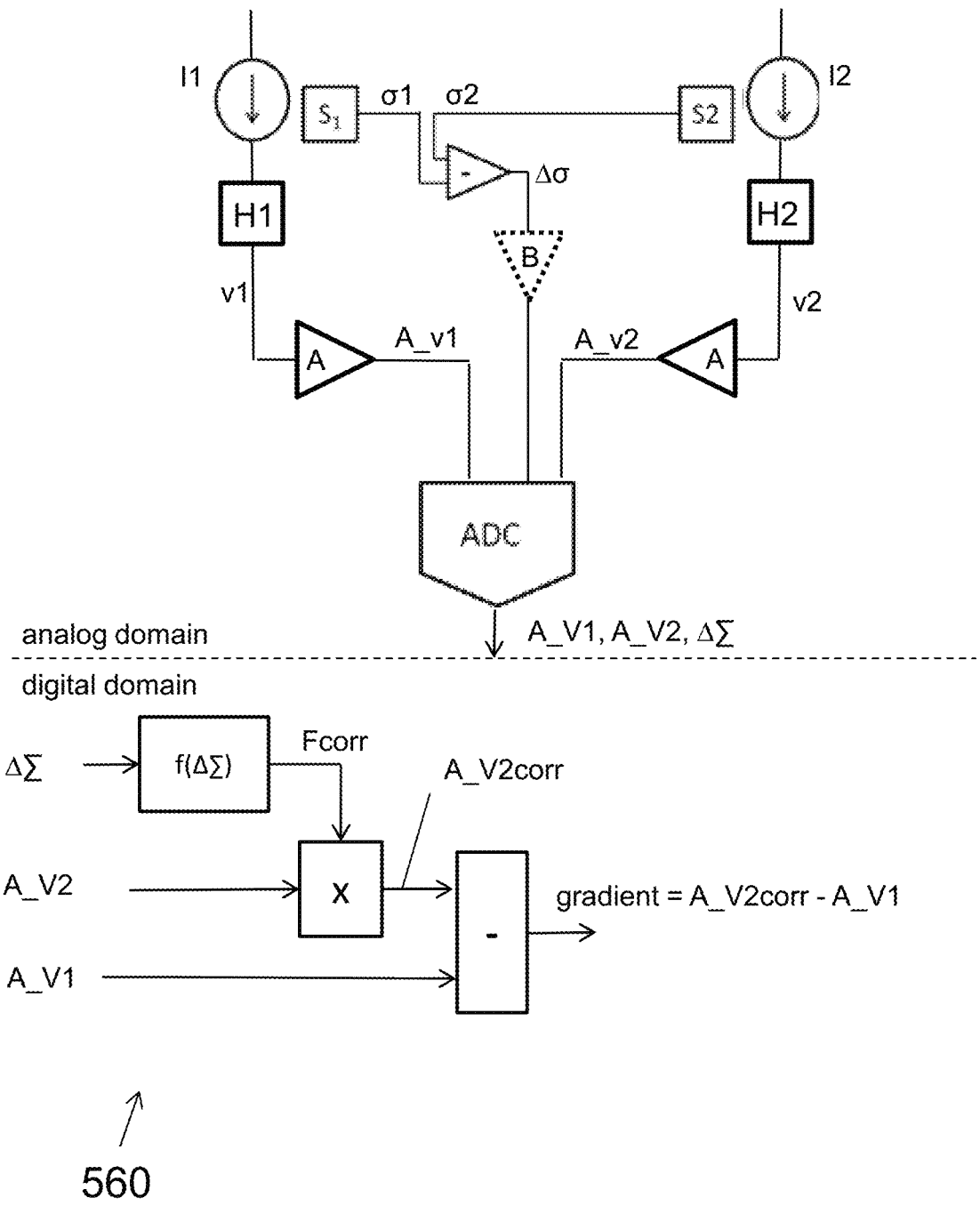
Figure 6A:
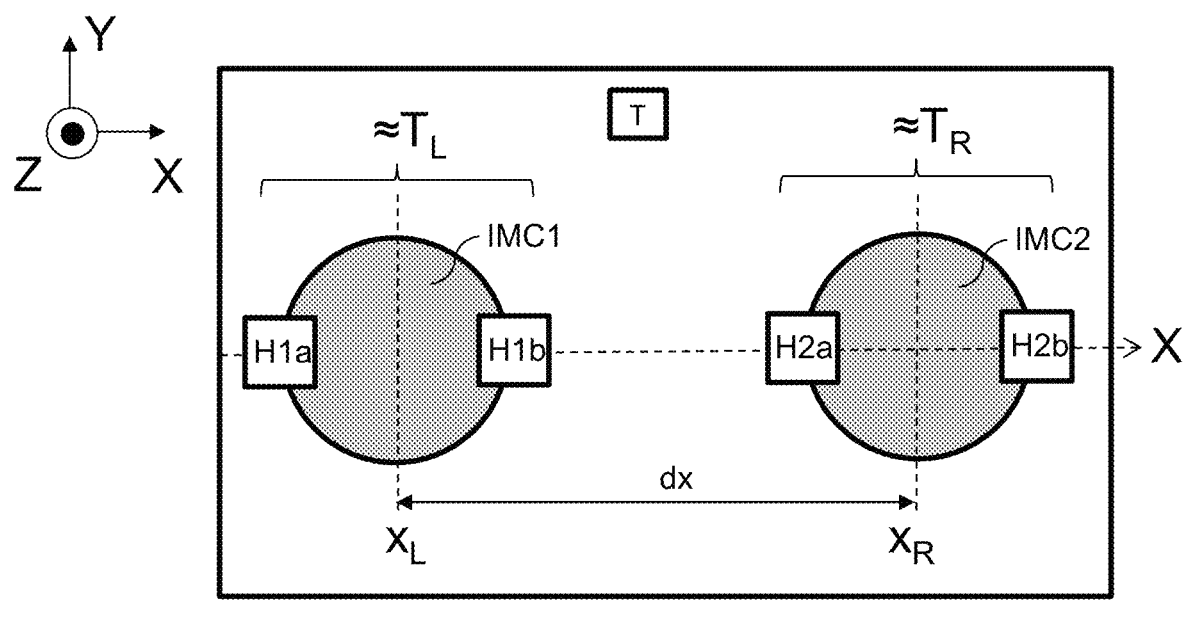
FIG. 6(a) shows a sensor arrangement having two magnetic sensors, each magnetic sensor comprising two horizontal Hall elements arranged on opposite sides of an integrated magnetic concentrator (IMC), according to another embodiment of the present invention.
Figure 6B:
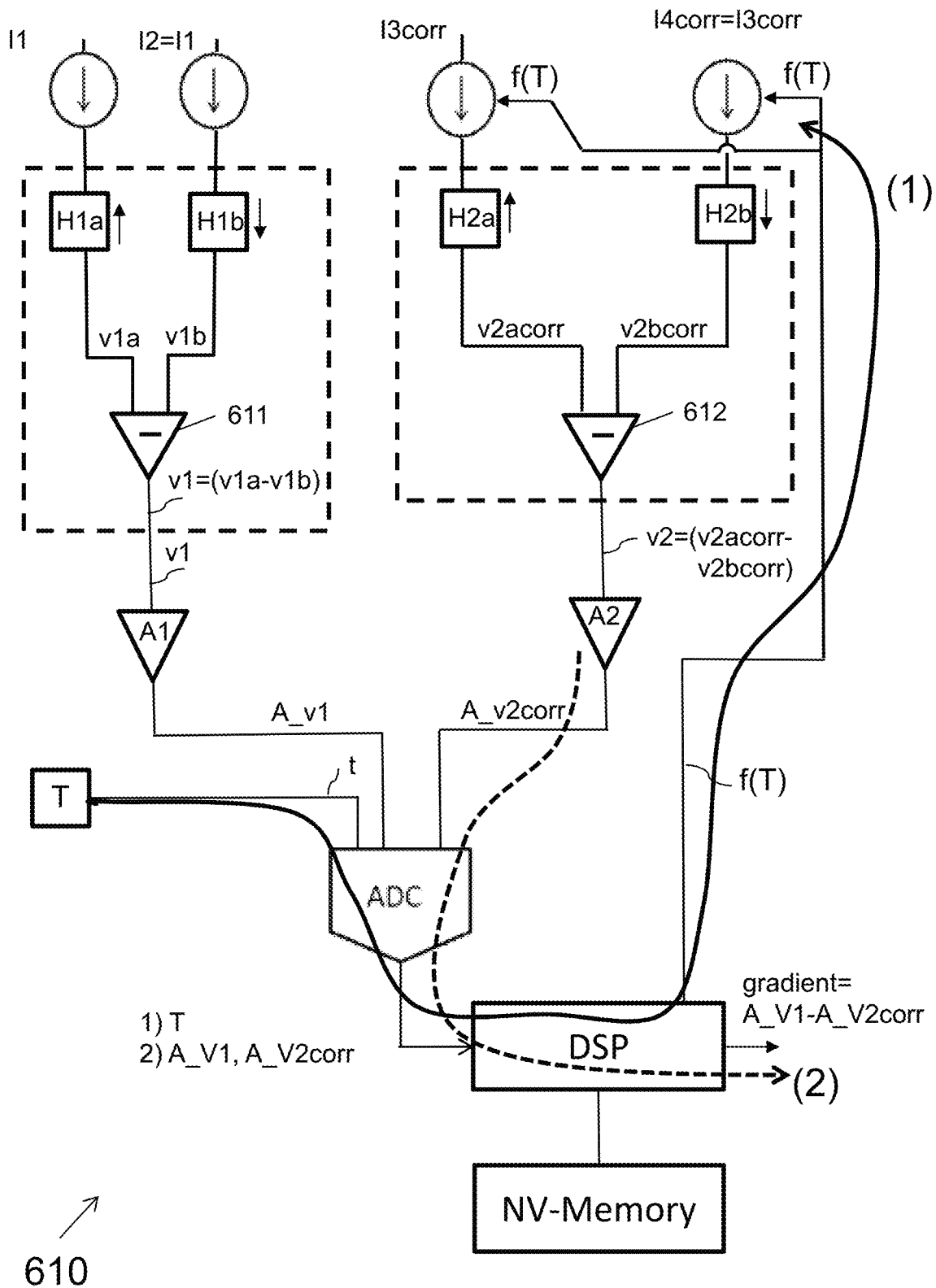
FIG. 6(b) shows a variant of the circuit of FIG. 3(b), according to an embodiment of the present invention, also using a temperature sensor and an adjustable current source, and digital subtraction.
Figure 6C:
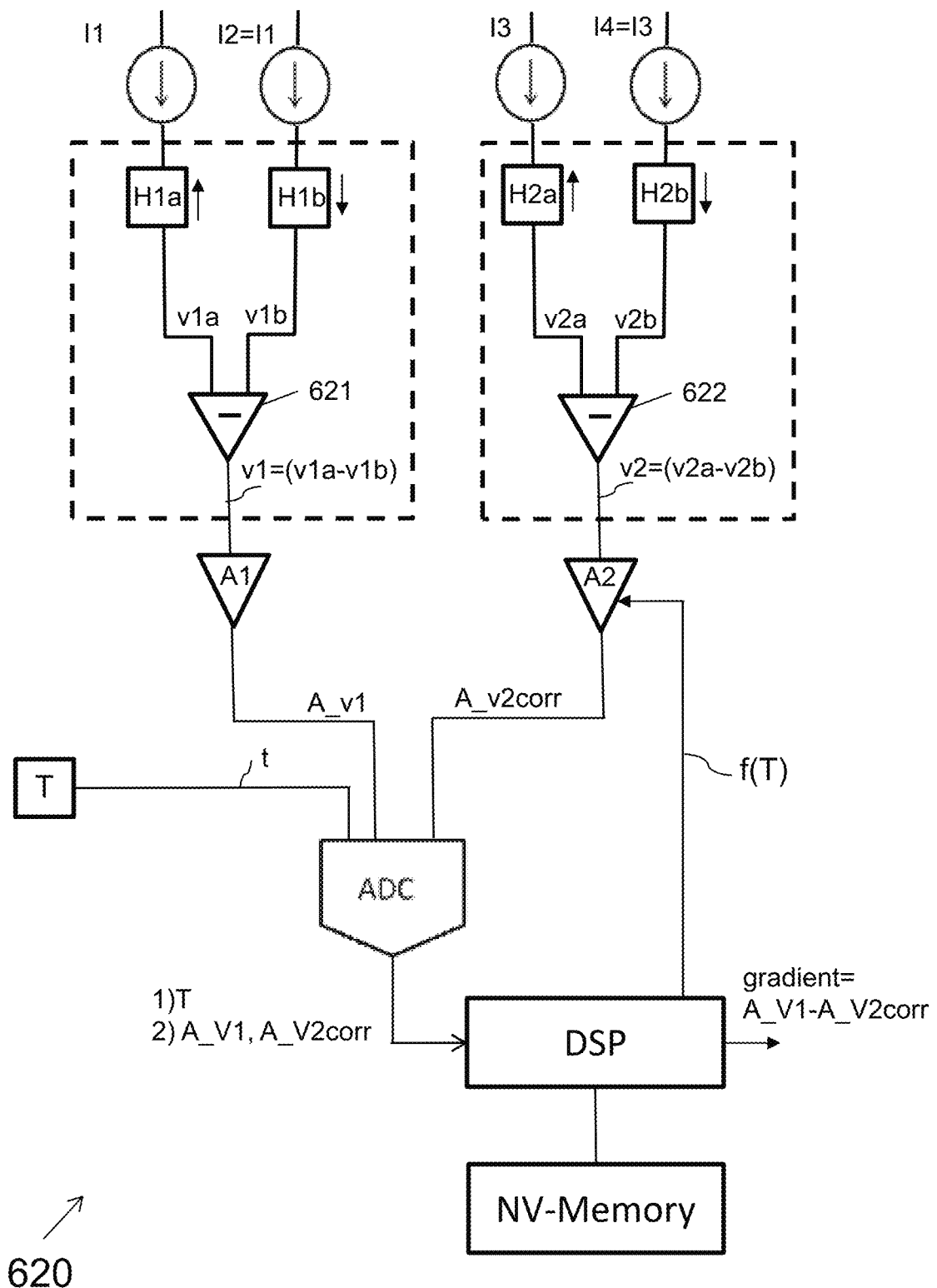
FIG. 6(c) shows a variant of the circuit of FIG. 3(c), according to an embodiment of the present invention, also using a temperature sensor and an adjustable amplifier gain, and digital subtraction.
Figure 7A:
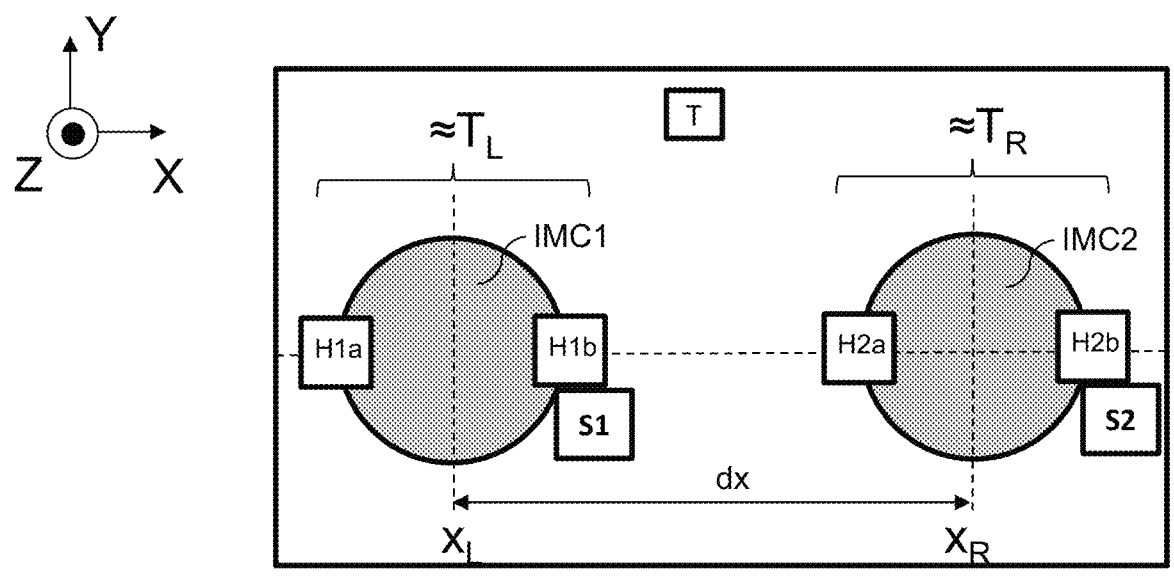
FIG. 7(a) shows a variant of the sensor arrangement of FIG. 6(a) with a differential stress sensor, according to an embodiment of the present invention.
Figure 7B:
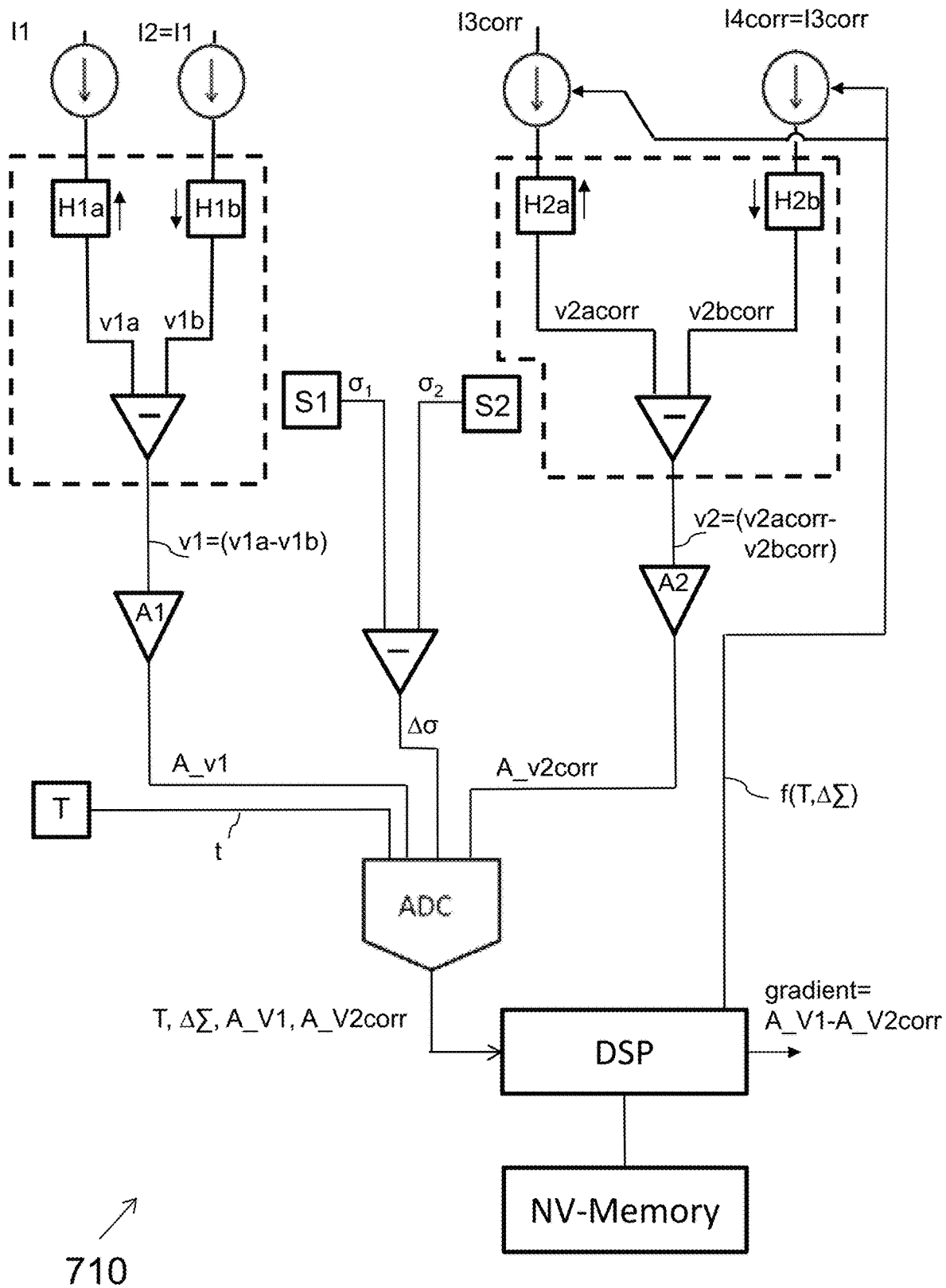
FIG. 7(b) and FIG. 7(c) show variants of the circuits of FIG. 6(b) and FIG. 6(c), furthermore using the differential stress signal, according to embodiments of the present invention.
Figure 7C:
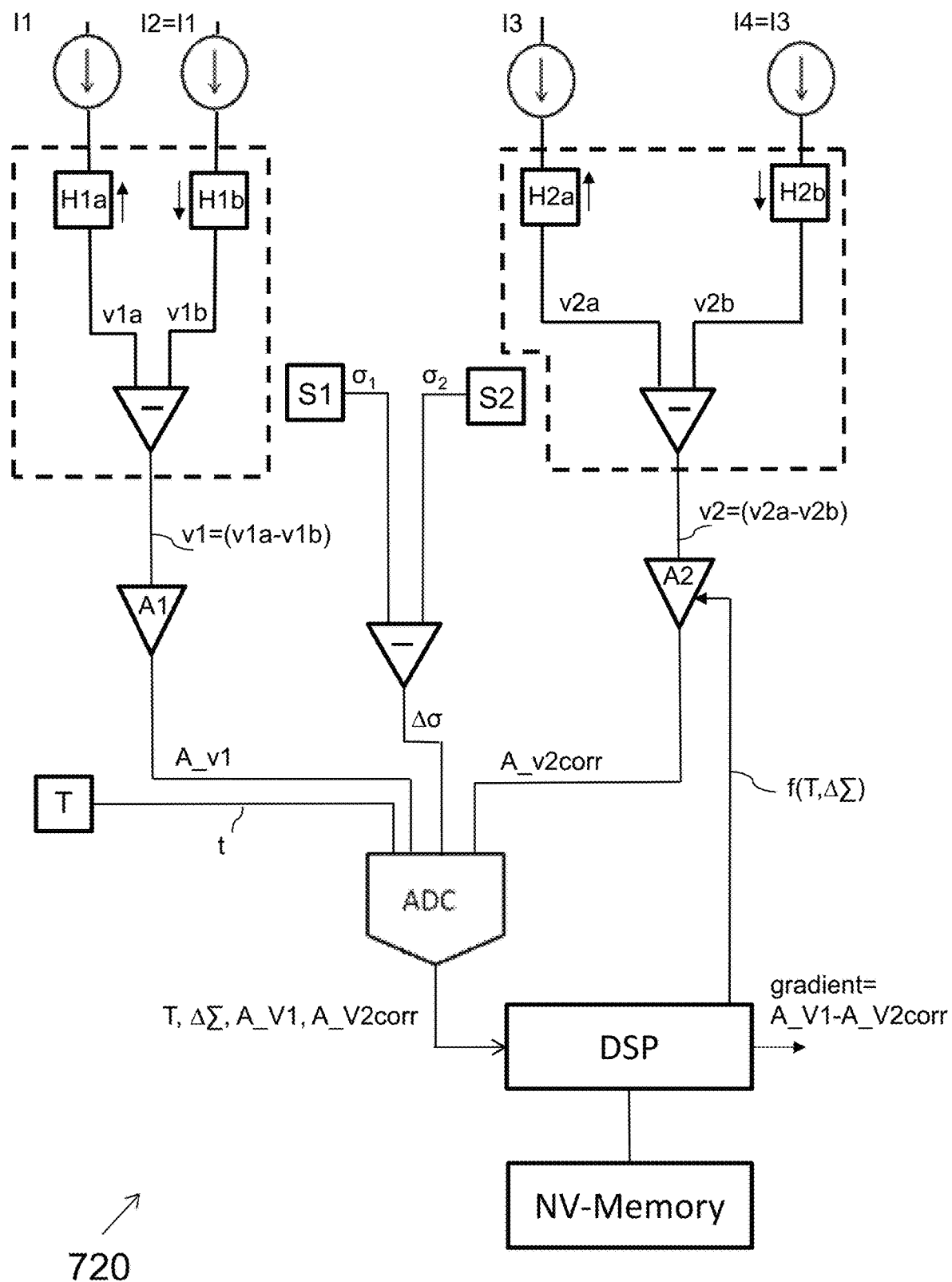
Figure 8A:
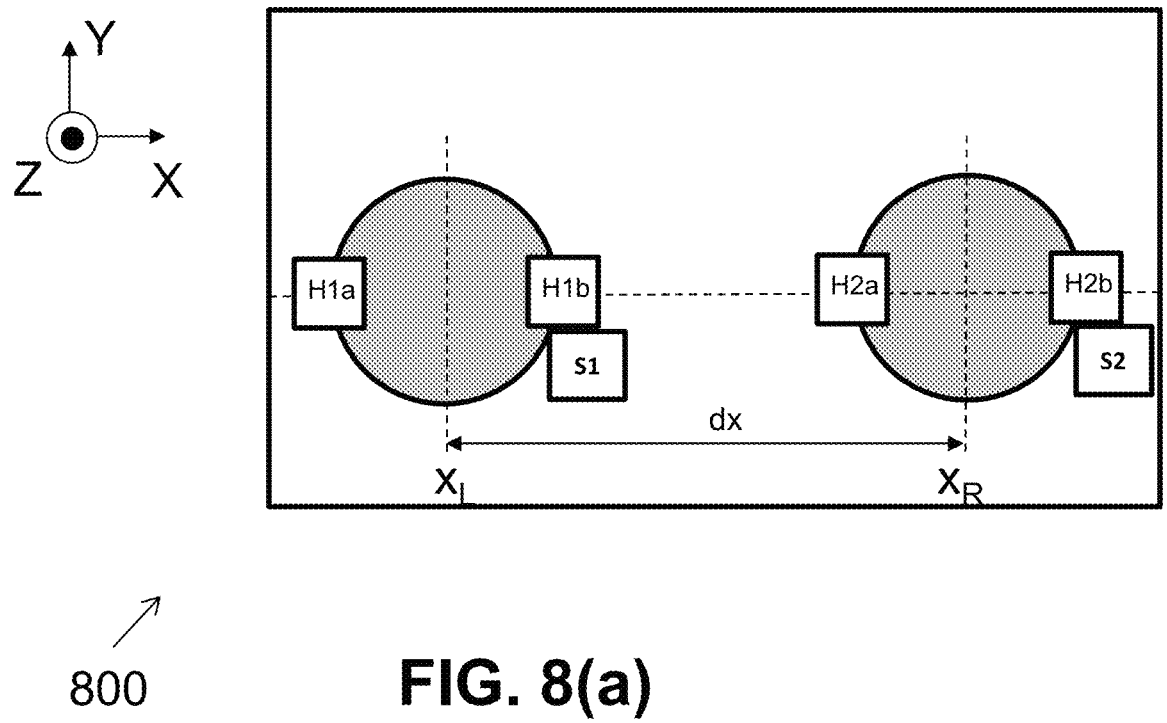
FIG. 8(a) shows a variant of the sensor arrangement of FIG. 7(a) without the temperature sensor, according to an embodiment of the present invention.
Figure 8B:
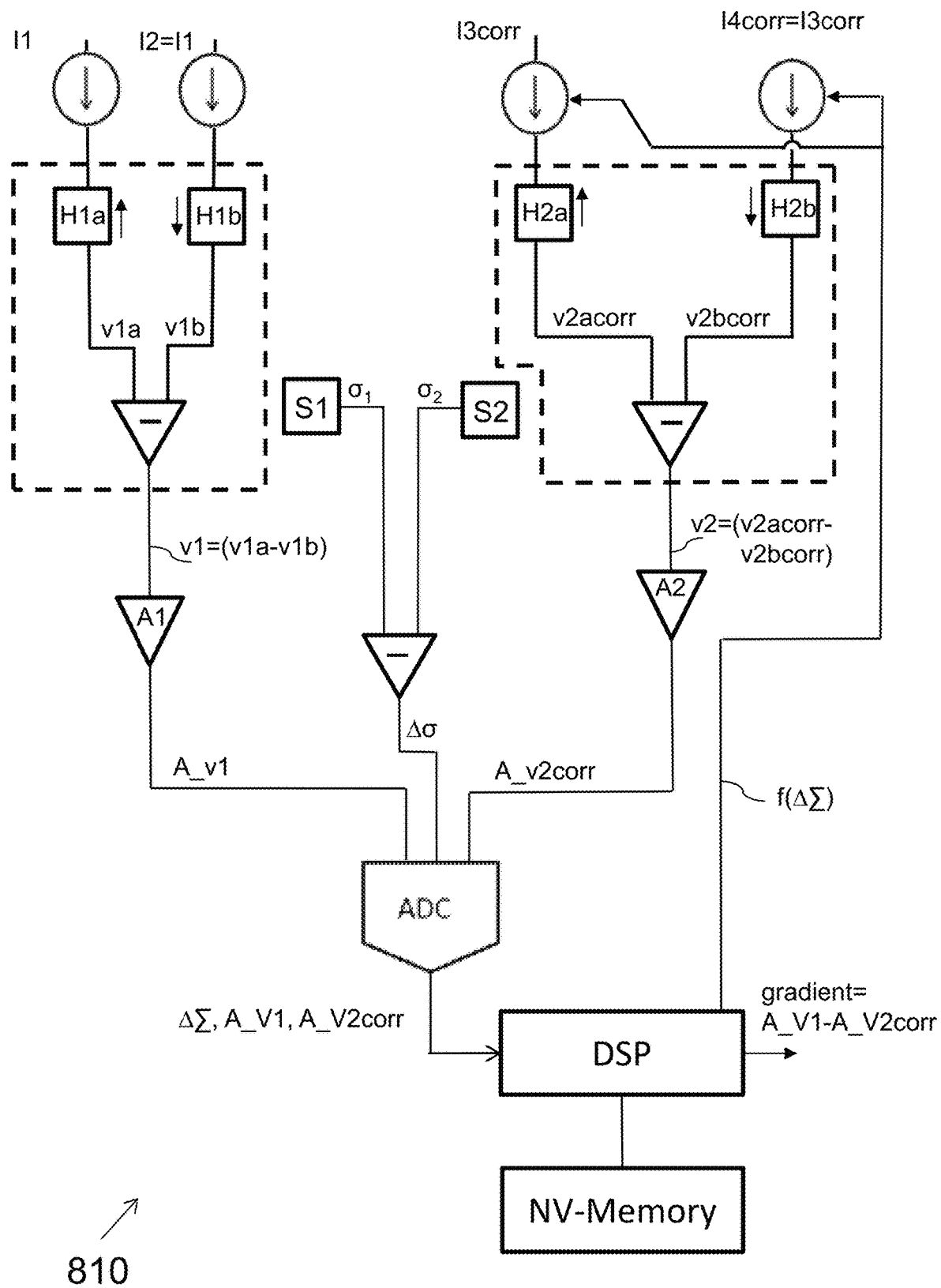
FIG. 8(b) and FIG. 8(c) show variants of the circuits of FIG. 7(b) and FIG. 7(c) without the temperature sensor, according to embodiments of the present invention.
Figure 8C:
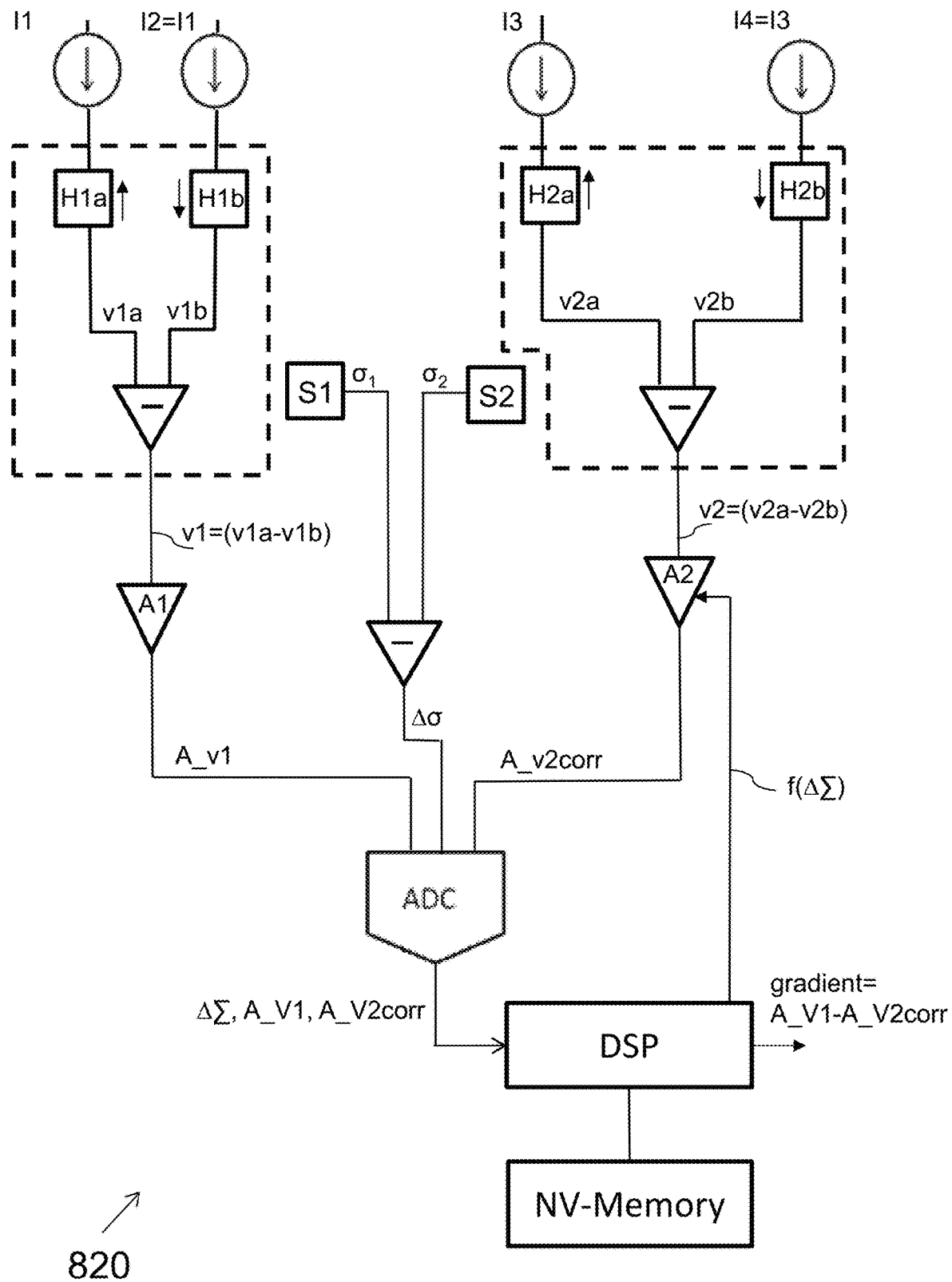

In the present invention, basically three solutions are proposed:
i) solutions where a single temperature T is measured, but no mechanical stress is measured, and where the second biasing source and/or the second signal path is adjusted as a function f(T) of the measured temperature (see e.g. FIG. 3(a) to FIG. 3(g), and see e.g. FIG. 6(a) to FIG. 6(c) for a sensor structure referred to herein as "dual disk structure");
ii) solutions where a differential stress is measured, but no temperature, and where the second biasing source and/or the second signal path is adjusted as a function f(ΔΣ) of the measured stress difference (see e.g. FIG. 5(a) to FIG. 5(f) for a sensor structure with two horizontal Hall elements, and see e.g. FIG. 8(a) to FIG. 8(c) for a sensor structure referred to herein as "dual disk structure");
iii) solutions where a single temperature T is measured, and also a differential stress is measured, and where the second biasing source and/or the second signal path is adjusted as a function f(T, ΔΣ) of both the temperature and the measured stress difference (see e.g. FIG. 4(a) to FIG. 4(f), and see e.g. FIG. 7(a) to FIG. 7(c) for a sensor structure referred to herein as "dual disk structure"), but of course, the present invention is not limited to these particular sensor structures, and the proposed principles can also be applied to other sensor structures, for example sensor structures with two vertical Hall elements oriented in the same direction, or sensor structures having magneto resistive elements, etc.

It is noted that this problem also occurs when the magnetic sensors are not biased with a current source, but are biased for example using a "voltage source" (having a relatively low output impedance, e.g. smaller than 10 Ohm, or smaller than 1 Ohm).

In what follows, the present invention will be explained referring to current sources as biasing sources, for easy of explanation, but the present invention is not limited thereto. Likewise, even though the drawings are shown with a DSP as the digital processing circuit, the present invention is not limited thereto, and other digital processing circuits may also be used, e.g. programmable digital logic, a microcontroller, etc.

Figure 3A:
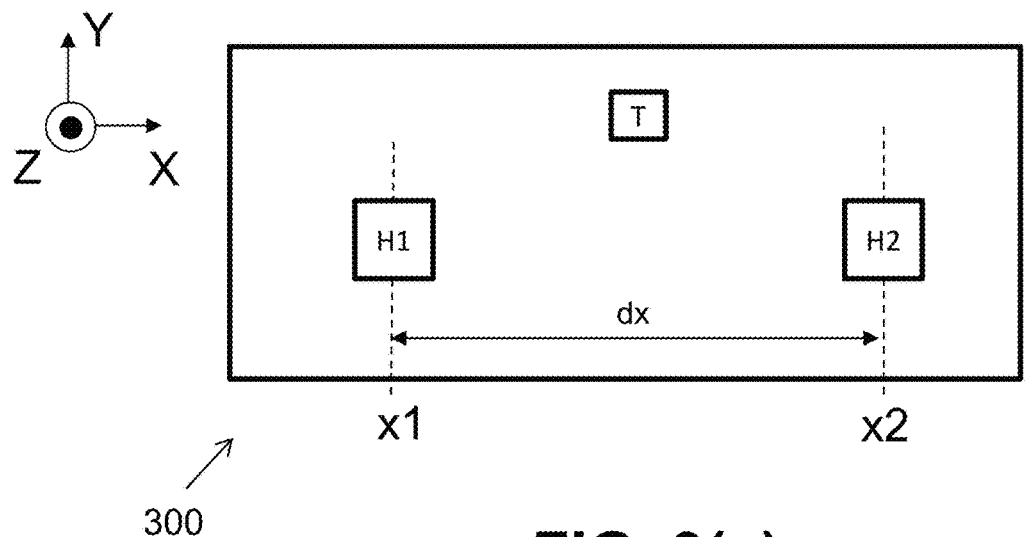
FIG. 3(a) shows a variant of the sensor arrangement of FIG. 1(a) with a temperature sensor.

FIG. 3(a) shows a sensor arrangement 300 similar to FIG. 1(a), with a temperature sensor, more in particular, with a single temperature sensor.

The main purpose of this figure is to illustrate that the two magnetic sensors (in this example represented by a single horizontal Hall element H1, H2) are spaced apart along the X-axis by a predefined distance dx, but the biasing circuit and readout circuit are not shown in this figure. As explained above, this sensor structure can be used to measure Bz1 at X1, Bz2 at X2, and to calculate a gradient dBz/dx based on Bz1 and Bz2. As explained above, in practice, the sensitivity of the first magnetic sensor is not always exactly the same as the sensitivity of the second magnetic sensor, even when exactly the same layout symbol is used, and even when they are biased with exactly the same current (e.g. generated by a current mirror).

Figure 3B:
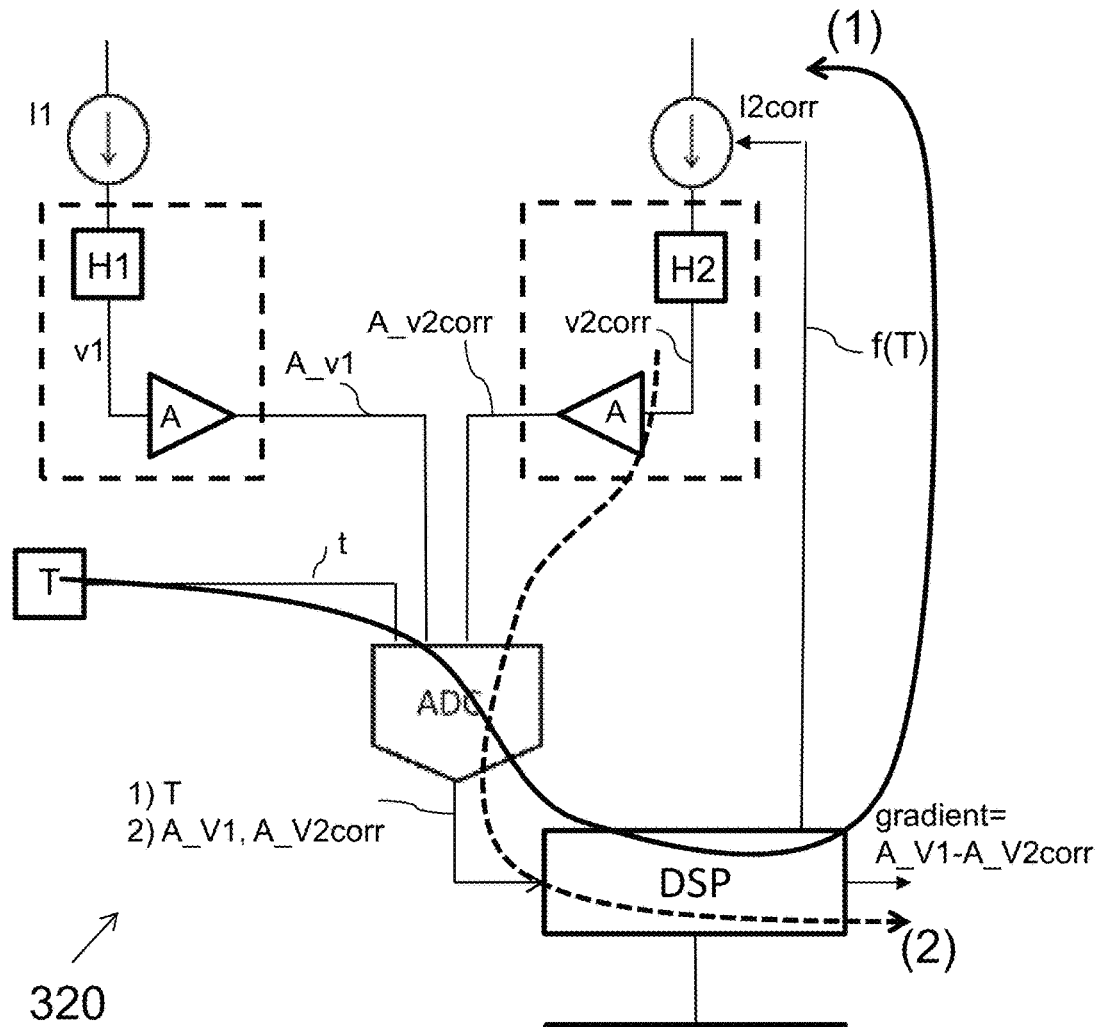
FIG. 3(b) shows a variant of the circuit of FIG. 1(b), according to an embodiment of the present invention, using a temperature sensor and an adjustable current source, and digital subtraction (or subtraction in the digital domain).

FIG. 3(b) shows a magnetic sensor device 320 comprising:
  a semiconductor substrate (shown in FIG. 3(a));
  a first magnetic sensor H1 located at a first sensor location X1 (see FIG. 3(a)) on said semiconductor substrate, and arranged for providing a first sensor signal (e.g. voltage signal) v1 indicative of a first magnetic field component Bz1 oriented in a first direction Z perpendicular to the substrate;
  a second magnetic sensor H2 located at a second location X2 (see FIG. 3(a)) on said semiconductor substrate, spaced from the first sensor location X1, and arranged for providing a second sensor signal (e.g. voltage signal) v2corr indicative of a second magnetic field component Bz2 oriented in said first direction Z. It is noted that this signal is labelled "v2corr" because the current I2 is adjusted;
  a temperature sensor, located at a third position on said semiconductor substrate, and configured for measuring a temperature (T) of the substrate and for providing a temperature signal. The third location may be near to first sensor location, or near to second sensor location, or substantially halfway between the first sensor location and the second sensor location, or may be any other location on the substrate;
  a first current source arranged for biasing the first magnetic sensor H1 with a first predefined current I1. The first current is preferably a predefined current generated by a temperature-compensated current generator circuit, known per se in the art;
  a second current source arranged for biasing the second magnetic sensor H2 using a second current signal I2. The second current source is an adjustable current source, having a control port or control gate, which is controlled by the processing unit, e.g. DSP, as a function f(T) of the measured temperature;
  a first amplifier arranged for amplifying the first magnetic sensor signal v1 with a first predefined gain A, and providing a first amplified sensor signal A_v1.
  a second amplifier arranged for amplifying the second magnetic sensor signal v2corr with a second predefined gain A, and for providing a second amplified sensor signal A_v2corr. The second amplifier gain may be equal to the first amplifier gain, but that is not absolutely required.
  at least one analog-to-digital converter ADC for converting the first amplified signal A_v1 and the second amplified signal A_v2corr, e.g. in a time-multiplexed manner. This is represented schematically by an ADC having multiple inputs, but it would also be possible to use an analogue multiplexer in front of the ADC. Such details are omitted from the drawings for illustrative purposes;

a digital processing circuit connected downstream of the analog-to-digital convertor ADC, wherein the magnetic sensor device is configured for adjusting the second biasing signal I2 based on a predefined function f(T) of the measured temperature, before determining a difference between the first digital value A_V1 and the second digital value A_V2corr.

Or stated in other words, the measurement of the gradient can for example be performed as follows:

a) first the temperature signal t is measured, and digitized into value T, b) the digital processing circuit, e.g. digital controller or DSP receives the digital value T, and adjusts the second current I2 using a predefined function of the value T, c) then the first and second magnetic sensor signal v1, v2corr are measured, amplified and digitised, d) then the digital processing circuit, e.g. digital controller or DSP calculates the gradient by subtracting the first digital value A_V1 and the second digital value A_V2corr.

The predefined function f(T) may be chosen such that, during operation, a product of the magnetic sensitivity S1 of the first magnetic sensor H1 and a first overall gain OG1 of a first signal path from an output of the first magnetic sensor H1 to said determining of a difference (e.g. a subtraction performed in the digital processing circuit) is substantially equal to a product of the magnetic sensitivity S2 of the second magnetic sensor H2 and a second overall gain OG2 of a second signal path from an output of the second magnetic sensor H2 to said determining of a difference (which difference may be determined in the analog or digital domain). Thus, f(T) is chosen such that S1*OG1=S2*OG2.

The reader will understand that the first magnetic sensor signal v1 may also be measured and amplified and digitised before the second current I2 is adjusted, because the first sensor value v1 is not influenced by the second current I2, but in order for this embodiment to work, it is essential that the second current I2 is adjusted before the second magnetic sensor signal v2corr is amplified and digitised and sent to the DSP.

Or stated in simple terms, for the specific circuit shown in FIG. 3(b), and assuming that the processing circuit calculates the gradient by simply subtracting the digital values A_V1 and A_V2corr without further multiplications in the digital domain, and assuming that the gain of both amplifiers is equal to A, the function f(T) is preferably chosen such that (s1.I1).A=(s2.I2).A for various values of the temperature T when expressed in terms of the "current related magnetic sensitivity", or in general, is preferably chosen such that S1.A1.D1=S2.A2.D2 when expressed in terms of the "magnetic sensitivity", wherein A1, A2 is the amplification of the first, second signal path in the analog domain, and D1, D2 is the amplification of the first, second signal path in the digital domain.

As an example, assuming that the second current source I2 is controlled by applying a gate voltage of a MOS transistor, and that the digital processing circuit contains a DSP (digital signal processor) with a DAC (digital-to-analog convertor), and that the gate voltage is generated by the DAC, then the function f(T) can for example be found by performing a calibration test at various temperatures. For each temperature, a constant magnetic field is applied, the value A_V1 and A_V2 are repeatedly measured, and the gate voltage for which the value A_V2 is substantially equal to the value A_V1 (within a given tolerance margin, e.g. less than 1%, or defined by the least-significant-bit LSB of the DAC) is found, and the respective gate voltage values for each temperature is added to a list, which list is stored in a non-volatile memory inside the DSP or connected to the DSP. During normal operation, the DSP can simply measure the temperature, and use the temperature as an index to find the corresponding gate voltage to be applied to the second current source. This example illustrates that correcting for the sensitivity mismatch during operation using the correction function (e.g. in the form of a list or table) can be very simple, and does not require two temperature sensors, or solving a set of mathematical equations.

The DAC may be part of a control circuit configured for adjusting the current source and/or the amplifier gain within a predefined range, e.g. around a predefined working point. Preferably the DAC has a resolution sufficient for allowing to adjust the current and/or the amplifier gain in steps smaller than 1% of the predefined working point, preferably smaller than 0.5%, or smaller than 0.4%, or smaller than 0.3%, or smaller than 0.2%. In practice, the DAC may have a resolution of at least 2 bits, or at least 4 bits, or at least 6 bits.

In summary, FIG. 3(b) shows a magnetic sensor device 320 for measuring a magnetic field gradient, by subtracting two values in the digital domain, after adjusting the second biasing signal I2 as a function of temperature.

Many variants of the circuit are possible, for example:

In a variant, the magnetic sensors are not horizontal Hall elements, but vertical Hall elements oriented in the same direction.

In a variant, there is not just one ADC, but there are multiple ADCs.

In a variant, the control signal for the second current source is not generated by a DAC, but by a PWM block followed by a low-pass filter.

In a variant, the biasing source is not an adjustable current source, but an adjustable voltage source.

In a variant, the digital processing circuit does not contain the digital signal processor (DSP), but a micro-controller.

In a variant, the temperature sensor does not provide an analogue signal "t" which is digitised by the ADC but provides a digital signal "T" directly to the processing circuit.

In the examples above, the correction function f(T) may be stored as a list of (T, V) values, where T is the temperature, and V is the voltage to be generated by a DAC and applied to the MOS transistor. But of course, the list can also be approximated by a piecewise linear combination of one or more line segments, or by a mathematical expression, for example by a first order or second order or third order polynomial of the variable T. One such example is shown in FIG. 3(g), not only showing a typical correction function f(T), but also showing the coefficients of an exemplary polynomial, obtained by measuring more than 500 samples. The coefficients may be stored in a non-volatile memory, and during normal use, the polynomial expression may be evaluated with the measured temperature value.

Figure 3C:
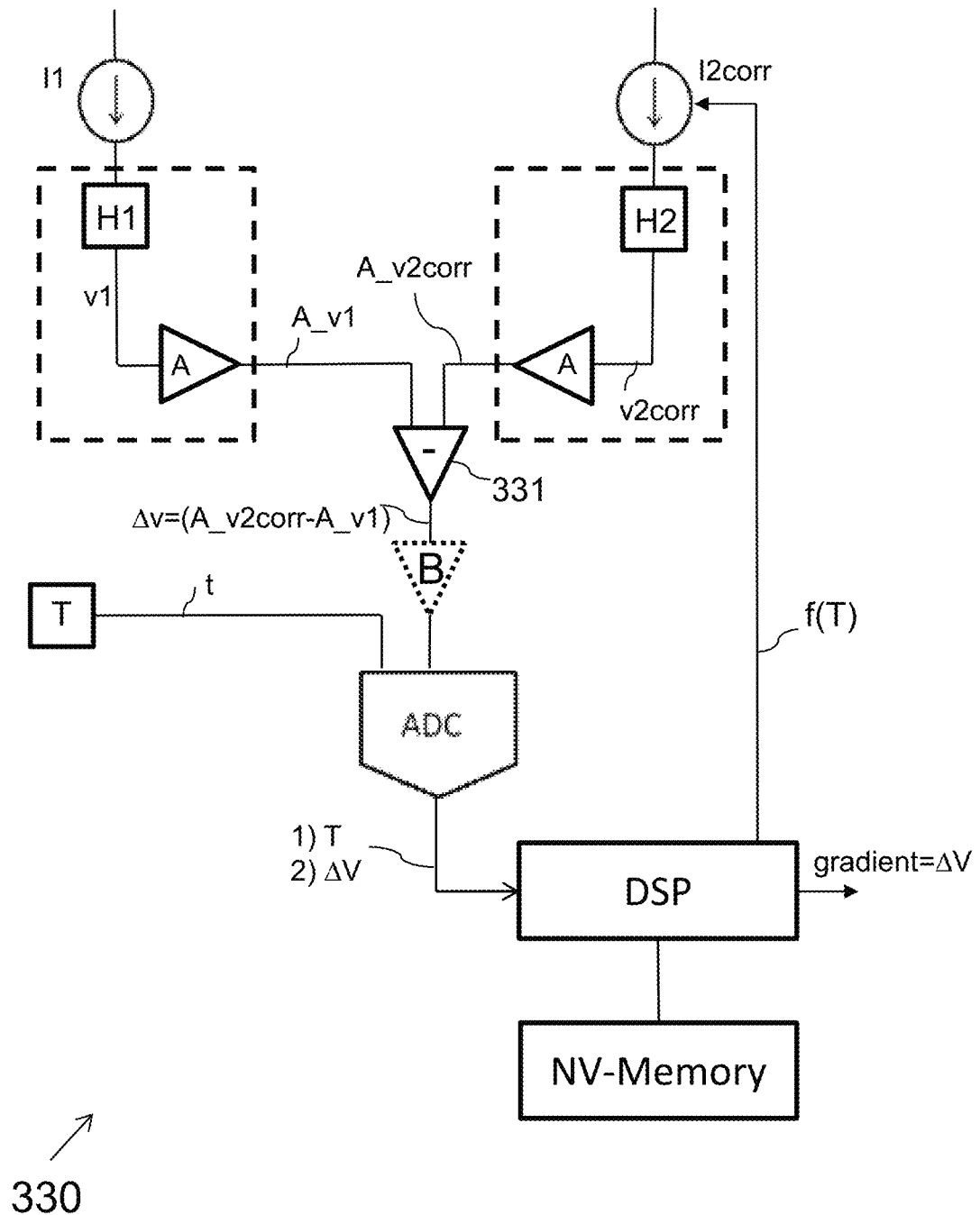
FIG. 3(c) shows a variant of the circuit of FIG. 1(b), according to an embodiment of the present invention, using a temperature sensor and an adjustable current source, and analogue subtraction (or subtraction in the analog domain).

FIG. 3(c) shows a variant of the circuit of FIG. 3(b), according to another embodiment of the present invention, using a single temperature sensor and an adjustable current source, and analogue subtraction. The main difference between the circuit of FIG. 3(c) and FIG. 3(b) is that the subtraction of the first and second magnetic sensor signal v1, v2corr is not performed in the digital domain (e.g. in software in the DSP), but is performed in the analogue domain (in block 331).

In the circuit of FIG. 3(c) the subtraction circuit 331 is configured for determining a difference Δv between the first amplified signal A_v1 and the second amplified signal A_v2corr.

The ADC is configured for digitizing the temperature T, and the difference signal Δv, for example in a time multiplexed manner.

Similar as above, the DSP is configured for obtaining the digital temperature value T and for adjusting the second current source I2 using a predefined correction function f(T). Unlike above, the DSP receives the digitized difference signal ΔV, indicative of the gradient. This value may optionally be multiplied by a predefined constant.

Or stated in other words, the measurement of the gradient using the circuit of FIG. 3(c) can for example be performed as follows:

a) first the temperature signal t is measured, and digitized to yield the value T, b) the DSP receives the digital temperature value T, and adjusts the second current I2 using a predefined function of the value T, c) then the first and second magnetic sensor signal v1, v2corr are measured and amplified, and a difference signal Δv is generated in block 331, and is digitised in the ADC, d) the DSP obtains this digitized difference signal ΔV and considers this as the gradient.

In order for this embodiment to work, it is essential that the second current I2 is adjusted before the difference signal Δv is generated (in block 331), and digitized and sent to the DSP.

Many of the advantages described above are also applicable here.

The circuit 330 of FIG. 3(c) offers an additional advantage, by performing the subtraction in the analogue domain before being digitised by the ADC. By doing so the signal to noise ratio (SNR) of the gradient can be greatly improved, because the full range of the ADC can now be used for digitising the difference signal, as opposed to FIG. 3(b) where the full range of the ADC is required to quantise the individual magnetic field components.

The subtraction circuit 331 may optionally be followed by a third amplifier (indicated in dotted line) with amplification factor B, but this is not absolutely required.

The correction function f(T) for this case can for example be obtained as follows: Assuming again that the second current source I2 is controlled by applying a gate voltage of a MOS transistor, and that the DSP contains a DAC, and that the adjustment of the second current source I2 is performed by applying the DAC signal to the gate of the MOS transistor, then the function f(T) can for example be found by performing a calibration test at various temperatures. For each temperature, a constant magnetic field is applied, the DAC voltage is varied, and the resulting value ΔV is measured, and the DAC voltage for which the difference value ΔV is minimal (in absolute value), is considered as the gate voltage to be applied to adjust the second current source in such a way that the total gain (from magnetic field strength [expressed in mT] to digital value in the DSP, is substantially the same for both signal paths. Again, the DAC voltages for the various temperatures may be stored in a list in non-volatile memory, or may be used for curve-fitting in which case the parameters of the curve, e.g. second order polynomial, are stored in said non-volatile memory.

In summary, FIG. 3(c) shows a magnetic sensor device for measuring a magnetic field gradient, by subtracting two values, where the subtraction is performed in the analog domain, and where the second current is adjusted as a function of temperature.

All variants described for FIG. 3(b) can also be applied for FIG. 3(c). For example, the magnetic sensor elements may be vertical Hall elements; there may be multiple ADCs instead of only one; the control signal may be generated by a PWM-generator-block and a Low-Pass-Filter instead of by a DAC; the biasing source may be a biasing voltage; the digital processing circuit may comprise a micro-controller; the temperature sensor may provide a digital temperature signal, the gradient may be further scaled, or combinations hereof.

Figure 3D:
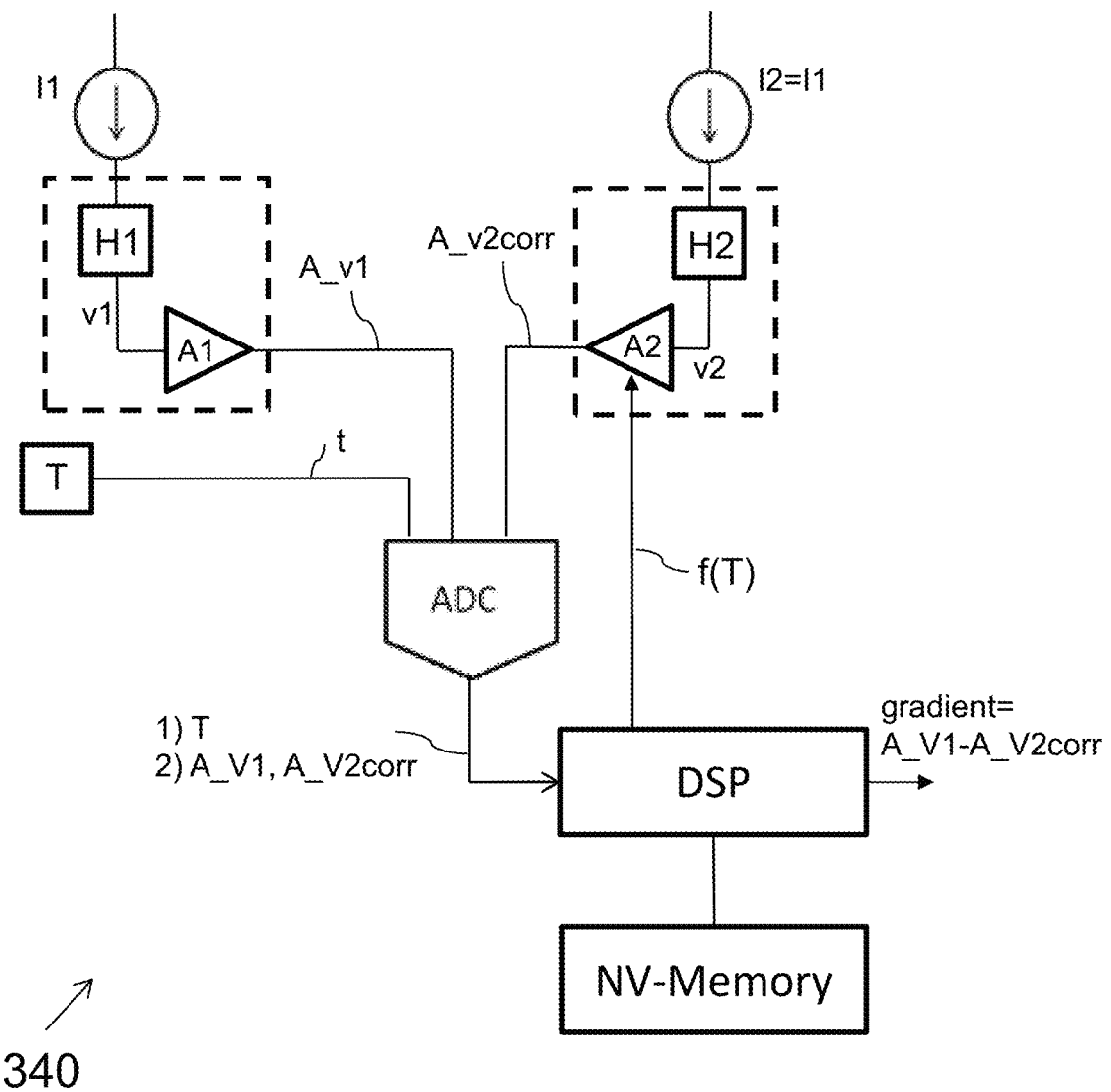
FIG. 3(d) shows a variant of the circuit of FIG. 1(b), according to an embodiment of the present invention, using a temperature sensor and an adjustable amplifier gain, and digital subtraction.

FIG. 3(d) shows a variant of the circuit of FIG. 3(b), according to another embodiment of the present invention, using a single temperature sensor and an adjustable amplifier gain, and digital subtraction. The main differences between the circuit of FIG. 3(d) and FIG. 3(b) is that the second current source is a predefined current source, (e.g. a temperature compensated current source, or a current mirror of the first current source), and that the second amplifier has an adjustable gain A2. The second current may be substantially the same as the first current, e.g. using a current-mirror, but that is not absolutely required, and a temperature compensated predefined second current source may also be used, for example.

The DSP is configured for obtaining the digital temperature value T and for adjusting the second amplifier gain using a predefined correction function f(T). The correction function f(T) for this case can be obtained in a similar manner as described in FIG. 3(b), except that in FIG. 3(d) the DAC voltage is applied to a port or node of the second amplifier.

In order for this embodiment to work, it is essential that the second gain A2 is adjusted before the sensor signal v2corr is digitized and sent to the DSP for further processing.

In summary, FIG. 3(d) shows a magnetic sensor device 340 for measuring a magnetic field gradient, by subtracting two values A_V1 and A_V2corr in the digital domain, after adjusting the gain of the second amplifier as a function of temperature.

All variations described for FIG. 3(b) can also be applied for FIG. 3(d).

Figure 3E:
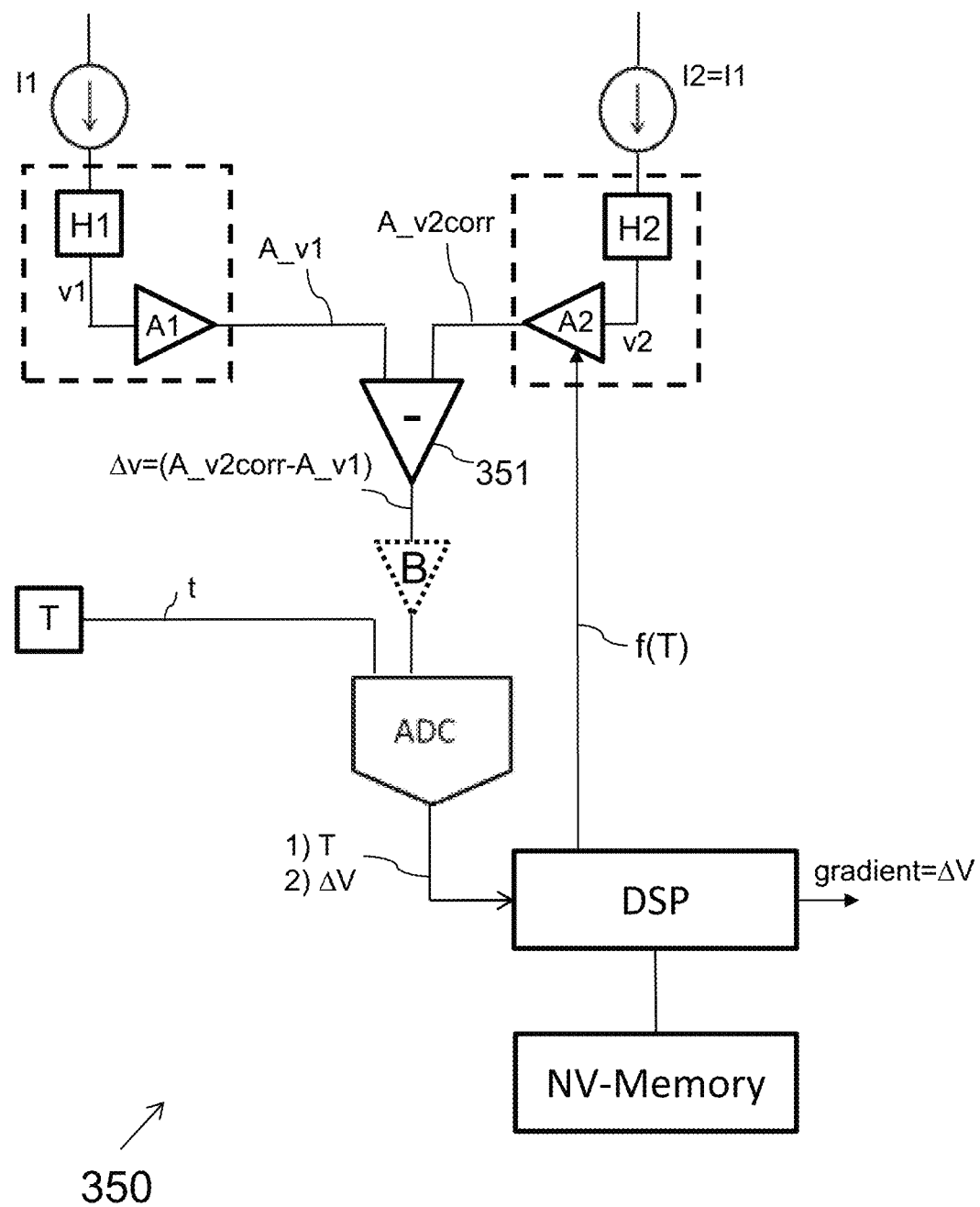
FIG. 3(e) shows a variant of the circuit of FIG. 1(b), according to an embodiment of the present invention, using a temperature sensor and an adjustable amplifier gain, and analogue subtraction.

FIG. 3(e) shows a variant of the circuit of FIG. 3(c), according to another embodiment of the present invention, using a single temperature sensor and an adjustable amplifier gain, and analog subtraction. The main differences between the circuit of FIG. 3(e) and FIG. 3(c) is that the second current source is a predefined current source, and that the second amplifier has an adjustable gain A2. The second current I2 may be substantially the same as the first current I1, but that is not absolutely required.

The DSP is configured for obtaining the digital temperature value T and for adjusting the second amplifier gain using a predefined correction function f(T). The correction function f(T) for this case can be obtained in a similar manner as described in FIG. 3(c), except that in FIG. 3(e) the DAC voltage is applied to a port or node of the second amplifier rather than to a port or node of the second current source.

In order for this embodiment to work, it is essential that the second gain A2 is adjusted before a difference Δv between the amplified sensor signals A_v1 and A_v2corr is generated in block 351, and then digitised by the ADC, and then sent to the DSP for further processing.

In summary, FIG. 3(e) shows a magnetic sensor device 350 for measuring a magnetic field gradient, by two amplified sensor signals A_v1, A_v2corr in the analog domain, after adjusting the gain of the second amplifier as a function of temperature.

All variations described for FIG. 3(b) can also be applied for FIG. 3(e).

Figure 3F:
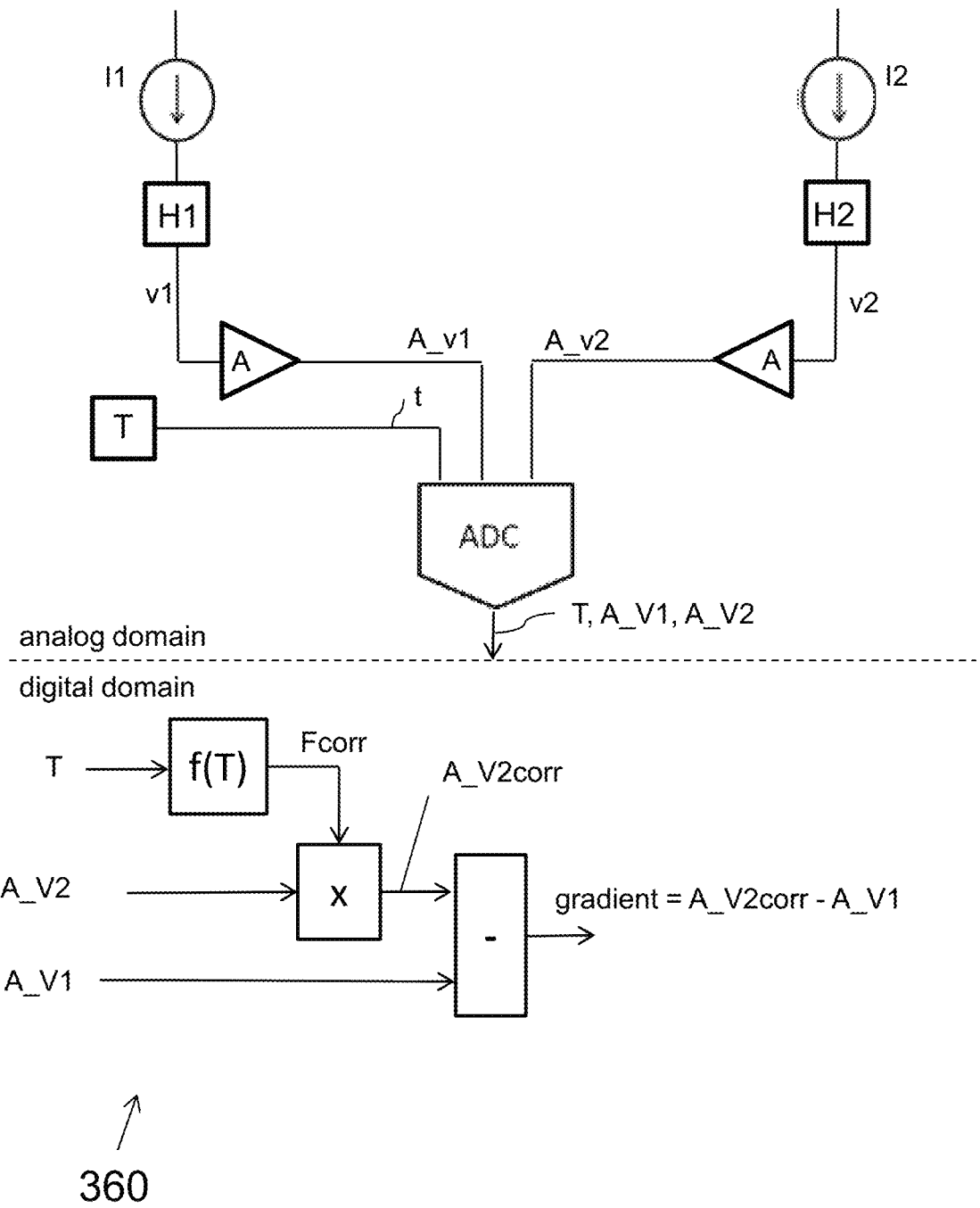
FIG. 3(f) shows a variant of the circuit of FIG. 1(b), according to an embodiment of the present invention, using a temperature sensor, and a multiplication and subtraction in the digital domain.
Figure 3G:
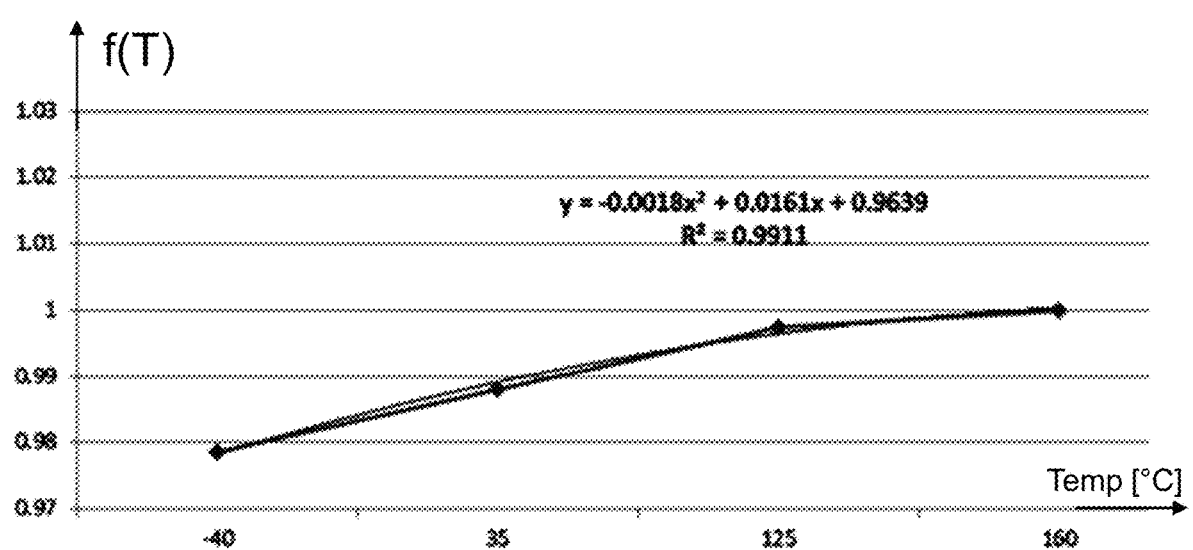
FIG. 3(g) shows an illustrative correction function as can be used in the embodiments of FIG. 3(b) to FIG. 3(f).

FIG. 3(f) shows a variant of the circuit of FIG. 3(b), according to another embodiment of the present invention, using a single temperature sensor, but without an adjustable current source, and without an adjustable amplifier gain. The main difference between the circuit of FIG. 3(f) and FIG. 3(b) is that the second current source is a predefined current source, and the second amplifier has a predefined gain. The second current I2 may be substantially the same as the first current I1, but that is not absolutely required. The second amplifier gain may be substantially equal to the first amplifier gain, but that is not absolutely required.

The DSP is configured for obtaining the digital temperature value T from the temperature sensor, and for determining a digital correction factor Fcorr as a function f(T) of the temperature.

The correction function f(T) for this case can for example be obtained by performing a calibration test at various temperatures. For each temperature, a constant magnetic field is applied, the value of A_V1 and A_V2 is measured, and the value of the correction factor Fcorr is chosen such that the resulting gradient value is substantially equal to zero. This can be obtained by a simple calculation:

$Fcorr*A\_V2-A\_V1$ has to be=0, thus $Fcorr$ needs to be=$A\_V1/A V2$.

During actual use of the device, the temperature is measured, a corresponding correction factor Fcorr is calculated or retrieved from the non-volatile memory, the value A_V1 and A_V2 are obtained from the ADC, the value of A_V2 is first multiplied with the correction factor Fcorr to obtain a corrected second digital value A_V2corr, and then a difference is calculated in the digital domain between A_V1 and A_V2corr to obtain the gradient.

In summary, FIG. 3(f) shows a magnetic sensor device 360 for measuring a magnetic field gradient, by subtracting two values A_V2corr, A_V1 in the digital domain, after multiplying the second digital value A_V2 with a correction factor Fcorr as a function of temperature.

All variations described for FIG. 3(b) can also be applied for FIG. 3(f).

FIG. 3(g) shows an illustrative correction function f(T) as may be used in the embodiment of FIG. 3(b), for a particular magnetic sensor device encapsulated in a particular package. It was found that a particular semiconductor die embedded in two different packages, may result in different correction functions, but the principles remain the same.

Looking back at the solutions proposed in FIG. 3(a) to FIG. 3(g) where a temperature was measured, and an adjustment of one biasing source or of one component or step in one signal path was performed (e.g. by the adjustable current source or the adjustable amplifier or in the digital domain), the skilled person will understand that it is of course also possible to adjust multiple components or steps in the second signal path, or even to adjust both signal paths, but such embodiments are more complex, and not preferred.

FIG. 4(a) and FIG. 4(b) show a variant of the sensor arrangement of FIG. 3(a) and FIG. 3(b) with the addition of a differential stress measurement circuit sensor, comprising: a first stress sensor S1 located near the first magnetic sensor H1 and configured for providing a first stress signal σ1, and a second stress sensor S2 located near the second magnetic sensor H2 and configured for providing a second stress signal σ2, and a subtraction circuit 421 for determining a difference between the first stress signal σ1 and the second stress signal σ2 to obtain said differential stress signal Δσ.

As can be seen in FIG. 4(b), the at least one analog-to-digital convertor ADC is further configured for digitizing the differential stress signal Δσ into a "differential stress value" ΔΣ (also referred to herein as "stress difference value"), optionally after amplification by a third amplifier B, and for providing this differential stress value ΔΣ to the digital processing circuit DSP.

The measurement of the gradient can for example be performed as follows:

a) first the temperature signal t and the differential stress signal Δσ are measured, optionally amplified, and digitized,
b) the DSP receives the digital values T and ΔΣ, and adjusts the second current I2 using a predefined function of these values T and ΔΣ,
c) then the first and second magnetic sensor signal v1, v2corr are measured, amplified and digitised,
d) then the DSP calculates the gradient by subtracting the first digital value A_V1 and the second digital value A_V2corr.

In order for this embodiment to work correctly, it is essential that the second current I2 is adjusted before the second magnetic sensor signal v2corr is amplified and digitized and sent to the DSP for further processing.

All variants described for FIG. 3(b) can also be applied for FIG. 4(b).

FIG. 4(c) to FIG. 4(f) show variants of the circuits of FIG. 3(c) to FIG. 3(f), furthermore comprising the differential stress sensor circuit described in FIG. 4(a) and FIG. 4(b). The principles of operation are similar to those described above, except that in the embodiments of FIG. 4(b) to FIG. 4(f), the predefined function is a function not only of temperature, but of temperature T and differential stress ΔΣ.

In brief, in FIG. 4(c) the temperature t and differential stress Δσ is measured and digitised T, ΔΣ and sent to the DSP, the DSP adjusts the second current source I2 using a predefined function of said temperature and differential stress f(T, ΔΣ), the first and second magnetic sensor signal v1, v2corr are amplified (yielding A_v1, A_v2corr) and subtracted in the analogue domain, and the difference signal Δv is digitised ΔV and sent to the DSP as the gradient.

In brief, in FIG. 4(d) the temperature t and differential stress Δσ is measured and digitised T, ΔΣ and sent to the DSP, the DSP adjusts the second amplifier gain A2 using a predefined function of said temperature and differential stress f(T, ΔΣ), the first and second magnetic sensor signal v1, v2 are amplified A_v1, A_v2corr and digitized A_V1, A_V2corr, and sent to the DSP, the DSP subtracts these digital values to obtain the gradient.

In brief, in FIG. 4(e) the temperature t and differential stress Δσ is measured and digitised T, ΔΣ and sent to the DSP, the DSP adjusts the second amplifier gain A2 using a predefined function of said temperature and differential stress f(T, ΔΣ), the first and second magnetic sensor signal v1, v2 are amplified (yielding A_v1, A_v2corr) and subtracted in the analog domain (yielding Δv), the difference signal Δv is digitised (yielding ΔV) and sent to the DSP as the gradient.

In brief, in FIG. 4(f) the temperature t and differential stress Δσ is measured and digitised T, ΔΣ and sent to the DSP, the DSP determines a correction factor Fcorr using a predefined function of said temperature and differential stress f(T, ΔΣ), the first and second magnetic sensor signal v1, v2 are amplified (yielding A_v1, A_v2) and digitized (yielding A_V1, A_V2) and sent to the DSP, the DSP multiplies the second digital signal A_V2 with the correction factor Fcorr to obtain A_V2corr, and then subtracts the first digital value A_V1 and the corrected second digital value A_V2corr in the digital domain, to obtain the gradient.

All variations described for FIG. 3(c) to FIG. 3(f) are also applicable to FIG. 4(c) to FIG. 4(f), e.g. using vertical Hall elements instead of horizontal Hall elements, using multiple ADCs, using a DSP with a DAC or PWM and LPF, biasing with a voltage source instead of a current source, using a microcontroller instead of a DSP, using a temperature sensor with digital output, etc.

FIG. 5(a) and FIG. 5(b) show a variant of the sensor arrangement and circuit of FIG. 4(a) and FIG. 4(b) with the differential stress measurement circuit, but without a temperature sensor, in the sense that the DSP does not explicitly use a temperature value to adjust the adjustable current source or the adjustable amplifier or in its calculation of the gradient. The working of this circuit 520 is similar to that of FIG. 4(b), except that no temperature is measured and digitised. A differential stress Δσ is measured and digitized, and the second current source I2 is adjusted using a function f(ΔΣ) of the differential stress ΔΣ but not of temperature.

FIG. 5(c) to FIG. 5(f) show variants of the circuit of FIG. 4(b) to FIG. 4(f) without a temperature sensor. These circuits can also be considered as variants of FIG. 3(b) to FIG. 3(f) with a differential stress sensor instead of a temperature sensor. The principles of operation are similar to those described above, except that the predefined function is a function of differential stress, not a function of temperature.

In brief, in FIG. 5(c) the differential stress Δσ is measured, optionally amplified, and digitised (yielding ΔΣ) and sent to the DSP, the DSP adjusts the second current source I2 using a predefined function f(ΔΣ) of the measured differential stress, then the first and second magnetic sensor signal v1, v2corr are amplified (yielding A_v1, A_v2corr) and subtracted (yielding Δv) in the analogue domain, and the difference signal Δv is digitised (yielding ΔV) and sent to the DSP as the gradient.

In brief, in FIG. 5(d) the differential stress Δσ is measured and digitised ΔΣ and sent to the DSP, the DSP adjusts the second amplifier gain A2 using a predefined function f(ΔΣ) of the measured differential stress, the first and second magnetic sensor signal v1, v2 are amplified (yielding A_v1, A_v2corr) and digitized (yielding A_V1, A_V2corr), and sent to the DSP, the DSP subtracts the first and second digital value A_V1, A_V2corr to obtain the gradient.

In brief, in FIG. 5(e) the differential stress Δσ is measured, optionally amplified, and digitised (yielding ΔΣ) and sent to the DSP, the DSP adjusts the second amplifier gain A2 using a predefined function f(ΔΣ) of the measured differential stress, the first and second magnetic sensor signals v1, v2 are amplified (yielding A_v1, A_v2corr) and subtracted (yielding Δv) in the analog domain, the difference signal Δv is digitised (yielding ΔV) and sent to the DSP as the gradient.

In brief, in FIG. 5(f) the differential stress Δσ is measured, optionally amplified, and digitised (yielding ΔΣ) and sent to the DSP, the DSP determines a correction factor Fcorr using a predefined function f(ΔΣ) of the measured differential stress, the first and second magnetic sensor signals v1, v2 are amplified (yielding A_v1, A_v2) and digitized (yielding A_V1, A_V2) and sent to the DSP, the DSP multiplies the second digital signal A_V2 with the correction factor Fcorr to obtain A_V2corr, and then subtracts the first digital value A_V1 and the corrected second digital value A_V2corr in the digital domain, to obtain the gradient.

All variants described for FIG. 3(b) to FIG. 3(f), except using a temperature sensor with digital output, are also applicable to FIG. 5(b) to FIG. 5(f), e.g. using vertical Hall elements instead of horizontal Hall elements, using multiple ADCs, using a DSP with a DAC or PWM and Low Pass Filter, biasing with a voltage source instead of a current source, using a microcontroller instead of a DSP, further scaling the gradient, etc.

Looking back at FIG. 3(a) to FIG. 5(f), it can be seen that the embodiments of FIGS. 3(a) to 3(g) have a temperature sensor but not the differential stress sensor, the embodiments of FIGS. 5(a) to 5(f) have a differential stress sensor but not a temperature sensor, and the embodiments of FIGS. 4(a) to 4(f) have both a differential stress sensor and a temperature sensor.

The rationale behind the embodiments of FIGS. 5(a) to 5(f) is that it may not be necessary to explicitly measure the temperature, because temperature variations will typically also cause stress variations due to thermal expansion or contraction of the materials, hence temperature variations will also (at least partially) be compensated when compensating for differential stress.

Likewise, the rationale behind the embodiments of FIGS. 3(a) to 3(g), is that stress variations caused by temperature variations will automatically be compensated for when compensating for temperature.

The embodiments of FIG. 4(a) to FIG. 4(f), having both a temperature sensor and a differential stress measurement circuit are capable of compensating for mechanical stress which is not caused by temperature variations but by other reasons, for example by mechanical bending of a printed circuit board (PCB) on which the device is mounted. The embodiments of FIG. 4(a) to FIG. 4(f) may therefore be more robust against long-term drift.

So far, only magnetic sensor structures are described wherein each magnetic sensor consists of a single horizontal Hall plate, or a single vertical Hall plate. But the present invention is not limited thereto and also works for other magnetic sensors, for example for magnetic sensors containing magneto resistive elements (not shown).

In FIG. 6(a) to FIG. 8(c) the principles of the present invention will also be described for a sensor device comprising a so-called "dual disk structure", where each magnetic sensor consists of two horizontal Hall plates arranged on opposite sides of an integrated magnetic concentrator (IMC).

The IMC disks typically have a diameter of about 200-250 micron, and are typically spaced apart over a distance from about 1.0 to about 3.0 mm, e.g. equal to about 2.0 mm, but of course the present invention is not limited hereto, and other dimensions can also be used. The principles described above can easily be applied to such a sensor device, by assuming that all elements belonging to one magnetic sensor have the same temperature and experience the same mechanical stress.

FIG. 6(a) shows a sensor arrangement 600 having two magnetic sensors, each magnetic sensor comprising two horizontal Hall elements arranged on opposite sides of an integrated magnetic concentrator IMC.

The first magnetic sensor, consisting of IMC1, H1a and H1b is located at a first sensor location xL. The second magnetic sensor, consisting of IMC2, H2a and H2b is located on a second sensor position xR. The first sensor location and the second sensor location are spaced apart by a distance dx along the X-axis. The four horizontal Hall elements are located on the X-axis.

This sensor structure is described in other patent applications, for example in US2018372475A1 and in EP19193068.4, both of which are incorporated herein by reference in their entirety, but for the purposes of the present invention it suffices to know that:

the magnetic field component BxL at the first sensor location XL and oriented in the X direction parallel to the substrate, can be calculated as (or proportional to): BxL= (v1b−v1a), where v1b is the signal provided by H1b, and v1a is the signal provided by H1a.

the magnetic field component BzL at the first sensor location XL and oriented in the Z direction perpendicular to the substrate, can be calculated as (or proportional to): BzL=(v1b+v1a), the magnetic field component BxR at the second sensor location XR and oriented in the X direction parallel to the substrate, can be calculated as (or proportional to): BxR=(v2b−v2a), where v2b is the signal provided by H2b, and v2a is the signal provided by H2a.

the magnetic field component BzR at the second sensor location XR and oriented in the Z direction perpendicular to the substrate, can be calculated as (or proportional to): BzR=(v2b+v2a), the gradient dBx/dx of the magnetic field component Bx oriented parallel to the substrate along the X axis, can be calculated as: dBx/dx~ΔBx=BxR−BxL, where the symbol ~ means "is proportional to", and the gradient dBz/dx of the magnetic field component Bz oriented perpendicular to the substrate along the X axis, can be calculated as: dBz/dx~ΔBz=BzR−BzL.

In the light of the present invention, the skilled reader having the benefit of the present disclosure, will understand that the gradient signals dBx/dx and dBz/dx calculated in this way may suffer from a strayfield error signal, as described by formula [8] or [8b] described above, in case of a sensitivity mismatch between the two sensors structures.

FIG. 6(b) illustrates how the principles described in relation to FIG. 3(b) can be applied to the sensor structure of FIG. 6(b) to reduce or substantially eliminate the strayfield error signal.

It is noted that the sensor structure of FIG. 6(a) contains a single temperature sensor for measuring a temperature of the substrate. As mentioned above, the temperature sensor can be located anywhere on the substrate, for example at an equal distance from the first magnetic sensor and the second magnetic sensor.

It is further noted that the first magnetic sensor is indicated with a dotted line surrounding the two Hall elements H1a and H1b, the outputs of which are combined, e.g. subtracted in block 611 to form a first magnetic sensor signal v1 indicative of the magnetic field component BxL.

Likewise, the second magnetic sensor is indicated with a dotted line surrounding the two Hall elements H2a and H2b, the outputs of which are combined, e.g. subtracted in block 612 to form a second magnetic sensor signal v2 indicative of the magnetic field component BxR.

For completeness it is mentioned that the sensitivities of the two Hall plates H1a and H1b are typically (statically) matched to each other in known manners (e.g. using I1 and a current mirror of I1, and/or trimming), and that the sensitivities of the two Hall plates H2a and H2b are typically also (statically) matched to each other in known manners. But in addition to the prior art, according to the principles of the present invention, the sensitivity of the first sensor as a whole is furthermore dynamically matched to the sensitivity of the second sensor as a whole as a function of temperature and/or as a function of differential stress.

By comparison of FIG. 6(b) and FIG. 3(b), the skilled reader will understand that, using the topology of FIG. 6(a) and the circuit of FIG. 6(b), the gradient dBx/dx can for example be determined as follows:
a) first the temperature signal t is measured, and digitized (into value T),
b) the DSP receives the digital value T, and adjusts the biasing current of the second sensor (here: the biasing current I3 and the biasing current I4) using a predefined function of the value T,
c) then the first and second magnetic sensor signal v1, v2 are measured, amplified and digitised,
d) then the DSP calculates the gradient by subtracting the first digital value A_V1 and the second digital value A_V2corr.

The variants described for FIG. 3(b) to FIG. 3(f), (except using vertical Hall elements), are also applicable to FIG. 6(b), e.g. using multiple ADCs, DSP with a DAC or PWM+ Low Pass Filter, biasing with a voltage source instead of a current source, using a microcontroller instead of a DSP, further scaling the gradient, etc.

In yet another variant of FIG. 6(b), the signals v1a and v1b generated by H1a and H1b are added in block 611 (instead of being subtracted), in which case the signal v1 is indicative of BzL (instead of BxL), and the signals v2a and v2b generated by H2a and H2b are added in block 612 (instead of being subtracted), in which case the signal v2 is indicative of BzR (instead of BxL), and the gradient being measured is dBz/dx (instead of dBx/dx).

FIG. 6(c) shows a circuit 620 which can be seen as a variant of the circuit 610 of FIG. 6(b) using the same principles as explained in FIG. 3(d). Using the topology of FIG. 6(a) and the circuit of FIG. 6(c), the gradient dBx/dx can for example be calculated as follows:
a) first the temperature signal t is measured, and digitized,
b) the DSP receives the digital value T, and adjusts the gain of the second amplifier A2 using a predefined function of the value T,
c) then the first and second magnetic sensor signal v1, v2 are measured, amplified and digitised,
d) then the DSP calculates the gradient by subtracting the first digital value A_V1 and the second digital value A_V2corr.

The variants described for FIG. 6(b) are also applicable to FIG. 6(c).

In yet another or further variant of FIG. 6(b) or FIG. 6(c), the amplified signals A_v1 and A_v2corr are subtracted in the analog domain, and the difference signal Δv is amplified and digitized, and further processed by the DSP in a manner similar as described in FIG. 3(c) or FIG. 3(e). As mentioned above, this embodiment provides a higher signal to noise ratio (SNR), because the range of the ADC can be used for digitising the gradient signal rather than the component signals.

In yet another or further variant of FIG. 6(b) and FIG. 6(c) (not shown), the biasing source of the second sensor (thus: I3 and I4) are not controlled by the DSP, but use e.g. a predefined current I3 (typically generated by a temperature compensated current source) and a predefined current I4, e.g. reproduced from I3 using a current mirror, and the signals v1, v2 are amplified and digitized, and the values A_V1 and A_V2 are provided to the DSP, and the DSP first corrects the second digital value A_V2 in the digital domain with a correction factor Fcorr using a predefined function of temperature, before subtracting the first digital value A_V1 and the corrected second digital value A_V2corr, in a manner similar as described in FIG. 3(f).

FIG. 7(a) shows a variant of the sensor arrangement of FIG. 6(a) further comprising a first mechanical stress sensor S1 for measuring mechanical stress of the first sensor (comprising: IMC1, H1a, H1b) and a second mechanical stress sensor S2 for measuring mechanical stress of the second sensor (comprising: IMC2, H2a, H2b). The stress sensors S1 may be located adjacent IMC1, or under IMC1. Likewise, the stress sensor S2 may be located adjacent IMC2, or under IMC2.

FIG. 7(b) shows a circuit 710 similar to that of FIG. 6(b), with the addition of a differential stress sensor circuit, configured for providing a differential stress signal Δσ, which is digitized by the ADC and further processed by the DSP in a manner similar as described in FIG. 4(b), taking into account that "adjusting the second biasing source" in this case means adjusting the current source I3 and I4 using a predefined function f(T, ΔΣ) of temperature and differential stress.

FIG. 7(c) shows a circuit 720 similar to that of FIG. 6(c), with the addition of a differential stress sensor circuit, configured for providing a differential stress signal Δσ, which is digitized by the ADC and further processed by the DSP in a manner similar as described in FIG. 4(d), where the second amplifier gain is adjusted using a predefined function f(T, ΔΣ) of temperature T and differential stress ΔΣ.

The variants described for FIG. 6(b) and FIG. 6(c) are also applicable to FIG. 7(b) and FIG. 7(c), for example, an embodiment similar to FIG. 4(c) where the magnetic sensor signals v1 and v2 are subtracted in the analog domain, and the biasing source of the second magnetic sensor (thus I3 and I4) are adjusted using a predefined function f(T, ΔΣ) of temperature and differential stress, and for example an embodiment similar to FIG. 4(e) where the magnetic sensor signals v1 and v2 are subtracted in the analog domain, and the second amplifier gain is adjusted using a predefined function f(T, ΔΣ) of temperature and differential stress, and for example an embodiment similar to FIG. 4(f) where the biasing source of the second magnetic sensor contains predefined (not adjustable) current sources I3 and I4, and where the magnetic sensor signals v1, v2 are amplified and digitized, and the values A_V1 and A_V2 are provided to the DSP, and the DSP first corrects the second digital value A_V2 in the digital domain with a correction factor Fcorr using a predefined function f(T, ΔΣ) of temperature and differential stress, before subtracting the first digital value A_V1 and the corrected second digital value A_V2corr, in a manner similar as described in FIG. 4(f).

FIG. 8(a) shows a variant of the sensor arrangement of FIG. 7(a) without the temperature sensor, and FIG. 8(b) and FIG. 8(c) show variants of the circuits of FIG. 7(b) and FIG. 7(c) without the temperature sensor.

The variants described for FIG. 7(b) and FIG. 7(c) are also applicable to FIG. 8(b) and FIG. 8(c), for example, an embodiment similar to FIG. 4(c) where the magnetic sensor signals v1 and v2 are subtracted in the analog domain, and the biasing source of the second magnetic sensor (thus I3 and I4) are adjusted using a predefined function f(ΔΣ) of the measured differential stress, and for example an embodiment similar to FIG. 4(e) where the magnetic sensor signals v1 and v2 are subtracted in the analog domain, and the second amplifier gain is adjusted using a predefined function f(ΔΣ) of the measured differential stress, and for example an embodiment similar to FIG. 4(f) where the biasing source of the second magnetic sensor contains predefined (not adjustable) current sources I3 and I4, and where the magnetic sensor signals v1, v2 are amplified and digitized, and the values A_V1 and A_V2 are provided to the DSP, and the DSP first corrects the second digital value A_V2 in the digital domain with a correction factor Fcorr using a predefined function f(ΔΣ) of the measured differential stress, before subtracting the first digital value A_V1 and the corrected second digital value A_V2corr, in a manner similar as described in FIG. 4(f).

In FIG. 3(a) to FIG. 8(c) several sensor structures and methods have been described for determining a gradient of a magnetic field in a manner which reduces the influence of a strayfield signal, by dynamically adjusting a sensitivity or a gain of one signal path relative to the other. In what follows, exemplary systems will be described in which a (single) gradient measurement can be used.

In FIG. 9 and FIG. 10 two magnetic current sensors will described.

In FIGS. 11(a) to 11(d) a distance measurement system is described. The latter can for example be used to detect whether or not a button which is movable between two predefined positions is being pressed or not.

In FIG. 12(a) to FIG. 12(d) methods will be described for determining a single magnetic field gradient.

FIG. 9(a) and FIG. 9(b) illustrate a magnetic current sensor 900, based on the measurement of a magnetic field gradient according to the principles of the present invention.

FIG. 9(a) and FIG. 9(b) show an exemplary block diagram of a current sensor device 900 according to an embodiment of the present invention, in top view and in cross sectional view respectively. The current sensor device 900 comprises a semiconductor substrate 910 having two horizontal Hall elements 901 and 902 spaced apart from each other. The substrate 910 is arranged at a predefined position relative to an electrical conductor 913 (e.g. a busbar). When a current to be measured is flowing through the conductor 913, a magnetic field is created by this current, and a gradient of this magnetic field is measured by the first and second sensor 901, 902 in accordance with the principles of the present invention, for example as explained in any of FIG. 3(a) to FIG. 5(f).

To this end, the substrate 910 comprises a temperature sensor and/or a differential stress sensor, two amplifiers, at least one ADC and a processing circuit configured for performing any of the methods described above.

In an embodiment, the first Hall element 901 is biased with a first predefined current I1, and the second Hall element 902 is biased with an adjustable current I2, and the processing circuit is configured for adjusting the second current I2 using a predefined function f(T) of the measured temperature, or a predefined function f(ΔΣ) of the differential stress, or a predefined function f(T, ΔΣ) of both temperature and differential stress, e.g. in a similar manner as described in FIG. 3(b) or FIG. 3(d) or FIG. 4(b) or FIG. 4(d) or FIG. 5(b) or FIG. 5(d).

In another embodiment, the first Hall element 901 is biased with a first predefined current I1, and the first magnetic sensor signal is amplified by a first amplifier having a first predefined gain, and the second Hall element 902 is biased with a second predefined current I2, and the second magnetic sensor signal is amplified by a second amplifier having an adjustable gain, and the processing circuit is configured for adjusting the second gain using a predefined function f(T) of the measured temperature T, or a predefined function f(ΔΣ) of the differential stress, or a predefined function f(T, ΔΣ) of both temperature and differential stress, e.g. in a similar manner as described in FIG. 3(c) or FIG. 3(e) or FIG. 4(c) or FIG. 4(e) or FIG. 5(c) or FIG. 5(e).

In yet another embodiment, the first Hall element 901 is biased with a first predefined current I1, and this signal is amplified by a first amplifier having a first predefined gain, and the second Hall element 902 is biased with a second predefined current I2, and this signal is amplified by a second amplifier having a second predefined gain, both signals are digitized, and the processing circuit is configured for multiplying the second digital value A_V2 in the digital domain with a correction factor Fcorr using a predefined function f(T) of the measured temperature T, or a predefined function a predefined function f(ΔΣ) of the differential stress, or a predefined function f(T, ΔΣ) of both temperature and differential stress, e.g. in a similar manner as described in FIG. 3(f) or FIG. 4(f) or FIG. 5(f).

In each of these cases, the processing circuit is further configured for converting the gradient value into a current value, for example by multiplying the gradient value with a predefined constant K4, for example in accordance with the following formula:

$$current = gradient * K4 \quad [11]$$

or by dividing the gradient value by a predefined constant K3, for example in accordance with the following formula:

$$current = gradient / K3 \quad [12]$$

The value of K3 or K4 may be determined during design, or by simulation, or by calibration, or in any other way, and may be stored in the non-volatile memory embedded in or connected to the processing circuit.

In a variant, the value of K3 or K4 is not constant, but is dependent on temperature. In this case, a function K3(T) or K4(T) can be stored in the non-volatile memory, in any suitable manner, for example as a list of values to be interpolated, or using a piece-wise-linear approximation, or by storing coefficients of a polynomial in said NV-memory, etc.

In the example of FIG. 9, the electrical conductor 913 has a rectangular cross section (in a plane perpendicular to the direction of the current flow), but that is not absolutely required, and the invention will also work for other cross sections.

In the example of FIG. 9, the semiconductor substrate 910 is arranged relative to the electrical conductor 913 such that the second sensor 902 is located substantially above the center line or heart line of the electrical conductor, but that is not required, and the invention will also work if the substrate 910 is shifted such that none of the magnetic sensor 901, 902 is located above the heart-line of the conductor. They can both be located on the left of the center-line in FIG. 9(b), or one can be located on the left and the other on the right of the center-line.

In the example of FIG. 9(b) a virtual line passing through the first sensor 901 in a direction perpendicular to the substrate 910 does not intersect with the electrical conductor 913, while a virtual line passing through the second sensor 902 and perpendicular to the substrate 910 does intersect the electrical conductor 913. But this is not absolutely required, and the present invention will also work if both sensor elements are located such that a virtual line passing through them and perpendicular to the substrate 910 both intersect the electrical conductor 913, or if none of these lines intersects the electrical conductor 913.

In an embodiment, the electrical conductor 913 is located outside of the magnetic sensor device.

In another embodiment, the electrical conductor, or at least a beam shaped portion thereof, is included in the package of the device, for example as part of the lead frame. Such a current sensor is referred to as "an integrated current sensor".

FIG. 10(a) and FIG. 10(b) illustrate another example of a current sensor, where the current is measured indirectly by measuring a magnetic field gradient. FIG. 10(a) shows a top view, and FIG. 10(b) shows a side view of the current sensor device. What is shown is an integrated current sensor, where the electrical conductor 1003 is embedded in the package of the current sensor device 1000.

This current sensor device 1000 comprises a semiconductor substrate 1010 having two vertical Hall elements 1031 and 1032 as the first and second magnetic sensor. The electrical conductor 1003 is connected to first input leads 1006 and first output leads 1007, also referred to as "pins". The substrate may further comprise bond pads 1004 connected to second pins 1002 by means of bond wires, for example for receiving a supply voltage and ground, and for providing the measured current value.

According to the principles of the present invention, the substrate 1010 comprises a temperature sensor and/or a differential stress sensor, two amplifiers, at least one ADC and a processing circuit configured for performing any of the methods described above.

In an embodiment, the first Hall element 1031 is biased with a first predefined current I1, and the second Hall element 1032 is biased with an adjustable current I2, and the processing circuit is configured for adjusting the second current I2 using a predefined function f(T) of the measured temperature T, or a predefined function f(ΔΣ) of the differential stress, or a predefined function f(T, ΔΣ) of both temperature and differential stress, e.g. in a similar manner as described in FIG. 3(b) or FIG. 3(d) or FIG. 4(b) or FIG. 4(d) or FIG. 5(b) or FIG. 5(d).

In another embodiment, the first Hall element 1031 is biased with a first predefined current I1, and the first magnetic sensor signal is amplified by a first amplifier having a first predefined gain A1, and the second Hall element 1032 is biased with a second predefined current I2, and the second magnetic sensor signal is amplified by a second amplifier having an adjustable gain A2, or vice versa, and the processing circuit is configured for adjusting the second gain A2 using a predefined function f(T) of the measured temperature T, or a predefined function f(ΔΣ) of the differential stress, or a predefined function f(T, ΔΣ) of both temperature and differential stress, e.g. in a similar manner as described in FIG. 3(c) or FIG. 3(e) or FIG. 4(c) or FIG. 4(e) or FIG. 5(c) or FIG. 5(e).

In yet another embodiment, the first Hall element 1031 is biased with a first predefined current I1, and the first magnetic sensor signal is amplified by a first amplifier having a first predefined gain, and the second Hall element 1032 is biased with a second predefined current I2, and the second magnetic sensor signal is amplified by a second amplifier having a second predefined gain, both sensor signals are digitized, and provided to the digital processing circuit, and the processing circuit is configured for multiplying the second digital value A_V2 in the digital domain with a correction factor Fcorr using a predefined function f(T) of the measured temperature T, or a predefined function f(ΔΣ) of the differential stress, or a predefined function f(T, ΔΣ) of both temperature and differential stress, e.g. in a similar manner as described in FIG. 3(f) or FIG. 4(f) or FIG. 5(f).

In each of these cases, the processing circuit is further configured for converting the gradient value into a current value, for example by multiplying the gradient value with a predefined constant K4, for example in accordance with the following formula:

$$\text{current} = \text{gradient} * K4 \quad [11]$$

or by dividing the gradient value by a predefined constant K3, for example in accordance with the following formula:

$$\text{current} = \text{gradient}/K3 \quad [12]$$

The value of K3 or K4 may be determined during design, or by simulation, or by calibration, or in any other way, and may be stored in the non-volatile memory embedded in or connected to the processing circuit.

Many variants are possible, for example, in a variant, K3 and K4 are dependent on temperature, as described in FIG. 9, for example, in the example of FIG. 10, the electrical conductor 1003 is a straight, planar, beam shaped conductor portion, extending from one side of the package to the opposite side of the package. However, that is not required for the invention to work, and the invention will also work for example with an electrical conductor having a U-shape or a C-shape or a V-shape or an Omega-shape. Also, in the example of FIG. 10, each conductor end is connected via three input pins 1006 and three output pins 1007, but the invention will also work with less than three pins, or more than three pins, or another type of connection, for example a strip.

In another embodiment (not shown), the semiconductor substrate 1010 contains two horizontal Hall elements without integrated magnetic concentrators (IMC).

In another embodiment (not shown), the semiconductor substrate 1010 contains two horizontal Hall elements with integrated magnetic concentrators (IMC).

In another embodiment (not shown), the semiconductor substrate 1010 contains two magnetic sensors comprising magneto-resistive elements.

Figure 11A:
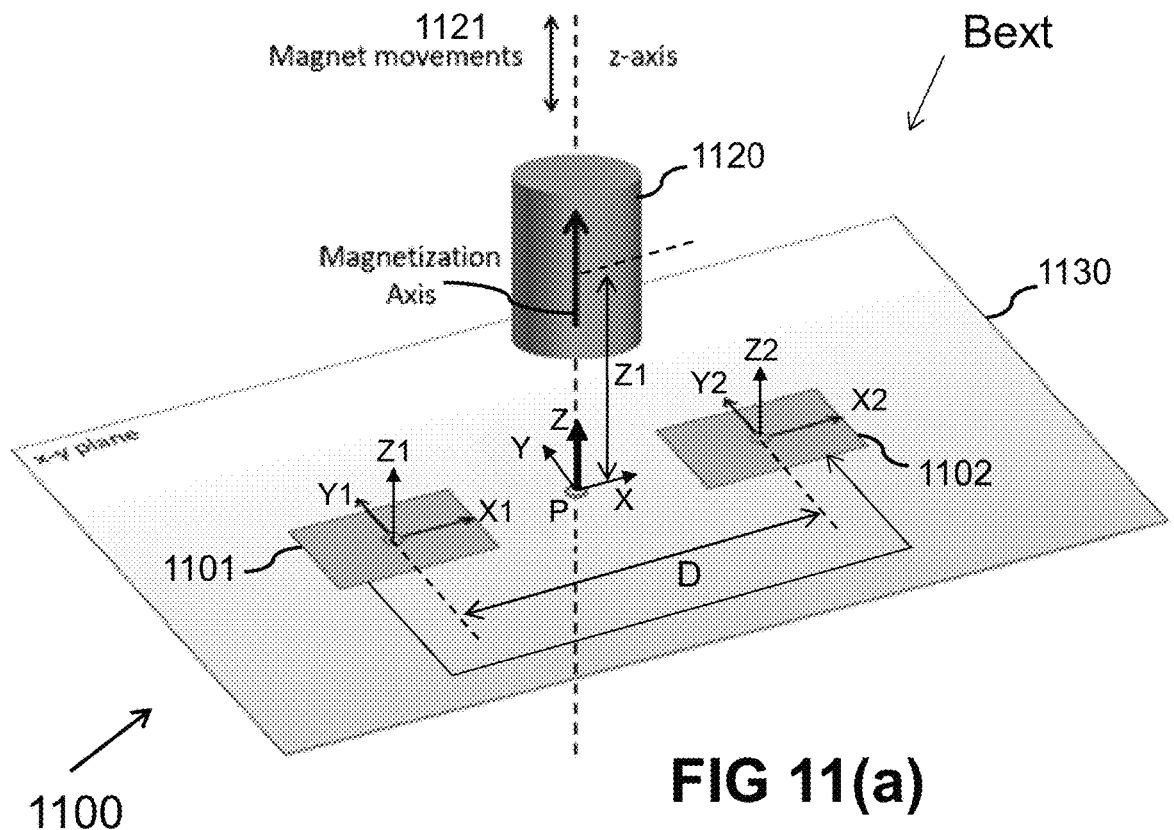
FIG. 11(a) shows a sensor arrangement for measuring a distance of a magnet relative to a substrate.

FIG. 11(a) shows a sensor arrangement 1100 for measuring a distance z1 of a magnet 1120 relative to a substrate, according to another embodiment of the present invention. This can be used for example for detecting whether or not a push-button connected to the magnet is being pressed. The magnet 1120 can be for example be an axially magnetized disk shaped or cylinder-shaped magnet, movably mounted relative to the semiconductor substrate along the Z-axis.

FIG. 11(a) shows a semiconductor substrate 1130 containing a first magnetic sensor 1101 (represented by a rectangle) and a second magnetic sensor 1102 (also represented by a rectangle), spaced apart over a distance D. According to principles of the present invention, the substrate further comprises a temperature sensor and/or a differential stress sensor, two biasing sources (preferably current sources), two amplifiers, at least one ADC, and a processing unit comprising or connected to a non-volatile memory (not shown), and the processing circuit is configured for measuring a temperature and/or a differential stress, and for adjusting a current source or an amplifier gain or for correcting a digital value using a predefined function f(T) of the measured temperature T, or a predefined function f(ΔΣ) of the differential stress, or a predefined function f(T, ΔΣ) of both temperature and differential stress, and for calculating the gradient.

Figure 11B:
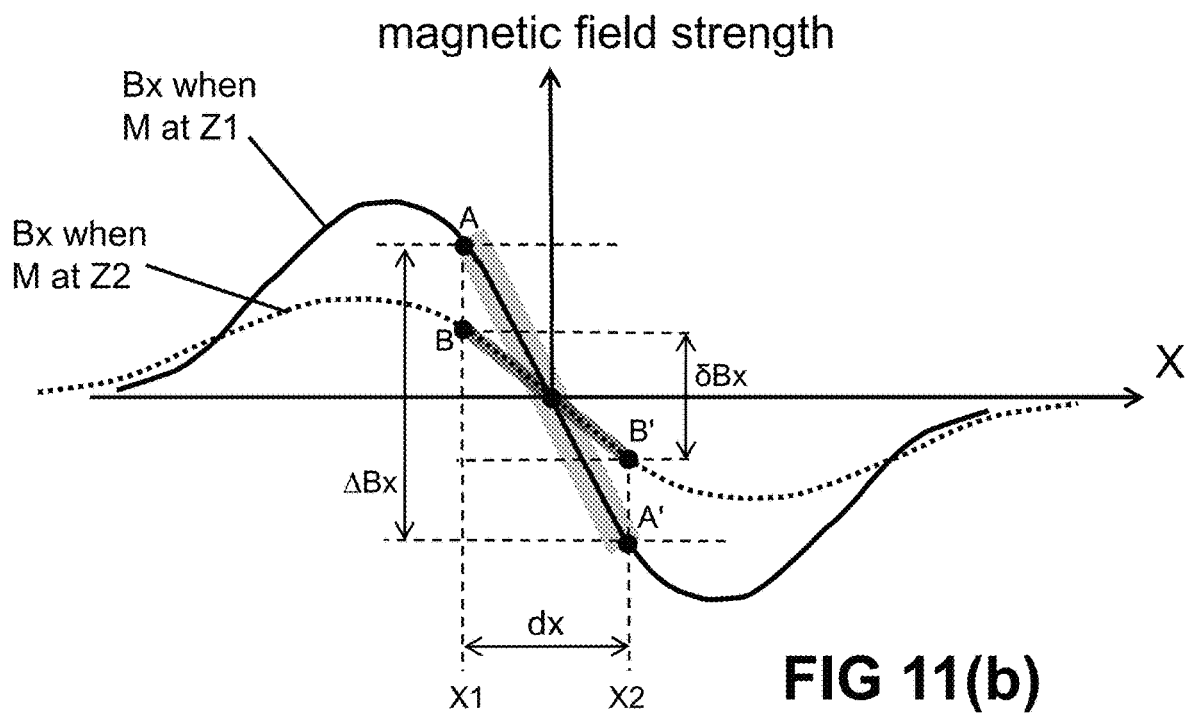
FIG. 11(b) shows a plot of the magnetic field components Bx measurable by two sensors for various positions on the X-axis shown in FIG. 11(a) for two positions of the movable magnet relative to the substrate.

FIG. 11(b) shows a plot of the magnetic field components Bx as would be measured by two sensors for various positions on the X-axis of FIG. 11(a), for two predefined positions of the movable magnet along the Z-axis, an upper position (corresponding to a button being released) and a lower position (e.g. corresponding to a button being pressed). It is assumed that the sensors 1101 and 1102 are located at position X1 and X2 on the X-axis. The X and Y axis are parallel to the substrate 1130, the Z-axis is substantially perpendicular to the substrate 1130.

When the magnet 1120 is in a first position/at a first distance, the first and second magnetic sensor will measure the values A and A', and the gradient of these signals is ΔBx.

When the magnet 1120 is in a second position/at a second distance, the first and second magnetic sensor will measure the values B and B', and the gradient of these signals is δBx.

As can be appreciated from FIG. 11(b), the magnitude of the gradient signal (e.g. ΔBx or δBx) is indicative of the distance from the magnet relative to the substrate, or in other words, if the gradient is known, the distance can be determined. In some embodiments (e.g. a push-button), the exact position is not important, but it suffices to differentiate between two possible conditions: pressed or not pressed. This can easily be implemented by comparing the gradient value with a threshold value.

Figure 11C:
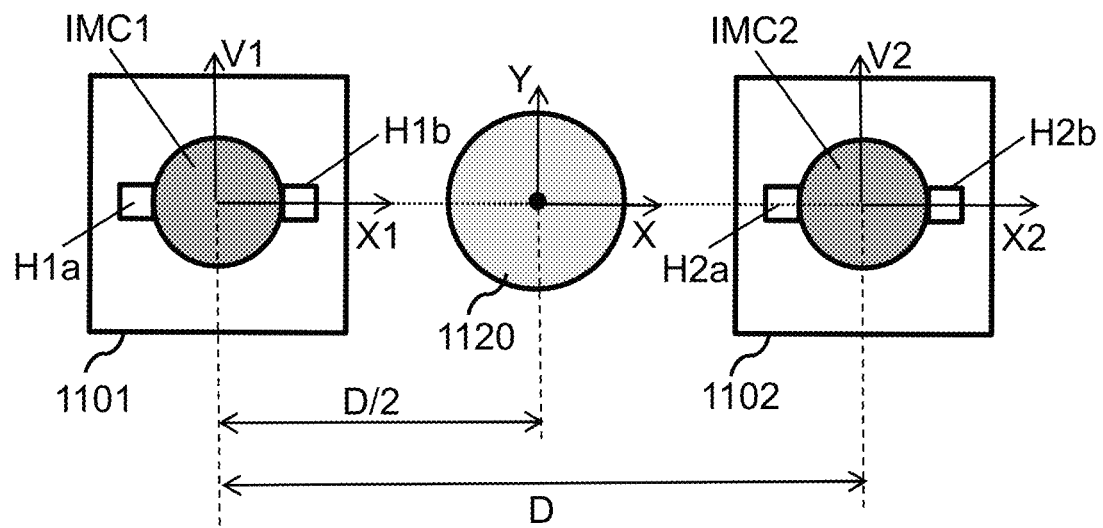
FIG. 11(c) is a schematic representation of an implementation of the sensor arrangement of FIG. 11(a) according to an embodiment of the present invention, where each magnetic sensor comprises two horizontal Hall elements and IMC for measuring a magnetic field component Bx.

FIG. 11(c) is a schematic representation of an implementation of the sensor arrangement of FIG. 11(a), wherein each magnetic sensor comprises two horizontal Hall elements and an IMC for measuring a magnetic field component Bx parallel to the substrate at the sensor location. The attentive reader will recognize that this is exactly what was described in FIG. 6(a) to FIG. 8(c) and the variants thereof.

Figure 11D:
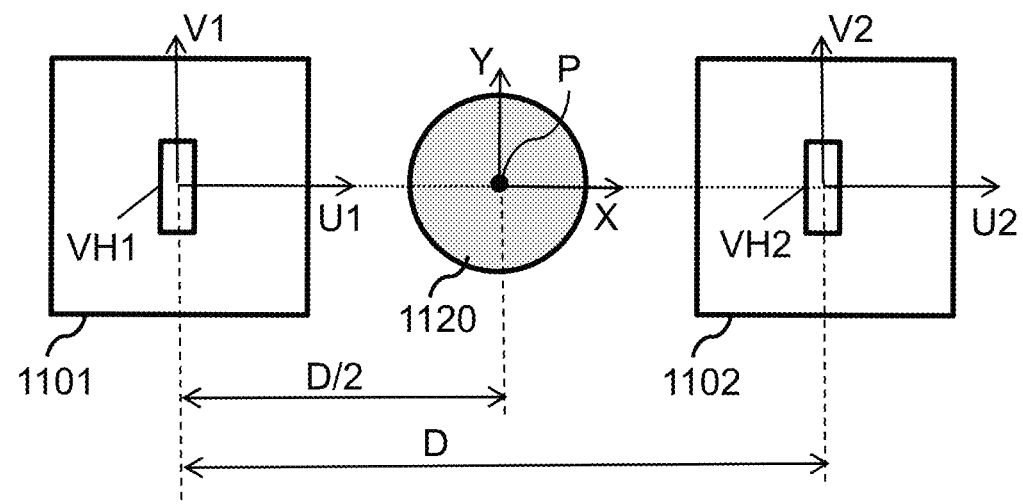
FIG. 11(d) is a schematic representation of another implementation of the sensor arrangement of FIG. 11(a) according to an embodiment of the present invention, where each magnetic sensor comprises a vertical Hall element for measuring a magnetic field component Bx.

FIG. 11(d) is a schematic representation of an implementation of the sensor arrangement of FIG. 11(a), wherein each magnetic sensor comprises two vertical Hall elements (without a magnetic flux concentrator) for measuring a magnetic field component Bx parallel to the substrate at the sensor locations. The attentive reader will recognize that this was described as a variant of FIG. 3(a) to FIG. 5(e), in which the horizontal Hall elements are replaced by vertical Hall elements oriented in a single direction (e.g. the X-direction).

In both cases (FIG. 11c and FIG. 11d), the only thing that needs to be added to form a distance measurement system is that the processing unit needs to convert the gradient value into a distance value, for example using a look-up table, or using a mathematical formula;

and the only thing to be added to form a push-button detection system, or a switch position detection system is that the processing unit needs to compare the gradient value with a predefined threshold value (e.g. hardcoded or stored in a non-volatile memory), and if the gradient is larger than the threshold, output a first signal to indicate that the button or the switch is in a first condition (e.g. released), and if the gradient is smaller than the threshold, output a second signal to indicate that the button or switch is in a second condition (e.g. pushed).

FIG. 12(a) shows a generic flow-chart illustrating methods of determining a gradient signal as can be used in embodiments of the present invention. The method 1200 comprises the steps of:

a) providing a semiconductor substrate comprising:
 a first and second magnetic sensor, spaced apart along a predefined axis;
 a first and second biasing source (e.g. a first and a second current source);
 a first and second amplifier;
 a temperature sensor and/or a differential stress sensing circuit;
 (e.g. a temperature sensor but no differential stress sensing circuit; or a differential stress sensing circuit but no temperature sensor; or both a temperature sensor and a differential stress sensing circuit)

at least one ADC, a processing unit, and non-volatile memory;
b) biasing the first magnetic sensor;
c) measuring a first magnetic sensor signal;
d) amplifying the first magnetic sensor signal;
e) biasing the second magnetic sensor,
f) measuring a second magnetic sensor signal;
g) amplifying the second magnetic sensor signal;
h) measuring a temperature (T) and/or a differential stress signal ($\Delta\sigma$)
i) adjusting:
  the second biasing signal or
  the second amplifier gain or
  a digitized value derived from (e.g. derived solely from) the second sensor signal
using a predefined function of a single measured temperature (T) and/or differential stress ($\Delta\Sigma$) (e.g. using a predefined function f(T) of a single measured temperature T, or using a predefined function f($\Delta\Sigma$) of the differential stress, or using a predefined function f(T, $\Delta\Sigma$) of a single measured temperature and differential stress)
before determining a difference between:
  a signal or value derived from the first magnetic sensor signal, and
  a signal or value derived from the second magnetic sensor signal
to obtain the magnetic field difference or magnetic field gradient.

The method 1200 may comprise an optional step j) of converting the magnetic field difference or gradient signal into another value, e.g. into a current value or into a distance value.

While the formulation of FIG. 12(*a*) is compact, the different steps are not listed in chronological order, and may therefore not be immediately recognizable. For this reason, three somewhat more detailed methods are provided in FIG. 12(*b*) to FIG. 12(*d*).

FIG. 12(*b*) shows a flow-chart illustrating a method according to the present invention, or which can be used in embodiments of the present invention, where the second biasing source or second amplifier gain is adjusted, and where a difference between the magnetic sensor signals is calculated in the analog domain, e.g. as shown in FIG. 3(*c*), FIG. 3(*e*), FIG. 4(*c*), FIG. 4(*e*), FIG. 5(*c*), and FIG. 5(*e*). The flow-chart of FIG. 12(*b*) may be easier to understand than that of FIG. 12(*a*), because the steps are listed in chronological order, albeit that some steps can be performed in parallel.

The method 1220 comprises the steps of:
a) providing a semiconductor substrate comprising:
  a first and second magnetic sensor, spaced apart along a predefined axis;
  a first and second biasing source;
  a first and second amplifier;
  a temperature sensor and/or a differential stress sensing circuit;
  (e.g. a temperature sensor but no differential stress sensing circuit; or a differential stress sensing circuit but no temperature sensor; or both a temperature sensor and a differential stress sensing circuit)
  an ADC, a processing unit, and a non-volatile memory;
b) after step a,
  measuring and digitizing a temperature signal (t) and/or measuring and digitizing a differential stress signal ($\Delta\sigma$);

c) after step b), adjusting at least one of:
  the second biasing signal;
  the second amplifier gain;
using a predefined function of a single temperature and/or differential stress;
(e.g. using a predefined function f(T) of a single measured temperature T, or using a predefined function f($\Delta\Sigma$) of the measured differential stress, or using a predefined function f(T, $\Delta\Sigma$) of a single measured temperature and the measured differential stress)
d) after step c)
  biasing the second magnetic sensor;
  measuring a second magnetic sensor signal;
  amplifying the second magnetic sensor signal;
e) after step a)
  biasing the first magnetic sensor;
  measuring a first magnetic sensor signal;
  amplifying the first magnetic sensor signal;
f) after step d) and step e),
  calculating a difference $\Delta v$ in the analog domain between the first and the second magnetic sensor signal, and
  digitizing the difference $\Delta v$ into $\Delta V$, to obtain the magnetic field difference or gradient.
This method may comprise an optional step:
g) after step f), converting the magnetic field difference or magnetic field gradient value into another value, e.g. a current or a distance.

FIG. 12(*c*) shows a flow-chart illustrating methods of the present invention, where the second biasing source or second amplifier is adjusted, and where a difference between the magnetic sensor signals is calculated in the digital domain, e.g. as shown in FIG. 3(*b*), FIG. 3(*d*), FIG. 4(*b*), FIG. 4(*d*), FIG. 5(*b*), FIG. 5(*d*), FIG. 6(*b*), FIG. 6(*c*), FIG. 7(*b*), FIG. 7(*c*), FIG. 8(*b*), FIG. 8(*c*). This flow-chart may be easier to understand than that of FIG. 12(*a*), because the steps are listed in chronological order, albeit that some steps can be performed in parallel.

The method 1240 comprises the steps of:
a) providing a semiconductor substrate comprising:
  a first and second magnetic sensor, spaced apart along a predefined axis;
  a first and second biasing source;
  a first and second amplifier;
  a temperature sensor and/or a differential stress sensing circuit;
  (e.g. a temperature sensor but no differential stress sensing circuit; or a differential stress sensing circuit but no temperature sensor; or both a temperature sensor and a differential stress sensing circuit)
  an ADC, a processing unit, and a non-volatile memory;
b) after step a,
  measuring and digitizing a temperature signal (t) and/or measuring and digitizing a differential stress signal ($\Delta\sigma$);
c) after step b), adjusting at least one of:
  the second biasing signal;
  the second amplifier gain;
  using a predefined function of a single temperature and/or differential stress;
  (e.g. using a predefined function f(T) of a single measured temperature T, or using a predefined function f($\Delta\Sigma$) of the measured differential stress, or using a predefined function f(T, $\Delta\Sigma$) of a single measured temperature and the measured differential stress)

d) after step c)
    biasing the second magnetic sensor;
    measuring a second magnetic sensor signal;
    amplifying the second magnetic sensor signal;
    digitizing the second amplified signal;
e) after step a)
    biasing the first magnetic sensor;
    measuring a first magnetic sensor signal;
    amplifying the first magnetic sensor signal;
    digitizing the first amplified signal;
f) after step d) and step e),
    calculating a difference between the amplified and digitized first and second value A_V1, A_V2corr in the digital domain, to obtain the magnetic field difference or magnetic field gradient.

This method may comprise an optional step:
g) after step f), converting the gradient value into another value, e.g. a current value or a distance value, or a button state (e.g. pushed or not pushed).

Figure 12B:
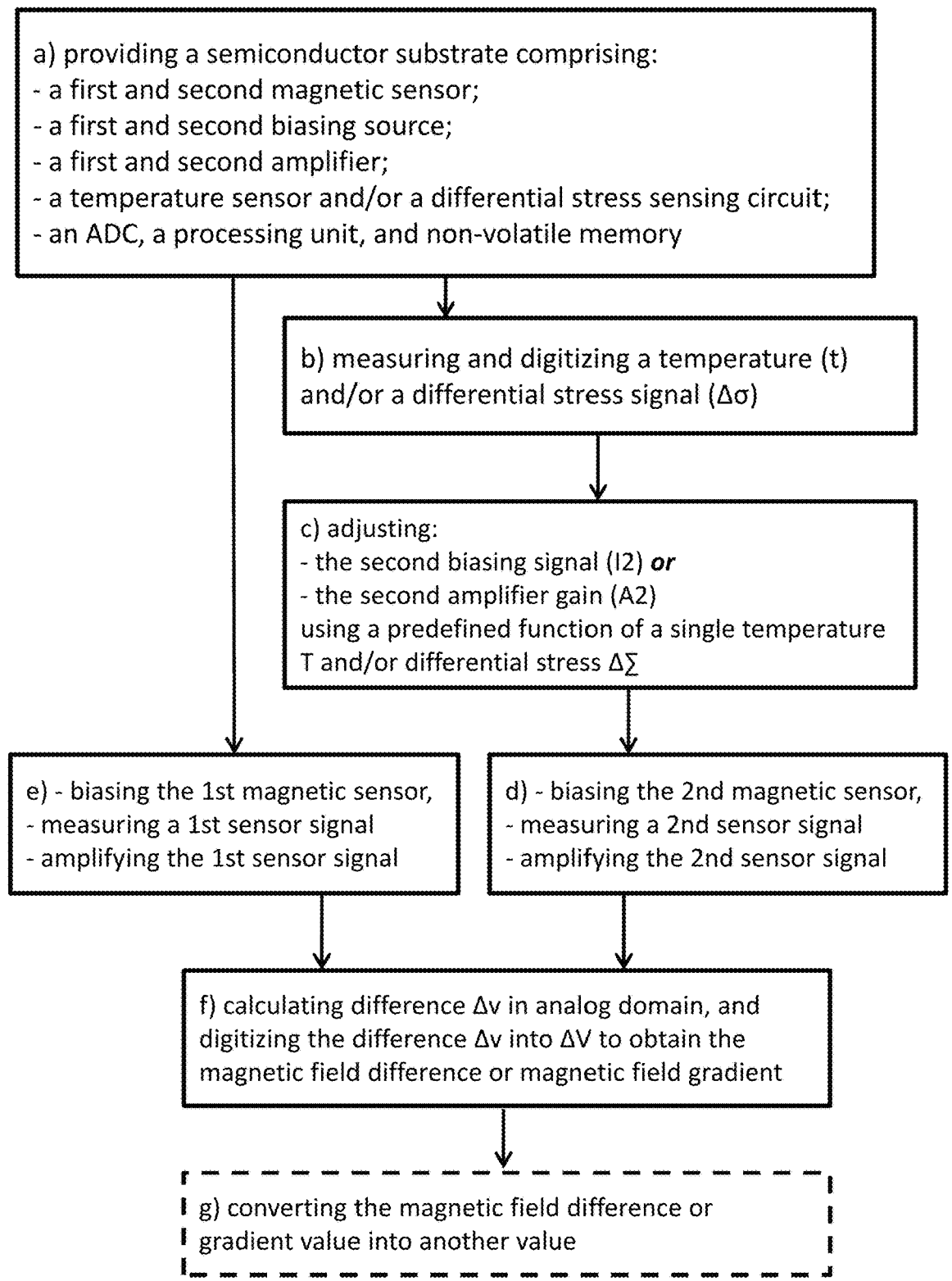
FIG. 12(b) shows a more detailed version of the method of FIG. 12(a), for the case where the second biasing source or the second amplifier gain is adjusted as a function of temperature and/or differential stress, and where the sensor signals are subtracted in the analog domain, and then digitized.
Figure 12C:
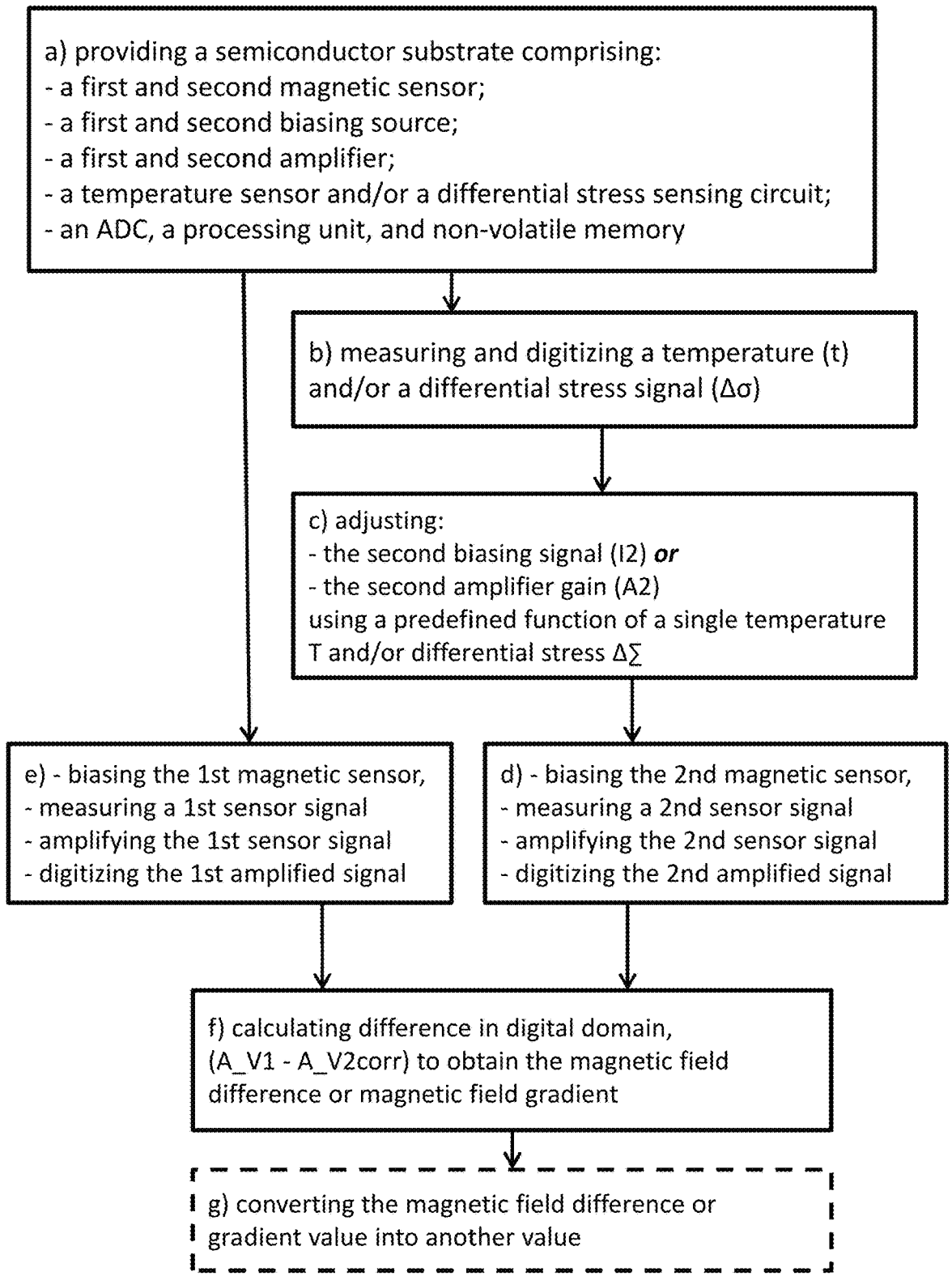
FIG. 12(c) shows a more detailed version of the method of FIG. 12(a), for the case where the second biasing source or the second amplifier gain is adjusted as a function of temperature and/or differential stress, and where the sensor signals are subtracted in the digital domain.
Figure 12D:
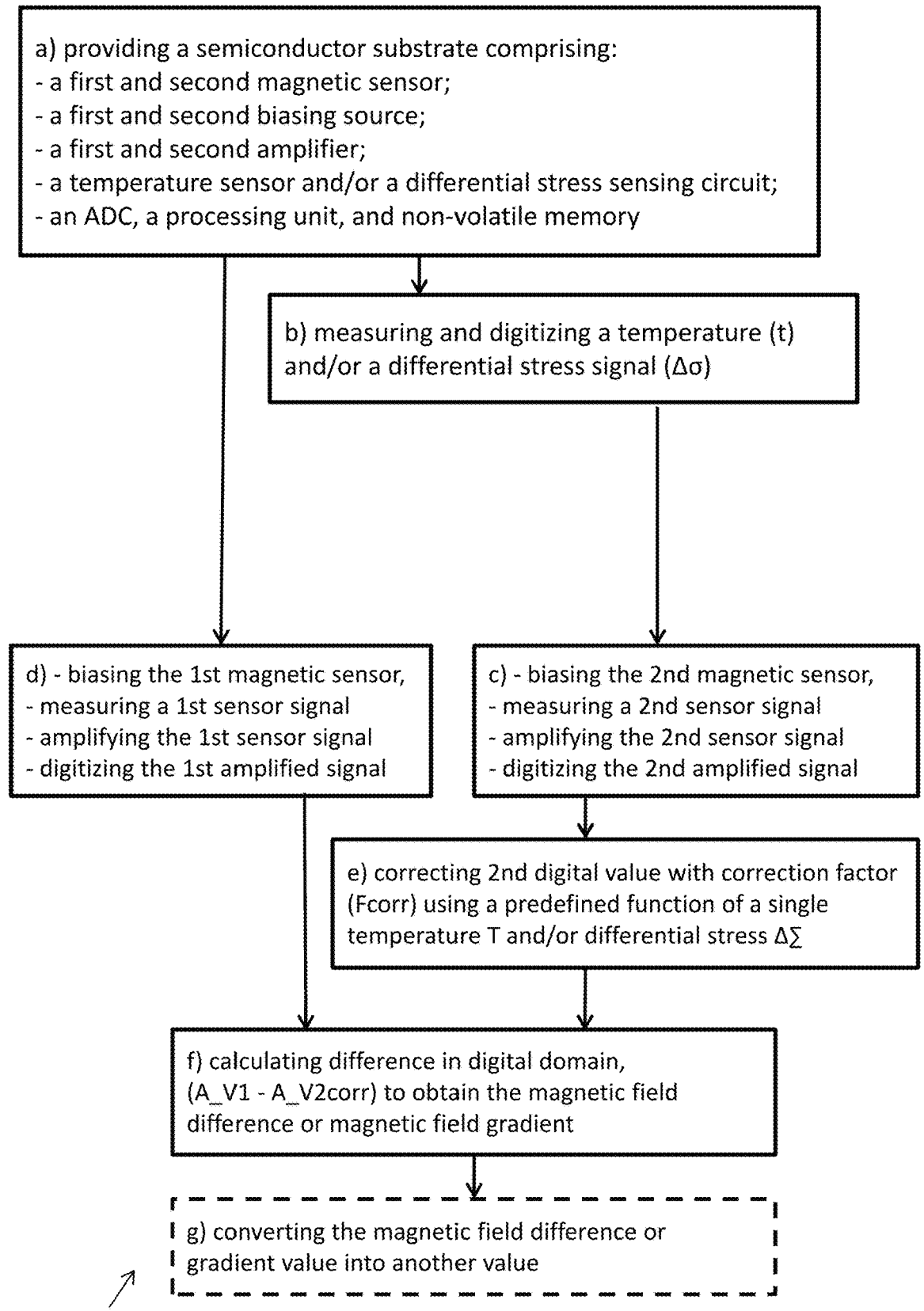
FIG. 12(d) shows a more detailed version of the method of FIG. 12(a), for the case where the two magnetic sensors are biased with a predefined biasing source, and where the signals are amplified with a predefined gain, and where the sensor signals are subtracted in the digital domain.

FIG. 12(d) shows a flow-chart illustrating methods of the present invention, where the biasing sources and the amplifiers are not adjusted, and where one of the digital signals is corrected in the digital domain, before a difference between the signals is calculated in the digital domain, e.g. as shown in FIG. 3(f), FIG. 4(f), FIG. 5(f). The flow-chart of FIG. 12(d) may be easier to understand than that of FIG. 12(a), because the steps are listed in chronological order, albeit that some steps may be performed in parallel.

The method 1260 comprises the steps of:
a) providing a semiconductor substrate comprising:
    a first and second magnetic sensor, spaced apart along a predefined axis;
    a first and second biasing source;
    a first and second amplifier;
    a temperature sensor and/or a differential stress sensing circuit;
    (e.g. a temperature sensor but no differential stress sensing circuit; or a differential stress sensing circuit but no temperature sensor; or both a temperature sensor and a differential stress sensing circuit)
    an ADC, a processing unit, and a non-volatile memory;
b) after step a, measuring and digitizing a temperature signal (t) and/or measuring and digitizing a differential stress signal (Δσ);
c) after step b)
    biasing the second magnetic sensor;
    measuring a second magnetic sensor signal;
    amplifying the second magnetic sensor signal;
    digitizing the second amplified signal;
d) after step a)
    biasing the first magnetic sensor;
    measuring a first magnetic sensor signal;
    amplifying the first magnetic sensor signal;
    digitizing the first amplified signal;
e) after step c),
    correcting the second digital value using a predefined function of a single measured temperature and/or differential stress,
    (e.g. using a predefined function f(T) of a single measured temperature T, or using a predefined function f(ΔΣ) of the measured differential stress, or using a predefined function f(T, ΔΣ) of a single measured temperature and the measured differential stress)
f) after step d) and e),
    calculating a difference between the first digital value A_V1 and the corrected second digital value A_V2corr in the digital domain, to obtain the magnetic field difference or the magnetic field gradient.

This method may comprise an optional step:
g) after step f), converting the gradient value into another value, e.g. a current value or a distance value, or a button state (e.g. pushed or not pushed).

Having described several embodiments of the invention in detail, the skilled person can easily come up with further modifications. For example, while the embodiments are described for a magnetic sensor providing a voltage signal, which voltage signal is amplified and/or subtracted and/or digitized, in a practical implementation, the voltage signal may be converted into a current signal before being amplified and/or subtracted and/or digitized.

The present invention described a technique for improving the accuracy of a magnetic field difference, or a spatial magnetic field gradient. But the same technique can also be used for improving the accuracy of a second order gradient, which can for example be obtained by subtracting two first order gradients, or by forming a linear combination of three magnetic field component values, such as for example B1−2*B2+B3, where B1, B2 and B3 are derived from three magnetic sensors located on an axis, B2 being located in the middle between B1 and B3. The same technique can also be used for improving the accuracy of higher order gradients, having an order larger than 2.

The invention claimed is:
1. A magnetic sensor device for measuring a gradient of a magnetic field, comprising:
    a semiconductor substrate;
    a first magnetic sensor located at a first location on said semiconductor substrate, and arranged for providing a first sensor signal indicative of a first magnetic field component oriented in a first direction;
    a first biasing source arranged for biasing the first magnetic sensor using a first biasing signal;
    a first amplifier arranged for amplifying the first sensor signal and for providing a first amplified sensor signal;
    a second magnetic sensor located at a second location on said semiconductor substrate different from the first location, and arranged for providing a second sensor signal indicative of a second magnetic field component oriented in said first direction;
    a second biasing source arranged for biasing the second magnetic sensor using a second biasing signal;
    a second amplifier arranged for amplifying the second sensor signal and for providing a second amplified sensor signal;
    one or both of a temperature sensor and a differential stress measurements circuit,
    wherein the temperature sensor, if present, is located at a third position on said semiconductor substrate and is configured for measuring a temperature of the substrate and for providing a temperature signal, and
    wherein the differential stress measurements circuit, if present, is configured for determining a differential mechanical stress between the first sensor location and the second sensor location and for providing a differential stress signal;
    at least one analog-to-digital converter for converting the first signal and the second signal or a signal derived therefrom, and for digitising said temperature signal to obtain a temperature value and/or for digitising said differential stress signal to obtain a differential stress value;
    a digital processing circuit connected downstream of the analog-to-digital convertor;

wherein the digital processing circuit is configured for obtaining one or both of said temperature value signal and said differential stress value; and wherein the magnetic sensor device is configured for adjusting at least one of: the second biasing signal, the second amplifier gain, and a digital value of the amplified second sensor signal, based on a predefined function f(T) of a single temperature being the measured temperature or based on a predefined function f(T, ΔΣ) of the measured temperature and the measured differential stress or based on a predefined function f(ΔΣ) of the measured differential stress, before determining a difference between: a first signal or a first value derived from the first sensor signal, and a second signal or a second value derived from the second sensor signal.

2. The magnetic sensor device according to claim 1, wherein the predefined function (f(T); f(T, ΔΣ); f(ΔΣ)) is chosen such that, during operation, a product of a magnetic sensitivity of the first magnetic sensor and a first overall gain of a first signal path from an output of the first magnetic sensor to said determining of a difference is substantially equal to a second product of the magnetic sensitivity of the second magnetic sensor and a second overall gain of a second signal path from an output of the second magnetic sensor to said determining of said difference.

3. The magnetic sensor device according to claim 1, wherein the digital processing circuit is configured for determining the magnetic field gradient in one of the following manners:

i) by adjusting the second biasing signal or adjusting the second amplifier gain using a predefined function of the measured temperature; and by digitizing the first amplified signal to obtain a first digital value and by digitizing the second amplified signal to obtain a second digital value; and by calculating a difference between the second digital value and the first digital value; or ii) by adjusting the second biasing signal or by adjusting the second amplifier gain using a predefined function of the measured temperature; and by generating a difference signal between the first amplified sensor signal and the second amplified sensor signal; and by digitizing the difference signal; or iii) by amplifying and digitizing the first sensor signal to obtain a first digital value, and by amplifying and digitizing the second sensor signal to obtain a second digital value, and by multiplying the second digital value using a predefined function of the measured temperature thereby obtaining a corrected second digital value, and by calculating a difference between the first digital value and the corrected second digital value.

4. The magnetic sensor device according to claim 1, wherein the first biasing source is a first current source configured for providing a first predefined current signal, and the second biasing source is an adjustable current source configured for providing an adjustable second current signal; and wherein the first amplifier is configured for amplifying with a first predefined gain, and the second amplifier is configured for amplifying with a second predefined gain; and wherein the first digital value is obtained by biasing the first magnetic sensor with the first current signal, and by amplifying the first sensor signal with the first predefined gain, and by digitizing this amplified signal; and wherein the second digital value is obtained by biasing the second magnetic sensor with the second current signal, and by amplifying the second sensor signal with the second predefined gain, and by digitizing this amplified signal; and wherein the magnetic field gradient is calculated by subtracting the first digital value and the second digital value; and wherein the second current signal is adjusted using said predefined function.

5. The magnetic sensor device according to claim 1, wherein the first biasing source is a first current source configured for providing a first predefined current signal, and the second biasing source is an adjustable current source configured for providing an adjustable second current signal; and wherein the first amplifier is configured for amplifying the first sensor signal with a first predefined gain to obtain a first amplified sensor signal, and the second amplifier is configured for amplifying the second sensor signal with a second predefined gain to obtain a second amplified sensor signal; and wherein the magnetic sensor device further comprises an analog subtraction circuit configured for subtracting the first amplified signal and the second amplified sensor signal to obtain an analog difference signal; and wherein the at least one analog-to-digital converter is configured for digitizing said analog difference signal, which is equal to or proportional to the gradient; and wherein the second current signal is adjusted using said predefined function.

6. The magnetic sensor device according to claim 1, wherein the first biasing source is a first current source configured for providing a first predefined current signal, and the second biasing source is a second current source configured for providing a second predefined current signal; and wherein the first amplifier is configured for amplifying with a first predefined gain, and the second amplifier is configured for amplifying with an adjustable gain; and wherein the magnetic sensor device further comprises an analog subtraction circuit configured for subtracting the first amplified signal and the second amplified sensor signal to obtain an analog difference signal; and wherein the at least one analog-to-digital converter is configured for digitizing said analog difference signal, which is equal to or proportional to the gradient; and wherein the second amplifier gain is adjusted using said predefined function.

7. The magnetic sensor device according to claim 1, wherein the first biasing source is a first current source configured for providing a first predefined current signal, and the second biasing source is a second current source configured for providing a second predefined current signal; and wherein the first amplifier is configured for amplifying with a first predefined gain, and the second amplifier is configured for amplifying with an adjustable gain; and wherein the first digital value is obtained by biasing the first magnetic sensor with the first current signal, and by amplifying the first sensor signal with the first predefined gain, and by digitizing this amplified signal; and wherein the second digital value is obtained by biasing the second magnetic sensor with the second current signal, and by amplifying the second sensor signal with the second gain, and by digitizing this amplified signal;

wherein the second gain is adjusted using said predefined function.

8. The magnetic sensor device according to claim 1,
wherein the first biasing source is a first current source configured for providing a first predefined current signal, and the second biasing source is a second current source configured for providing a second predefined current signal; and
wherein the first amplifier is configured for amplifying with a first predefined gain, and the second amplifier is configured for amplifying with a second predefined gain; and
wherein the at least one analog-to-digital converter is configured for digitizing the first amplified sensor signal to provide a first digital value, and for digitizing the second amplified sensor signal to provide a second digital value; and
wherein the digital processing circuit is configured for multiplying the second digital value with a digital correction factor using said predefined function;
to provide a corrected second digital value; and
wherein the digital processing circuit is further configured for determining a difference between the corrected second digital value and the first digital value to obtain the gradient.

9. The magnetic sensor device according to claim 1,
wherein the first magnetic sensor is or comprises a first horizontal Hall element and the second magnetic sensor is or comprises a second horizontal Hall element; or
wherein the first magnetic sensor is or comprises a first vertical Hall element and the second magnetic sensor is or comprises a second vertical Hall element.

10. The magnetic sensor device according to claim 1,
wherein the first magnetic sensor comprises a first integrated magnetic concentrator and a first and a second horizontal Hall element arranged on opposite sites of the first magnetic concentrator, the output signals of the first and second Hall element being combined to form the first sensor signal;
wherein the second magnetic sensor comprises a second integrated magnetic concentrator and a third and a fourth horizontal Hall element arranged on opposite sites of the second magnetic concentrator, the output signals of the third and fourth Hall element being combined to form the second sensor signal;
wherein the first integrated magnetic concentrator is spaced from the second magnetic concentrator and wherein the first, second, third and fourth horizontal Hall elements are arranged on a single axis.

11. A sensor arrangement comprising:
a magnetic source for creating a non-uniform magnetic field;
a magnetic sensor device according to claim 1, configured for measuring a gradient of said magnetic field.

12. A current sensor device, comprising:
a magnetic sensor device according to claim 1, wherein the digital processing circuit is further configured for calculating a current value by multiplying the gradient with a predefined constant K or by multiplying the gradient with a predefined function of temperature.

13. A distance sensor device comprising a magnetic sensor device according to claim 1, wherein the digital processing circuit is further configured for calculating a distance by multiplying the gradient with a predefined constant K; or
by multiplying the gradient with a predefined function of temperature.

14. A method of determining a gradient of a magnetic field, comprising the steps of:
a) biasing the first magnetic sensor with a first biasing signal
b) measuring a first sensor signal by a first magnetic sensor;
c) amplifying the first sensor signal by a first amplifier to provide a first amplified sensor signal;
d) biasing the second magnetic sensor with a second biasing signal;
e) measuring a second sensor signal by a second magnetic sensor, spaced from the first magnetic sensor;
f) amplifying the second sensor signal by a second amplifier to provide a second amplified sensor signal;
g) measuring at least one of: a temperature using a temperature sensor and a stress difference experienced by the first magnetic sensor and the second magnetic sensor using a differential stress circuit;
h) adjusting at least one of: the second biasing signal, the second amplifier gain, and a digital value of the amplified second sensor signal, based on a predefined function f(T) of a single temperature being the measured temperature or based on a predefined function f(T, $\Delta\Sigma$) of the measured temperature and the measured differential stress or based on a predefined function f($\Delta\Sigma$) of the measured differential stress, before determining a difference between: a first signal or a first value derived from the first sensor signal, and a second signal or second value derived from the second sensor signal.

15. The method according to claim 14, wherein step h) comprises one of the following steps:
i) adjusting the second biasing signal and/or adjusting the second amplifier gain using said predefined function; and
digitizing the first amplified signal to obtain a first digital value and digitizing the second amplified signal to obtain a second digital value; and
calculating a difference between the second digital value and the first digital value; or
ii) adjusting the second biasing signal and/or adjusting the second amplifier gain using said predefined function; and
generating a difference signal between the first amplified sensor signal and the second amplified sensor signal; and
digitizing the difference signal to obtain a digital difference value; or
iii) applying a second biasing signal, and applying a second amplifier gain, and amplifying and digitizing the first sensor signal to obtain a first digital value and amplifying and digitizing the second sensor signal to obtain a second digital value, and multiplying the second digital value with a correction factor based on said predefined function to obtain a corrected second digital value, and calculating a difference between the first digital value and the corrected second digital value.

* * * * *